United States Patent
Kleider et al.

(10) Patent No.: US 8,355,466 B2
(45) Date of Patent: Jan. 15, 2013

(54) CANCELLING NON-LINEAR POWER AMPLIFIER INDUCED DISTORTION FROM A RECEIVED SIGNAL BY MOVING INCORRECTLY ESTIMATED CONSTELLATION POINTS

(75) Inventors: John Kleider, Decatur, GA (US); Anthony Smith, Salt Lake City, UT (US)

(73) Assignee: General Dynamics C4 Systems, Inc., Scottsdale, AZ (US)

( * ) Notice: Subject to any disclaimer, the term of this patent is extended or adjusted under 35 U.S.C. 154(b) by 550 days.

(21) Appl. No.: 12/567,505

(22) Filed: Sep. 25, 2009

(65) Prior Publication Data

US 2011/0074506 A1  Mar. 31, 2011

(51) Int. Cl.
*H04B 1/00* (2006.01)
*H04B 7/24* (2006.01)
*H03K 9/00* (2006.01)

(52) U.S. Cl. ........ 375/316; 375/296; 375/295; 375/318; 375/346; 455/39; 455/69

(58) Field of Classification Search ................. 375/219, 375/222, 261, 268, 273, 279, 280, 281, 283, 375/295, 297, 296, 298, 302, 308, 316, 318, 375/324, 329, 340, 345, 240, 240.26–240.29, 375/259, 260, 284, 285, 278, 317, 346, 347, 375/358; 455/114.2–114.3, 91, 113, 115.1, 455/115.3, 127.2, 127.1, 127.5, 130, 136, 455/139, 182.2, 182.3, 183.1, 183.2, 192.3, 455/194.2, 219, 232.1, 234.1, 239.1, 240.1, 455/247.1, 250.1, 192.2, 39, 500, 501, 63.1, 455/103

See application file for complete search history.

(56) References Cited

U.S. PATENT DOCUMENTS

| | | |
|---|---|---|
| 5,867,478 A | 2/1999 | Baum et al. |
| 6,314,146 B1 | 11/2001 | Tellado et al. |
| 6,369,758 B1 | 4/2002 | Zhang |
| 6,411,610 B1 | 6/2002 | Li et al. |
| 6,473,467 B1 | 10/2002 | Wallace et al. |
| 6,487,252 B1 | 11/2002 | Kleider et al. |
| 6,549,561 B2 | 4/2003 | Crawford |
| 6,549,583 B2 | 4/2003 | Crawford |
| 6,567,374 B1 | 5/2003 | Böhnke et al. |
| 6,628,735 B1 | 9/2003 | Belotserkovsky et al. |
| 6,633,616 B2 | 10/2003 | Crawford |
| 6,700,866 B1 | 3/2004 | Heinonen et al. |

(Continued)

OTHER PUBLICATIONS

Final Office Action cited in U.S. Appl. No. 12/051,535 on Aug. 25, 2011.

(Continued)

*Primary Examiner* — Sam K Ahn
*Assistant Examiner* — Linda Wong
(74) *Attorney, Agent, or Firm* — Ingrassia Fisher & Lorenz, P.C.

(57) ABSTRACT

A method and system are provided for reducing power amplifier induced distortion. Power amplifier induced distortion is iteratively estimated and cancelled. When the difference between the current estimated power amplifier distortion and the previous estimated power amplifier distortion is less than a convergence threshold, particular M-QAM constellation points that are still in error are determined A M-QAM constellation point correction routine is provided that can move the incorrectly estimated M-QAM constellation points that are in error towards their expected quadrants by generating updated M-QAM constellation points. The remaining estimated non-linear power amplifier induced distortion in the received signal can then be estimated and canceled.

22 Claims, 17 Drawing Sheets

U.S. PATENT DOCUMENTS

| | | | |
|---|---|---|---|
| 6,757,299 | B1 | 6/2004 | Verma |
| 6,853,632 | B1 | 2/2005 | Verma et al. |
| 6,928,062 | B2 | 8/2005 | Krishnan et al. |
| 6,985,535 | B2 | 1/2006 | Park et al. |
| 7,027,464 | B1 | 4/2006 | Nakahara et al. |
| 7,042,857 | B2 | 5/2006 | Krishnan et al. |
| 7,164,649 | B2 | 1/2007 | Walton et al. |
| 7,190,734 | B2 | 3/2007 | Giannakis et al. |
| 7,206,606 | B2 | 4/2007 | Kobayashi et al. |
| 7,233,625 | B2 | 6/2007 | Ma et al. |
| 7,269,430 | B2 | 9/2007 | Moorti et al. |
| 7,289,588 | B2 | 10/2007 | Suh et al. |
| 7,317,750 | B2 | 1/2008 | Shattil |
| 7,324,605 | B2 | 1/2008 | Maltsev et al. |
| 7,359,311 | B1 | 4/2008 | Paranjpe et al. |
| 7,403,570 | B2 | 7/2008 | Ma et al. |
| 7,406,261 | B2 | 7/2008 | Shattil |
| 7,421,046 | B2 * | 9/2008 | Wallace et al. ............... 375/347 |
| 7,471,728 | B2 | 12/2008 | Brutel et al. |
| 7,590,171 | B2 | 9/2009 | Chang et al. |
| 7,656,975 | B2 * | 2/2010 | Tandon et al. ............... 375/345 |
| 7,688,907 | B2 | 3/2010 | Dang |
| 7,764,593 | B2 | 7/2010 | Kim et al. |
| 7,856,048 | B1 * | 12/2010 | Smaini et al. ............... 375/221 |
| 7,881,181 | B2 | 2/2011 | Dapper et al. |
| 8,098,713 | B2 | 1/2012 | Baxley et al. |
| 2004/0196921 | A1 | 10/2004 | Matsumoto et al. |
| 2005/0043052 | A1 | 2/2005 | Whinnett et al. |
| 2005/0105505 | A1 | 5/2005 | Fishler et al. |
| 2005/0135503 | A1 | 6/2005 | Talwar et al. |
| 2005/0157814 | A1 | 7/2005 | Cova et al. |
| 2006/0018250 | A1 | 1/2006 | Gu et al. |
| 2006/0239233 | A1 | 10/2006 | Hanada et al. |
| 2006/0250936 | A1 | 11/2006 | Chen et al. |
| 2006/0291431 | A1 | 12/2006 | Pajukoski et al. |
| 2007/0089015 | A1 | 4/2007 | Saul |
| 2007/0098100 | A1 | 5/2007 | Charbit et al. |
| 2007/0211835 | A1 | 9/2007 | Inagawa et al. |
| 2007/0253472 | A1 | 11/2007 | Jang |
| 2008/0075195 | A1 | 3/2008 | Pajukoski et al. |
| 2008/0089437 | A1 | 4/2008 | Frederiksen et al. |
| 2008/0095263 | A1 | 4/2008 | Xu et al. |
| 2008/0117995 | A1 | 5/2008 | Anderson et al. |
| 2009/0003308 | A1 | 1/2009 | Baxley et al. |
| 2009/0011722 | A1 | 1/2009 | Kleider et al. |
| 2009/0021303 | A1 * | 1/2009 | Vinayak et al. ............... 330/127 |
| 2009/0052561 | A1 | 2/2009 | Baxley et al. |
| 2009/0207936 | A1 | 8/2009 | Behzad |
| 2009/0316826 | A1 * | 12/2009 | Koren et al. ............... 375/296 |
| 2010/0002784 | A1 | 1/2010 | Hlinka et al. |
| 2010/0029310 | A1 | 2/2010 | Li et al. |
| 2010/0035554 | A1 * | 2/2010 | Ba et al. ............... 455/63.1 |
| 2010/0091702 | A1 | 4/2010 | Luo et al. |
| 2010/0118990 | A1 * | 5/2010 | Lee et al. ............... 375/260 |
| 2010/0195609 | A1 | 8/2010 | Li et al. |
| 2010/0272197 | A1 | 10/2010 | Har et al. |
| 2012/0140838 | A1 | 6/2012 | Kadous et al. |

OTHER PUBLICATIONS

Alamouti, S. "A simple transmit diversity technique for wireless communications," IEEE JSAC, vol. 16, No. 8, Oct. 1998, pp. 1451-1458.

Anderson, K., et al. "Two dimensional diversity enhancement for tactical wireless networks using multi-carrier cooperative networking," in proceedings of SDR Forum Technical Conference 2006.

Baxley, R.J., et al. "A method for joint peak-to-average power radio reduction and synchronization in OFDM," accepted MILCOM, Orlando, FL, Oct. 2007.

Baxley, R.J., et al. "Pilot design for OFDM with null edge subcarriers," IEEE Trans. Wireless Comminucations, vol. 8, No. 1, pp. 396-405, Jan. 2009.

Cao, Z., et al. "Frequency synchronization fro generalized OFDM uplink," in Proc. IEEE Globecomm, 2004.

Choi, J., et al. "Carrier frequency offset compensation for uplink of OFDM-FDAM systems," IEEE Trans. Commun., 2005.

Cui, T., et al. "Joint frequency offset and channel estimation for OFDM," in Proc. Globecom, vol. 1, pp. 15-19, Dec. 2006.

Dai, H. "Distributed versus co-located MIMO systems with correlated fading and shadowing," in Proc. of ICASSP, vol. IV, May 2006, pp. 561-564.

Fechtel, S. "Ofdm carrier and sampling frequency syncronization and its performance on stationary and mobile channels," IEEE Trans Cons. Elect., vol. 46, No. 3, Aug. 2000.

Gault, S., et al. "Joint sampling clock offset and channel estimation for OFDM Signals: Cramer-Rao bound and algorithms," IEEE Trans. Signal Proc., vol. 54, No. 5, pp. 1875-1885, May 2006.

Ghogho, M., et al. "Semi-blind frequency offset synchronization for OFDM," in Proc. ICASSP, vol. 3, pp. 2333-2336, May 2002.

Giannakis, G., et al. Space-Time Coding for Broadband Wireless Communications, John Wiley and Sons, Hoboken, NJ, 2007. www.researchandmarkets.com/reports/449857.

Goldsmith, A., et al. "Capacity limits of MIMO channels," IEEE, JSAC, vol. 21, No. 5, Jun. 2003, pp. 684-702.

Huang, D., et al. "An Interference cancellation scheme for carrier frequency offsets correction in OFDMA systems," IEEE Trans. Commun., 2005.

Jayalath, A.D.S., et al. Blind SLM receiver for PAR-reduced OFDM, PRoc. IEEE Vehicular Technology Conference, pp. 219-222, Sep. 2002.

Kleider, J., et al. "Timing synchronization in distributed mobile MISO rayleigh fading channels," in Proc. MILCOM, pp. 1-7, Oct. 2007.

Kleider, J., et al. "MISO joint synchronization-pilot design for OFDM systems," in Proc. ICASSP, pp. 3033-3036, Mar.-Apr. 2008.

Le, H.N., et al. "Joint channel estimation and synchronization for MIMO-OFDM in the presence of carrier and sampling frequency offsets," IEEE Trans. on Vehicular Technology, vol. 58, No. 6, Jul. 2009.

Li, X. X "Space0time coded multi-transmission among distributed transmitters without perfect synchronization," IEEE Signal Processing Letters, vol. 11, No. 12, Dec. 2004, 948-951.

Lu, B., et al. "Iterative receivers for space-time block-coded OFDM systems in dispersive fading channels," IEEE Trans. on Commun., vol. 53, No. 1, pp. 162-172, Jan. 2005.

Ma, X., et al. "Joint frequency offset and channel estimation for OFDM," in Proc. Globecom, vol. 1, pp. 15-19, Dec. 2006.

Ma, X., et al. "Hopping pilots for estimation of frequency offset and multiantenna channels in MIMO-OFDM," IEEE Trans. On Commun., vol. 1, No. 2, pp. 213-225, Apr. 2002.

Ma, Q., et al. "Differential space-time-frequency coded OFDM with maximum multipath diversity," IEEE Trans. Wireless Commun., vol. 4, No. 5, pp. 2232-2243, Sep. 2005.

Ohno, S. "Preamble and pilot symbol design for channel estimation in FDM," in Proc. ICASSP, vol. 3, pp. 281-284, Apr. 2007.

Pun, M.O., et al. "Iterative detection and frequcny synchronization for OFDMA uplink transmissions," in IEEE Trans. Wireless Commun., Feb. 2007.

Schmidl, T.M., et al. "Robust frequency and timing synchronization for ODFM," IEEE Trans on Commun., vol. 45, No. 12, pp. 1613-1621, Dec. 1997.

Tonello, A. "Multiuser detection and turbo multiuser decoding for asynchronous multitone multiple access," in Proc. IEEE Veh. Techn. Conf., 2002.

van Zelst, A., et al. "Implementation of a MIMO-OFDM-based wireless LAN system," IEEE Trans. Signal PRoc., vol. 52, No. 2, pp. 483-494, Feb. 2004.

Notice of Allowance issued Oct. 27, 2011 in U.S. Appl. No. 12/038,983.

U.S. Office Action for U.S. Appl. No. 12/051,535 mailed Mar. 15, 2011.

U.S. Office Action for U.S. Appl. No. 12/102,677 mailed Feb. 2, 2011.

J. K. Cavers, "An Analysis of Pilot Symbol Assisted Modulation for Rayleigh Fading Channels," IEEE Transactions on Vehicular Technology, vol. 40, No. 4, pp. 686-693, Dec. 1991.

"IEEE Standard Local and Metropolitan Area Network," IEEE Std. 802.16a, Jan. 2003.

R. Negi et al., "Pilot Tone Selection for Channel Estimation in a Mobile OFDM System," IEEE Transactions on Consumer Electronics, vol. 44, pp. 1122-1128, Aug. 1998.

M. Morelli et al., "A Comparison of Pilot-Aided Channel Estimation Methods for OFDM Systems," IEEE Trans. on Signaling Processing, vol. 49, No. 12, pp. 3065-3073, 2001.

J. E. Kleider et al., "Preamble and Embedded Synchronization for RF Carrier Frequency-Hopped OFDM," IEEE Journal on Selected Areas in Communications, vol. 23, No. 5, pp. 920-931, May 2005.

J. Tellado, "Peak to Average Power Reduction for Multicarrier Modulation," Dissertation submitted to the Dept. of Electrical Engineering, Sep. 1999.

R. W. Bauml et al., "Reducing the Peak-to-Average Power Ratio of Multicarrier Modulation by Selected Mapping," Electronics Letters, vol. 32, pp. 2056-2057, Oct. 1996.

S. O'Hara, B. Chen et al., "A Bandwidth Efficient Peak Power Reduction Scheme for Multicarrier Modulation Using Selected Mapping," Proc. Conference on Information Sciences and Systems, Mar. 2003.

R. J. Baxley et al., "Magnitude-Scaled Selected Mapping: A Crest Factor Reduction Scheme for OFDM Without Side-Information Transmission," Proc. IEEE Intl. Conference on Acoustics, Speech, and Signal Processing, Apr. 2007.

A. D. S. Jayalath et al., "SLM and PTS Peak-Power Reduction of OFDM Signals Without Side Information," IEEE Transactions on Wireless Communications, vol. 4, pp. 2006-2013, Sep. 2005.

R. J. Baxley et al., "MAP Metric for Blind Phase Sequence Detection in Selected Mapping," IEEE Transactions on Broadcasting, vol. 51, pp. 565-570, Dec. 2005.

N. Chen et al., "Peak-to-Average Power Ratio Reduction in OFDM with Blind Selected Pilot Tone Modulation," IEEE Transactions on Wireless Communications, vol. 5, pp. 2210-2216, Aug. 2006.

F. Tufvesson et al., "Time and Frequency Synchronization for OFDM Using PN-Sequence Preambles," Proc. IEEE Vehicular Technology Conference, (Amsterdam, Netherlands), pp. 2203-2207, Sep. 1999.

N. Chen et al., "Superimposed Training for OFDM: A Peak-to-Average Power Ratio Analysis," IEEE Transactions on Signal Processing, vol. 54, pp. 2277-2287, Jun. 2006.

R. J. Baxley et al., "Embedded Synchronization/Pilot Sequence Creation Using POCS," Proc. IEEE International Conference on Acoustics, Speech and Signal Processing, 2006., pp. 321-324, May 2006.

R. J. Baxley et al., "Pilot Design for IEEE 802.16 OFDM and OFDMA," in Proc. IEEE International Conference on Acoustics, Speech and Signal Processing, Apr. 2007.

Z. Wang et al., "Wireless Multicarrier Communications," IEEE Signal Processing Magazine, vol. 17, pp. 29-48, May 2000.

X. Cai et al., "Error Probability Minimizing Pilots for OFDM with m-PSK Modulation Over Rayleigh-Fading Channels," IEEE Transactions on Vehicular Technology, vol. 53, pp. 146-155, Jan. 2004.

E. Larsson et al., "Preamble Design for Multiple-Antenna OFDM-Based WLANs with Null Subcarriers," IEEE Signal Processing Letters, vol. 8, pp. 285-288, Nov. 2001.

M. Dong et al., "Optimal Pilot Placement for Channel Tracking in OFDM," Proc. Military Communications Conference 2002, pp. 602-606, Nov. 2002.

M. Dong et al., "Optimal Design and Placement of Pilot Symbols for Channel Estimation," IEEE Transactions on Signal Processing, vol. 50, No. 12, pp. 3055-3069, Dec. 2002.

L. Tong et al., "Pilot-Assisted Wireless Transmissions: General Model, Design Criteria, and Signal Processing," IEEE Signal Processing Magazine, vol. 21, pp. 12-25, Nov. 2004.

X. Cai et al., "Adaptive PSAM Accounting for Channel Estimation and Prediction Errors," IEEE Transactions on Wireless Communications, vol. 4, pp. 246-256, Feb. 2005.

J. Diaz et al., "Impact of Imperfect Channel State Information Upon the Outage Capacity of Rayleigh Fading Channels," Proc. IEEE Global Telecommunications Conference, 2004, pp. 887-892, Dec. 2004.

R. You et al., "Diversity Combining with Imperfect Channel Estimation," IEEE Transactions on Communications, vol. 53, pp. 1655-1662, Oct. 2005.

T. Weber et al., "Imperfect Channel-State Information in MIMO Transmission," IEEE Transactions on Communications, vol. 54, pp. 543-552, Mar. 2006.

S. Kay, Fundamentals of Statistical Signal Processing, vol. 1: Estimation Theory. Englewood Cliffs, NJ: Prentice-Hall, pp. 521-523, Jan. 1993.

S. Chennakeshu et al., "Error Rates for Rayleigh Fading Multichannel Reception of MPSK Signals," IEEE Transactions on Communications, vol. 43, pp. 338-346, Feb., Mar., Apr. 1995.

J. Proakis, Digital Communications, New York, NY: McGraw-Hill, p. 817, Jan. 2001.

S. Boyd et al.E, Convex Optimization. Cambridge University Press, Jan. 2004.

"Lagrange Multipliers," http://en.wikipedia.orgiwiki/Lagrange_multipliers, retrieved on Jan. 11, 2007.

J. Tellado et al., "PAR Reduction in Multicarrier Transmission Systems," Feb. 1998.

K. Anderson, et al. "Two Dimensional Diversity Enhancement for Tactical Wireless Networks Using Multi-Carrier Cooperative Networking," submitted to MILCOM 2006.

J. Kleider, et al. "MISO Joint Synchronization-Pilot Design for OFDM Systems," in Proc. ICASSP, pp. 3033-3036. Mar.-Apr. 2008.

Notice of Allowance issued Mar. 21, 2012 in U.S. Appl. No. 12/051,535.

U.S. Office ACtion issued Jun. 24, 2011 in U.S. Appl. No. 12/038,983.

USPTO "Non-Final Office Action" mailed Jun. 22, 2012; U.S. Appl. No. 12/567,509, filed Sep. 25, 2009.

USPTO Non-Final Office Action mailed May 3, 2012; U.S. Appl. No. 13/359,205, filed Jan. 26, 2012.

Notice of Allowance issued Apr. 3, 2012 in U.S. Appl. No. 12/649,672.

Final Office Action issued Jul. 15, 2011 in U.S. Appl. No. 12/102,677.

USPTO "Notice of Allowance" mailed Jul. 30, 2012; U.S. Appl. No. 13/359,205, filed Jan. 26, 2012.

USPTO "Final Office Action" mailed Aug. 28, 2012; U.S. Appl. No. 12/567,509 filed Sep. 25, 2009.

USPTO "Notice of Allowance" mailed Oct. 11, 2012; U.S. Appl. No. 12/725,985, filed Mar. 17, 2010.

USPTO "Notice of Allowance" mailed Sep. 21, 2012; U.S. Appl. No. 12/051,535 filed Mar. 19, 2008.

* cited by examiner

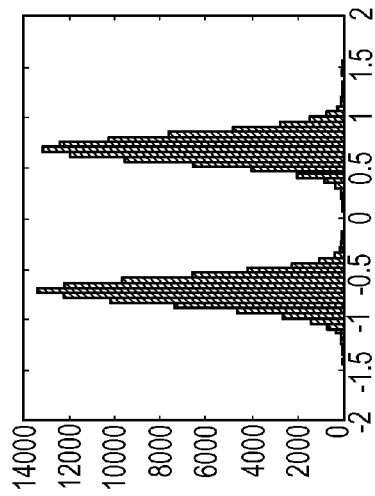
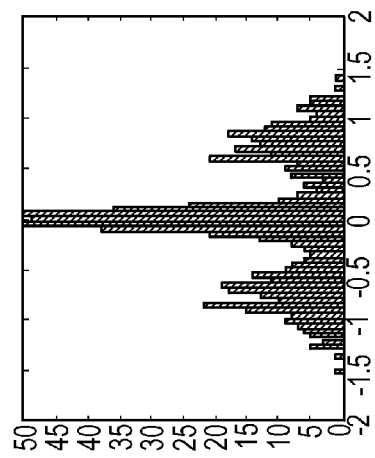
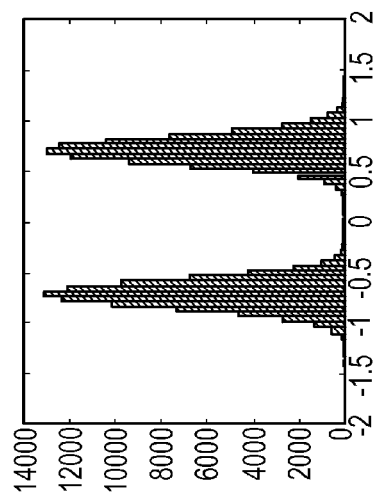
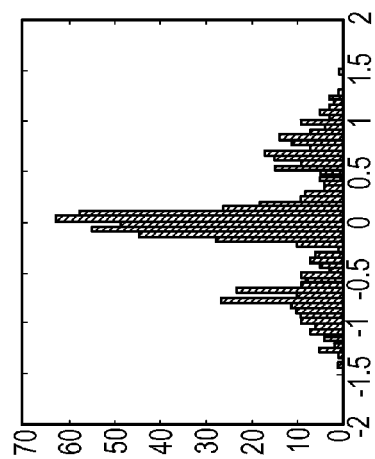
FIG.8A CORRECT
FIG.8B INCORRECT
FIG.8C
FIG.8D

CANCELLING NON-LINEAR POWER AMPLIFIER INDUCED DISTORTION FROM A RECEIVED SIGNAL BY MOVING INCORRECTLY ESTIMATED CONSTELLATION POINTS

GOVERNMENT LICENSE RIGHTS

The U.S. Government may have certain rights to some or all of the inventive subject matter of the present application as provided for by the terms of contract No. DAAD19-01-2-0011 awarded by Army Research Laboratory.

TECHNICAL FIELD

The disclosed embodiments generally relate to methods and apparatus for wirelessly communicating signals, and more particularly to methods and apparatus for reducing distortion in wideband communication signal prior to transmission and for making the distortion more deterministic, and for estimating and cancelling distortion in a received wideband communication signal.

BACKGROUND

Many high-speed wireless networks use wideband modulation techniques. Examples include multi-carrier communication systems, such as an orthogonal frequency division multiplexing (OFDM) system or an orthogonal frequency division multiple access (OFDMA) system, as well as spread spectrum systems based on various code division multiple access (CDMA) and Wideband CDMA (WCDMA) standards.

Wireless communication devices implement a power amplifier to amplify a transmit signal waveform prior to transmission. An ideal power amplifier would be a totally linear device. However, real power amplifiers are only linear within certain practical limits. Any real power amplifier device can be characterized by plotting a response curve that plots its input signal power versus output signal power. In most cases, the response curve is essentially linear over a certain range of input signal powers, but then transitions to a non-linear range. Some power amplifiers, such as traveling wave tube amplifiers, even exhibit nonlinear input to output characteristics prior to the compression region of the PA. With respect to power amplifiers in which a portion of the response curve is essentially linear, as the input signal power increases the power amplifier eventually begins to saturate. At this point, the response curve transitions into the non-linear range where the output signal power amplitude compresses and no longer increases linearly. Operation of the power amplifier in the non-linear range causes "clipping" of modulated transmission signal and distorts the modulated transmission signal. Thus, when a power amplifier device non-linearly amplifies transmit information sequences, traditional transmission methods may experience an increase in channel estimation errors due to distortion induced by the power amplifier and an increase in the out-of-band signal power due to the distortion induced onto the information signal by the power amplifier.

One characteristic of the waveforms used in systems described above is that they can have relatively large peak-to-average power ratios (PAPRs). For instance, in a multi-carrier communication system, a multi-carrier transmission is composed of a number of independent signals, where each signal is centered a different frequency (commonly referred to as "carrier" frequencies). In most multi-carrier communication systems, the signals are combined together as a vector. An inverse fast Fourier transform (IFFT) is usually performed on the vector to produce a discrete time domain signal which is converted to a continuous time domain signal and transmitted. When multiple independent complex valued signals residing on multiple carrier frequencies are summed this can result in a transmit signal that is characterized by a relatively large peak-to-average power ratio (PAPR). As used herein the term PAPR refers to the ratio of the peaks of the amplitude of the signal to the average amplitude of the signal.

When a modulated transmission signal waveform has a large PAPR, the transmission signal waveform will include a number of amplitude peaks that often exceed the transmitter's power amplifier (PA) capabilities. If the amplitude of the modulated transmission signal is too large the transmitter PA will saturate, and peaks in the transmitted signal waveform are cutoff or "clipped." When the peaks of the modulated transmission signal are clipped this causes harmonic distortions in the transmit signal, and a significant amount of information is lost. Distortion can reduce the effectiveness of signal transmission from the transmitter to a receiver and can interfere with in-band and out-of-band communications. Such non-linear transmission may cause significant out-of-band interference (i.e., interference outside the signal bandwidth, such as in the adjacent channels and/or other user channels), and also may induce undesired in-band interference, which adds distortion to the transmitted information bits and also to the channel training information. Furthermore, improper synthesis of the channel training information may lead to further channel estimation errors at the receiver. Thus, non-linear amplification of high peak-to-average power ratio signals and improper channel training information design may, in the receiver, result in unacceptably high channel estimation errors on the receiver side and excessively high bit error rates and/or symbol error rates of received signals and can significantly degrade the receiver demodulated BER/SER.

Thus, one concern is how to reduce the PAPR of a multi-carrier transmission, and combat any remaining distortion that result due to the large PAPR.

Accordingly, in systems that use waveforms having relatively large peak-to-average power ratios (PAPRs), what are needed are methods, systems and apparatus that can reduce non-linear distortion prior to transmission, and subsequently estimate and cancel any remaining non-linear distortion after transmission. Such systems should reduce distortion noise and improve power efficiency in peak-limited channels. It would be desirable if these techniques can allow the transmit power amplifier to operate at low input backoff (IBO) levels in a highly energy efficient manner to increase battery life, while still achieving acceptable distortion cancellation at the receiver to provide high performance channel estimation and improve operation in multipath fading channels. Other features and characteristics of the inventive subject matter will become apparent from the subsequent detailed description and the appended claims, taken in conjunction with the accompanying drawings and this background.

BRIEF DESCRIPTION OF THE DRAWINGS

The inventive subject matter will hereinafter be described in conjunction with the following drawing figures, wherein like numerals denote like elements.

FIG. 8A is a histogram that shows the distribution of correct constellation points along the real axis or dimension of FIG. 7C after applying PAD estimation and cancellation techniques during demodulation in accordance with the disclosed embodiments;

FIG. 8B is a histogram that shows the distribution of incorrect constellation points along the real axis or dimension of FIG. 7C after applying PAD estimation and cancellation techniques during demodulation in accordance with the disclosed embodiments;

FIG. 8C is a histogram that shows the distribution of correct constellation points along the imaginary axis or dimension of FIG. 7C after applying PAD estimation and cancellation techniques during demodulation in accordance with the disclosed embodiments;

FIG. 8D is a histogram that shows the distribution of incorrect constellation points along the imaginary axis or dimension of FIG. 7C after applying PAD estimation and cancellation techniques during demodulation in accordance with the disclosed embodiments;

DETAILED DESCRIPTION

Figure 1:
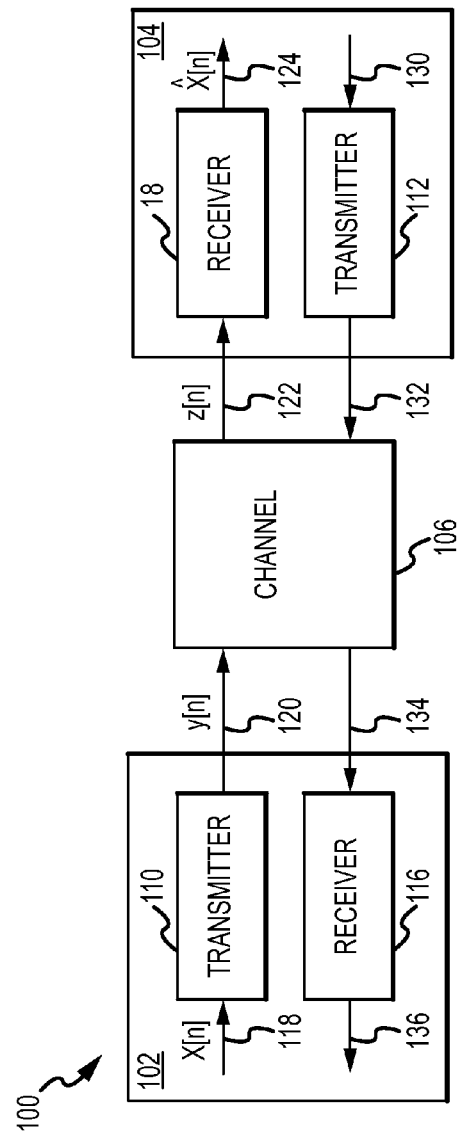
FIG. 1 is a simplified block diagram of a multi-carrier communication system that includes multiple wireless communication devices that communicate over a wireless communication channel in accordance with an example embodiment.

The following detailed description of the inventive subject matter is merely exemplary in nature and is not intended to limit the inventive subject matter or the application and uses of the inventive subject matter. Furthermore, there is no intention to be bound by any theory presented in the following detailed description.

Overview

The disclosed embodiments include a system that implements combination of transmitter side mitigation techniques for reducing non-linear distortion (NLD) induced or caused by a power amplifier (PA) on the transmitter side, and receiver side mitigation techniques that can be used to estimate and cancel any remaining transmitter PA induced NLD present in the received signal.

In accordance with one of the disclosed embodiments, a communication system is provided that includes a transmitter device that is designed to transmit input data, and a receiver device that is designed to receive a received signal that represents a channel affected version of the transmitted signal. The transmitter device includes a peak-to-average power ratio (PAPR) reduction module, a non-linear distortion (NLD) reduction module, a power amplifier, and an antenna. The PAPR reduction module receives multiple versions of the input data to be transmitted as the transmit signal, and selects a particular version having a lowest PAPR as the transmit signal. The NLD reduction module is designed to reduce power amplifier induced distortion in the transmit signal and generate an analog radio frequency (RF) signal in which remaining PA induced distortion has a known nonlinear distortion (NLD) characteristic. The power amplifier amplifies the analog RF signal to increase signal power and generate an amplified RF transmit signal waveform having the known non-linear distortion (NLD) characteristic. The antenna transmits the amplified RF transmit signal waveform over a channel as the transmitted signal.

When the receiver receives the received signal it includes remaining power amplifier distortion (PAD) induced by the power amplifier. The remaining PAD has the known NLD characteristic. The receiver includes a demodulator and a PAD estimation and cancellation (PADEC) module. The demodulator generates a demodulated output signal. The demodulated output signal comprises demodulated data that represents an estimate of the input data from the transmitter determined from the received signal. The PADEC module can iteratively estimate, based on the known NLD characteristic of the demodulated output signal, remaining PAD caused by the power amplifier, and can iteratively cancel estimated PAD to reduce PAD in the received signal.

In one implementation, the NLD reduction module includes a software clipper module, a baseband pre-distortion module, a digital filtering module and an up-converter module. The power amplifier has a first input power versus output power response curve. The software clipper module has a second input power versus output power response curve having a known response that is designed to match an input power versus output power response curve of an ideal linearized version of the power amplifier, and the baseband predistortion module has a third input power versus output power response curve that is an inverse of the first input power versus output power response curve of the power amplifier.

The software clipper module receives the particular selected transmit signal from the PAPR reduction module, and clips portions of the particular selected transmit signal that exceed a particular clipping amplitude value to generate a clipped baseband signal having an amplitude that does not exceed the particular clipping amplitude value. In particular, the software clipper module clips portions of the particular selected transmit signal that exceed a particular clipping amplitude value without changing phase of the particular selected transmit signal to constrain peak power of the particular selected transmit signal such that the clipped baseband signal has a lower average power than the particular selected transmit signal. The clipped baseband signal generated by the software clipper is clipped such that the analog RF signal is distorted in a known way before it reaches the power amplifier and such that the power amplifier does not clip the analog RF signal so that a non-linear distortion (NLD) characteristic of the transmitted signal is known.

A feedback loop couples the power amplifier to the baseband predistortion module. The baseband predistortion module is designed to adaptively pre-distort the clipped baseband signal based on a fedback version of the amplified RF transmit signal waveform to generate the clipped-predistorted signal. The baseband pre-distortion module is coupled to the software clipper module and adaptively pre-distorts the clipped baseband signal to generate a clipped-predistorted signal. In one implementation, the baseband predistortion module includes a RF-to baseband downconverter module, an adaptive algorithm, and a predistorter module. The RF-to baseband downconverter module receives the fedback version of the amplified RF transmit signal waveform and downconverts the fedback version of the amplified RF transmit signal waveform to generate a power amplifier-distorted baseband signal. The adaptive algorithm generates an error signal based on the power amplifier-distorted baseband signal and the clipped baseband signal, and digitally pre-distorts the power amplifier-distorted baseband signal to generate a gain and phase adjustment signal. The predistorter module adaptively pre-distorts the clipped baseband signal based on the gain and phase adjustment signal to generate the clipped-predistorted signal. The gain and phase adjustment signal is used to predistort the clipped baseband signal such that non-linearity caused by the power amplifier is equalized when the clipped-predistorted signal is applied to the power amplifier such that the amplified RF transmit signal waveform generated by the power amplifier is linearized when the power amplifier operates in a compression region.

The digital filtering module is coupled to the baseband pre-distortion module, and digitally filters the clipped-predistorted signal to generate an intermediate frequency (IF) filtered signal. The up-converter module is coupled to the digital filtering module, and converts the IF filtered signal to the analog radio frequency (RF) signal. The power amplifier amplifies the analog RF signal to increase signal power and generate the amplified RF transmit signal waveform having the known non-linear distortion (NLD) characteristic.

In one implementation, the PADEC includes a re-modulator, a digital filtering module, a power amplifier model, a power amplifier distortion (PAD) estimator module and a subtraction module. The re-modulator receives the demodulated output signal and re-modulates it to generate a re-modulated signal that is then digitally filter based on a model of the transmit filtering at the digital filtering module to generate a filtered-re-modulated signal. The power amplifier model can then amplify the filtered-re-modulated signal based on a model of the power amplifier to generate an amplified data stream comprising estimated input data. The PAD estimator module can then iteratively process the amplified data stream to generate an estimated power amplifier distortion (PAD) caused by the power amplifier. The subtraction module iteratively subtracts the estimated PAD from a sync-corrected version of the received signal to generate a frequency-domain, coarsely-corrected signal that includes an estimate of the input data.

In one implementation, the PAD estimator module a first time-domain-to-frequency-domain transformation module, a first estimator module, a first remodulator module, a first frequency-domain-to-time-domain transformation module, a linearization module, a second remodulator module, and a PAD estimation unit.

The first time-domain-to-frequency-domain transformation module generates a sync-corrected frequency domain received signal based on a time domain received signal (that includes the input data generated by the transmitter) and a function $g(\cdot)$. The function $g(\cdot)$ is equal to $f(g_1(\cdot), g_2(\cdot), g_3(\cdot))$, where $g_1(\cdot)$ is the sampled baseband-to-intermediate frequency gain of the transmitter filtering, $g_2(\cdot)$ is the behavioral gain of the power amplifier, $g_3(\cdot)$ is the sampled intermediate frequency-to-baseband gain of the receiver filtering. The first estimator module generates, based on the sync-corrected frequency domain received signal, a frequency domain received signal. Based on the frequency domain received signal, a channel model transfer function, a frequency domain PAD estimate from a previous iteration and the function $g(\cdot)$, the first estimator module computes a frequency domain estimate of the input data. The first remodulator module remodulates the frequency domain estimate of the input data to generate a frequency domain representation of the input data, and the first frequency-domain-to-time-domain transformation module generates a time domain representation of the input data based on the frequency domain representation of the input data. The linearization module generates a linearized time domain representation of the input data based on the time domain representation of the input data and the function $g(\cdot)$, and the second remodulator module remodulates the linearized time domain representation of the input data to generate a remodulated version of the time domain representation of the input data received signal. The PAD estimation unit computes a time domain PAD estimate by subtracting the time domain representation of the input data received signal from the remodulated version of the time domain representation of the input data received signal, and transform the time domain PAD estimate to generate an updated frequency domain PAD estimate that represents an estimate of remaining PAD.

In accordance with another one of the disclosed embodiments, a system is provided for reducing power amplifier induced distortion in a received signal corresponding to a channel affected version of a transmitted signal that comprises a transmit data that is distorted by power amplifier induced distortion. The system can employ an estimation routine via an estimation module to iteratively estimate power amplifier induced distortion in the received signal and generate estimated power amplifier distortion, and a cancellation routine, executed after each iteration of the estimation routine, to iteratively cancel the estimated power amplifier distortion present in the received signal. This processing can be similar to that described above. The system also includes a comparison module, an error determination module and a correction module. After each iteration of the cancellation routine, the comparison module compares a current estimated power amplifier distortion to a previous estimated power amplifier distortion and determines whether the difference between the current estimated power amplifier distortion and the previous estimated power amplifier distortion is less than a convergence threshold. If so, the cancellation routine is temporarily stopped, and the error determination module determines particular ones of the M-QAM constellation points that are incorrectly estimated and still in error. The M-QAM constellation points correspond to estimates of the transmit data. The M-QAM constellation points that are incorrectly estimated and in error correspond to incorrect symbols of the transmit data estimate that are still in error after the cancellation routine ends. The M-QAM constellation points that are incorrectly estimated are located outside an expected quadrant of a correct M-QAM location, and lie along a boundary with an adjacent quadrant that is adjacent to the expected quadrant.

For each of the M-QAM constellation points, the correction module executes a M-QAM constellation point correction routine designed to move the incorrectly estimated M-QAM constellation points that are in error towards expected quadrants of those incorrectly estimated M-QAM constellation points.

The M-QAM constellation point correction routine receives a frequency domain input that represents estimates of the transmit data as M-QAM constellation points. The frequency domain input comprises correctly estimated M-QAM constellation points and incorrectly estimated M-QAM constellation points that are in error.

The M-QAM constellation point correction routine separates the frequency domain input into real and imaginary components to generate a real component of each M-QAM constellation point and an imaginary component of each M-QAM constellation point. The M-QAM constellation point correction routine also generates a border set based on an input specifying a constellation alphabet set of size M, and separate the border set into a real component that represents real boundary points of M-QAM regions and an imaginary component that represents imaginary boundary points of the M-QAM regions, wherein the real boundary points of the M-QAM regions and the imaginary boundary points of the M-QAM regions are sequences containing border crossings in the real and imaginary directions, respectively;

The M-QAM constellation point correction routine generates a threshold from a threshold lookup table (TLUT) based on channel characteristics, a signal-to-noise ratio (SNR) measurement, and distortion characteristics. The M-QAM constellation point correction routine computes a minimum distance between the real component of each M-QAM constellation point and a nearest boundary in a real direction based on the real boundary points of the M-QAM regions, and a minimum distance between the imaginary component of each M-QAM constellation point and a nearest boundary in an imaginary direction based on the imaginary boundary points of the M-QAM regions. The M-QAM constellation point correction routine determines whether the real components and the imaginary components of each M-QAM constellation point are in error, and if so, generates at least one of an updated real component and an updated imaginary component for ones of the real components of each M-QAM constellation point or the imaginary components of each M-QAM constellation point that are in error.

In one implementation, the M-QAM constellation point correction routine determines whether the real components of each M-QAM constellation point are in error by determining whether an absolute value of the minimum distance between the real component of each M-QAM constellation point and the nearest boundary in the real direction is less than the threshold, and if so, generates an updated real component for that incorrectly estimated M-QAM constellation point that is in error. The updated real component is equal to the difference between the real component and the minimum distance between the real component and the nearest boundary in the real direction such that the real component of that incorrectly estimated M-QAM constellation point that is in error is moved to an adjacent M-QAM region in the real direction. Similarly, the M-QAM constellation point correction routine determines whether the imaginary components of each M-QAM constellation point are in error by determining whether an absolute value of the minimum distance between the imaginary component of each M-QAM constellation point and the nearest boundary in the imaginary direction is less than the threshold, and if so, generates an updated imaginary component for that incorrectly estimated M-QAM constellation point that is in error. The updated imaginary component is equal to the difference between the imaginary component and the minimum distance between the imaginary component and the nearest boundary in the imaginary direction such that the imaginary component of that incorrectly estimated M-QAM constellation point that is in error is moved to an adjacent M-QAM region in the imaginary direction.

For each incorrectly estimated M-QAM constellation point that is in error, the M-QAM constellation point correction routine generates an updated M-QAM constellation point based on at least one of the an updated real component and the updated imaginary component.

After executing the M-QAM constellation point correction routine, the estimation module estimates the remaining non-linear power amplifier induced distortion in the received signal via the estimation routine to generate remaining estimated power amplifier distortion, and cancels, via the cancellation routine, the remaining estimated power amplifier distortion present in the received signal.

Prior to describing transmitter side distortion reduction, and receiver side distortion estimation and cancellation techniques in accordance with the disclosed embodiments, a multi-carrier communication system and channel model will be described with reference to FIGS. 1 and 2.

FIG. 1 is a simplified block diagram of a multi-carrier communication system 100 that includes multiple wireless communication devices 102, 104 that communicate over a wireless communication channel 106, in accordance with an example embodiment. Multi-carrier communication system 100 may be, for example but not by way of limitation, a currently existing or future multi-carrier based, ultra-wideband system, an OFDM system, an OFDMA system, a multi-carrier code division multiple access (MC-CDMA) system, a wideband code division multiple access (W-CDMA) system, a wireless local area network (WLAN), a digital video broadcast (DVB) system, a digital audio broadcast (DAB) system, a broadband radio access network (BRAN), a WiMAX (Worldwide Interoperability for Microwave Access) system, a single-input single-output (SISO) system, a multiple-input multiple output (MIMO) system, a single-input multiple-output (SIMO) system, a multiple-input single-output (MISO) system, other wideband wireless transmission techniques in which frequency-selective fading may be present, and/or a number of other types of multi-carrier communication systems. System 100 may communicate based on proprietary, existing, and/or emerging standards or protocols, such as, for example but not by way of limitation, an IEEE (Institute of Electrical and Electronics Engineers) 802.16 standard (WiMAX, MIMO-WiMAX (Multiple-Input, Multiple-Output WiMAX)), an IEEE 802.11a, g, and/or n standard (WLAN, MIMO-WLAN), an ETSI (European Telecommunications Standards Institute) BRAN HiperLAN 2 standard, a DVB standard, a DVB-T (DVB Terrestrial) standard, a DAB standard, a WLAN standard, WNW (Wideband Networking Waveform) standard, a MIMO-OFDM standard, and/or other standards or proprietary protocols. As used herein, the term "symbol" refers to a state or representative condition of the information signal to be conveyed through the communication channel that persists for a fixed period of time. A transmitter device can transmit symbols on a channel at a fixed and known symbol rate, and a receiver device can detect a sequence of symbols to reconstruct transmitted data. In some implementations of the disclosed embodiments, the transmitter device may adaptively or cognitively adjust to variations in channel quality and usage. There may be a direct correspondence between a symbol and a small unit of data (for example, each symbol may encode one or several binary bits) or the data may be represented by the transitions between symbols or even by a sequence of many symbols. In this description, the terms "symbol" and "sequence" and "signal" can be used interchangeably depending on the context, where the term sequence refers to two or more symbols.

Wireless communication devices 102, 104 may include, for example but not by way of limitation, a device selected from a group of devices comprising a cellular telephone, a radio, a one-way or two-way pager, a personal data assistant, a computer (e.g., a laptop or desktop computer), a base station, an unmanned autonomous vehicle, a wireless transmitter, and/or a wireless transceiver. Embodiments may be implemented in wireless communication devices 102, 104 that include both a transmitter 110, 112 and a receiver 114, 116 (e.g., each device 102, 104 includes a transceiver). In addition, the disclosed embodiments can also be applied in a wired environment for wireline transmission as well, such as DSL technology. In such embodiments, system 100 may provide for two-way communications between devices 102, 104. For example, transmitter 110 in a first device 102 may receive an input data symbol 118, X[n], and may generate and transmit, over channel 106, a wireless signal 120, y[n], which represents the input data symbol 118. Receiver 114 in a second device 104 may receive a channel-affected version 122, z[n], of the wireless signal 120, and may generate an output data symbol 124, $\hat{X}$[n], representing an estimate of the input data symbol 118. Additionally, transmitter 112 in the second device 104 may receive another input data symbol 130, and may generate and transmit, over channel 106, a wireless signal 132 representing the input data symbol. Receiver 116 in the first device 102 may receive a channel-affected version 134 of the wireless signal 132, and may generate an output data symbol 136 representing an estimate of the input data symbol 130. In other embodiments, system 100 may provide for one-way communications. For example, one device may include a transmitter (and no receiver) and another device may include a receiver (and no transmitter). In order to more clearly and simply describe the various embodiments, only one-way communications between a transmitter 110 in a first device 102 and a receiver 114 in a second device 104 is described in detail in the remainder of this description. It is to be understood that the various embodiments also apply to two-way communications as well.

Functionality of transmitter 110 and receiver 114, are described only briefly in conjunction with the description of FIG. 1. More detailed descriptions of the details of various transmitter and receiver embodiments are included later, in conjunction with FIGS. 3-6. Briefly, transmitter 110 is designed to apply multiple phase shifts to an input data symbol 118, and to combine a plurality of SPS with the phase shifted input data in order to produce a plurality of candidate signals. First and second scaling factors may be applied to the input data symbol and to the plurality of SPS, respectively, prior to combining the phase shifted input data and the plurality of SPS. As will be discussed in detail later, the scaling factors affect the relative signal power allocated to the phase shifted input data and the pilot signals and synchronization signals with which they are combined. Transmitter 110 also is designed to determine PARs for at least some of the candidate signals, and to identify a selected candidate signal based on the PARs (e.g., the selected candidate signal may be the candidate signal with the lowest PAR). Transmitter 110 also is designed to transmit a wireless signal 120 representing the selected candidate signal over the wireless communication channel 106.

Receiver 114 is designed to receive a channel-affected version 122 of the wireless signal 120 from the wireless communication channel 106. Receiver 114 also is designed to determine estimated channel perturbations within the channel-affected signal 122 based on its knowledge of the plurality of SPS, and to apply corrections to the channel-affected signal 122, based on the estimated channel perturbations. Receiver 114 also is designed to produce the output data symbol 132 based on the corrected signal, which represents an estimate of the input data symbol 130 processed at the transmitter 110.

As alluded to above, a wireless signal transmitted over a channel (e.g., channel 106) may be adversely affected by the channel, and a receiver that receives a channel-affected version of the transmitted signal may attempt to determine and correct for estimated channel perturbations reflected within the channel-affected signal. In fact, the channel perturbations generated by channel 106 may not be the same for signals from transmitter 110 to receiver 114 as compared to a transmission from transmitter 112 to receiver 116. A number of factors may induce differences in the forward and reverse directions. For example, when either or both devices 102, 104 are mobile, channel 106 will be time variant, and the time that transmitter 110 transmits to receiver 114 may be different from the time than transmitter 112 may transmit to receiver 116. Thus, the channel 106 will be different depending on the transmit time for each transmitter 110, 112. Furthermore, the channel 106 itself may have different characteristics in the forward direction as compared to the reverse direction. These differences may be induced by a number of factors which include, for example, device 102 possessing a transmit/receive antenna having different characteristics from the transmit/receive antenna of device 104, and/or the local scattering environment being different for each device 102, 104, among other things. In order to better convey how a receiver may determine and correct for estimated channel perturbations, in accordance with various embodiments, a simplified channel model will now be described.

Figure 2:
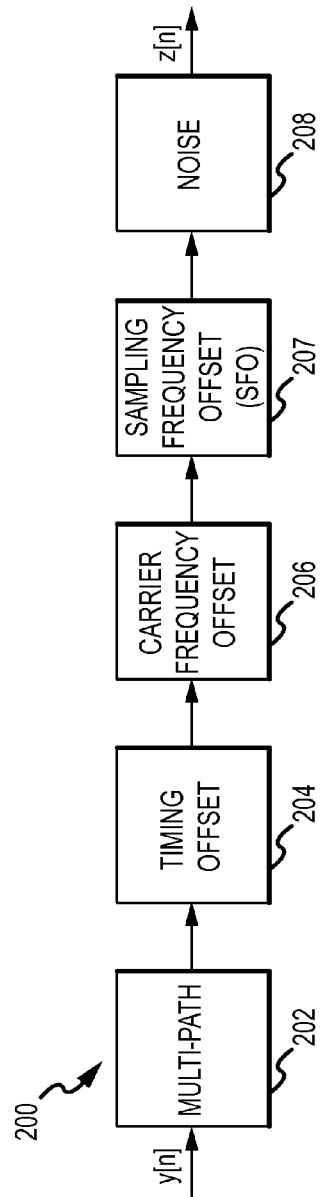
FIG. 2 is a simplified block diagram of a channel model in accordance with an example embodiment.

FIG. 2 is a simplified block diagram of a channel model 200, in accordance with an example embodiment. In particular, channel model 200 illustrates various channel characteristics that may affect (e.g., perturb) a signal transmitted over the channel, and more particularly an unsynchronized mobile channel that operates upon signals generated by a peak power-constrained system. These characteristics include, for example, a multi-path fading component 202 (which, in the frequency domain, manifests itself as frequency selective fading), a timing offset (TO) component 204, a carrier frequency offset (CFO) component 206, a sampling frequency offset (SFO) component 207, and an additive noise component 208. In some implementations, each offset can be comprised of a coarse component and fine component, and different algorithms may be required to estimate and correct these coarse/fine effects). Although not strictly part of the channel model, the input-to-output characteristic of the transmitter's power amplifier (e.g., power amplifier 362, FIG. 3), which may or may not be assumed to be time-invariant, also may affect the characteristics of a transmitted wireless signal. A signal, z[n], to which the channel model 200 and the power amplifier input-to-output characteristic has been applied may be represented, for example, by the equation:

$$z[n] = (f_{PA}(y[n-n_0]) * h[\tau]) e^{-j2\pi\epsilon/N} + \eta[n], \quad \text{(Equation 1)}$$

where $f_{PA}(\cdot)$ represents the power amplifier input-to-output characteristic, which may be assumed to be time-invariant (although the input-to-output characteristic may be time-variant, in other embodiments), $h[\tau]$ represents multi-path fading component 202, $y[n-n_0]$ represents a transmitted signal, $y[n]$, subjected to a TO component 204, $e^{-j2\pi\epsilon/N}$ represents a CFO component 206, $\eta[n]$ represents an additive noise component 208, and * is the convolution operator.

More detailed descriptions of various embodiments of transmitters (e.g., transmitter 110, FIG. 1) and receivers (e.g., receiver 114, FIG. 1) and methods of their operation will now be described.

The following description of one non-limiting implementation of the disclosed embodiments describes a system in which an optimized synchronous pilot sequence (SPS) OFDM waveform is used. The optimized SPS OFDM waveform includes data and pilot sub-carriers as usual, but does not include a separate preamble for synchronization, however. Instead synchronization data ($S_k$) and pilot sub-carriers are embedded within the transmit data ($X_k$) sub-carriers. Examples of this optimized SPS OFDM waveform is described in United States Patent Publication Number US-2009-0011722-A1, filed Feb. 28, 2008, entitled "METHODS AND APPARATUS FOR WIRELESSLY COMMUNICATING SIGNALS THAT INCLUDE EMBEDDED SYNCHRONIZATION/PILOT SEQUENCES," United States Patent Publication Number US-2009-0003308-A1, filed Mar. 19, 2008, entitled "METHODS AND APPARATUS FOR GENERATING SYNCHRONIZATION/PILOT SEQUENCES FOR EMBEDDING IN WIRELESS SIGNALS," and United States Patent Publication Number US-2009-0052561-A1, filed Apr. 14, 2008, entitled "METHODS AND APPARATUS FOR GENERATING AND COMMUNICATING WIRELESS SIGNALS HAVING PILOT SIGNALS WITH VARIABLE PILOT SIGNAL PARAMETERS," all assigned to the assignee of the present invention, and which are incorporated herein by reference in their entirety. As used herein, the acronym "SPS" may indicate a single synchronization/pilot sequence or multiple synchronization/pilot sequences. For example, the term "set of SPS" means a set of multiple synchronization/pilot sequences. A set of SPS may be represented, for example, as $\{s^{(d)}[n]\}_{d=1}^{D}$, where D is the number of SPS in the set, and d is a relational index that may be correlated, for example, with an SLM index or an SLM index estimate.

This optimized SPS OFDM waveform eliminates the need for a normal preamble-based OFDM waveform and provides increased robust operation in harsh channel environments. In comparison to conventional OFDM transmission schemes that use conventional OFDM waveforms that have uniformly spaced constant power (USCP) pilots, this optimized SPS OFDM waveform differs in the power and placement of the pilot sub-carriers since it optimizes the placement and power (OPAP) of the pilots to minimize the MSE of the distance between the actual transmitted symbol and the receive-side estimate of that transmitted symbol. The optimized SPS OFDM waveform is more robust to PA induced distortions and also enhances NLD cancellation techniques in comparison to conventional USCP OFDM waveforms. OPAP is an optimized pilot sequence in both subcarrier location and subcarrier power of the pilot subcarriers. As will be described below, in comparison to a standard OFDM pilot scheme, when this optimized pilot sequence is subjected to transmit power amplifier distortion it provides a lower channel estimation mean square error (MSE) at the receiver. The receiver can exploit this lower MSE, thus improving receiver demodulation, equalization and remodulation.

Embodiments may be utilized in various types of systems. For example, embodiments may be utilized in a variety of multi-carrier communication systems, single-carrier communication systems, spread spectrum communication systems, and/or wireline communication systems. Although embodiments discussed in detail below may pertain to a multi-carrier communication system, or more particularly to an orthogonal frequency division multiplexing (OFDM) system or an orthogonal frequency division multiple access (OFDMA) system, it is to be understood that other embodiments may apply to other types of systems, as well. It is to be appreciated that the disclosed embodiments of the invention can generally be utilized in conjunction with any waveforms that exhibit a large peak to average ratio (PAPR), and with other wideband modulation schemes that spread the waveforms including those used in conjunction with various WCDMA and CDMA standards. For example, the disclosed embodiments can be applied to any mobile radio device that needs to transmit and receive any waveform that produces a high peak to average ratio (PAR) or that has noise-like properties. Some examples of such waveforms include spread spectrum waveforms, such as OFDM, WCDMA, MC-CDMA, etc. With these waveforms, if the transmitter power amplifier is operated near its compression region, the transmitted signal can experience a significant level of distortion significantly degrading the receiver demodulated BER.

Embodiments include embedded synchronization methods and apparatus that are employed in a selective mapping (SLM) system, and accordingly such embodiments may be referred to herein as SPS-SLM. Embodiments of SLM systems will be described in more detail later. It is to be understood that other embodiments may apply to systems in which selective mapping techniques are not employed.

Figure 3:
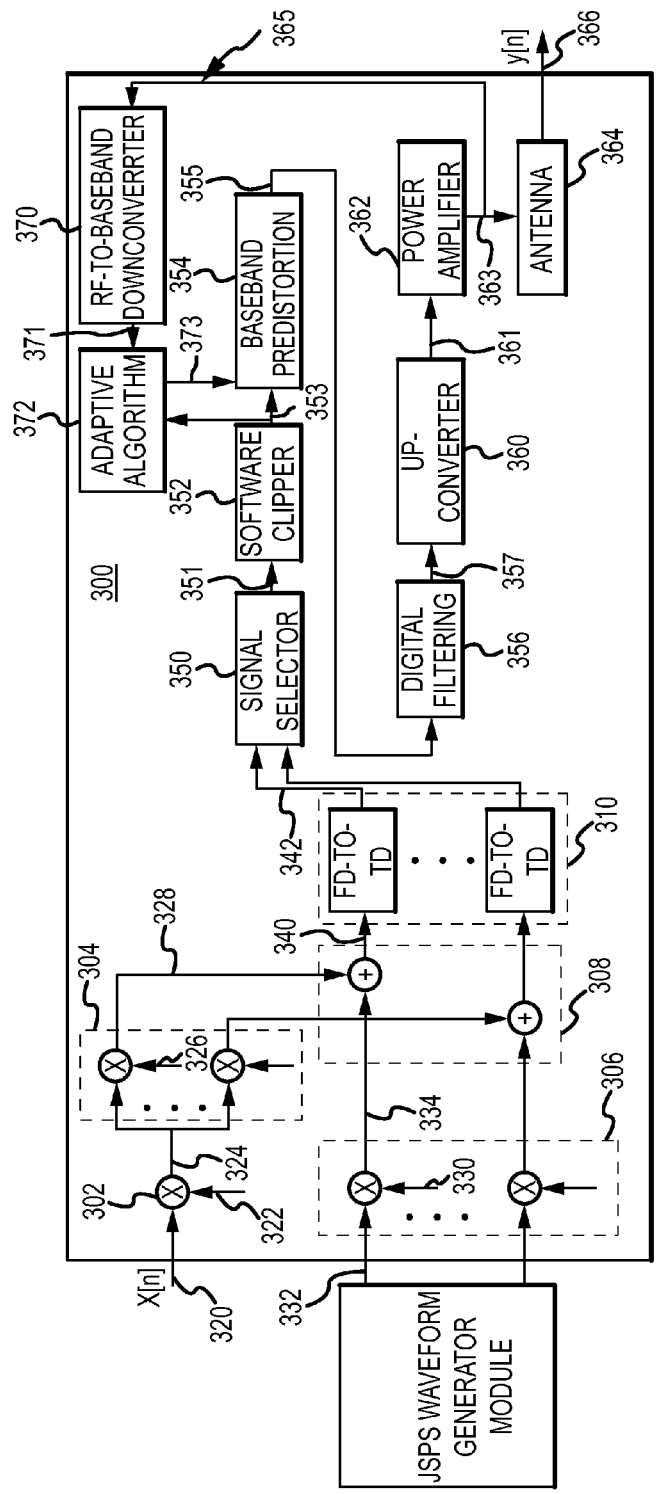
FIG. 3 is a simplified block diagram of a transmitter in accordance with an example embodiment.

FIG. 3 is a simplified block diagram of a transmitter 300, in accordance with an example embodiment. Transmitter 300 includes a SPS Generator module 301, a data/scaling factor combiner 302, a plurality of phase shifters 304, a plurality of SPS/scaling factor combiners 306, a plurality of data/SPS combiners 308, a plurality of frequency domain-to-time domain (FD-to-TD) transformers 310, a signal selector 350, a software clipper 352, a baseband pre-distortion module 354, transmit digital filtering 356, an up-converter 360, a power amplifier 362, and an antenna 364 operatively coupled together as illustrated in FIG. 3, in an embodiment.

Data/scaling factor combiner 302 includes computational apparatus designed to receive a sequence of input data symbols 320, $X_k$, each of which represents a data-bearing part of a signal to be transmitted. In an embodiment, $X_k$ is drawn from a finite constellation. Data/scaling factor combiner 302 is further designed to apply a first scaling factor 322 to an input data symbol 320 in order to produce a scaled input data symbol 324. In an embodiment, the first scaling factor 322 has a value of $\sqrt{1-\rho}$, where $\rho$ is an embedding factor having a value between 0 and 1. The embedding factor represents a ratio of SPS power to signal power, which may be represented as $$\rho = \frac{\sum_k |S[k]|^2}{\sum_k |Y[k]|^2}.$$

In a particular embodiment, the embedding factor has a value in a range of about 0.25 to about 0.35. In another embodiment, the embedding factor has a value in a range of about 0.2 to about 0.4. In still other embodiments, the embedding factor may have higher or lower values than the above-given ranges. The scaled input data symbol 342 may be represented as $\sqrt{1-\rho}X_k$.

Each of the plurality of phase shifters 304 includes computational apparatus designed to apply a different phase shift 326, $$e^{j\phi_k^{(d)}},$$

to the scaled input data symbol 324, in order to produce a plurality of phase shifted input data signals 328, $$\sqrt{1-\rho}\, X_k^{(d)} e^{j\phi_k^{(d)}},$$

where D is a value referred to herein as a candidate number quantity, d is an index referred to herein as a relational index, and d ∈ {1,2, . . . , D}. The candidate number quantity, D, may be selected as any integer number from 1 to 16, in an embodiment, although the candidate number quantity may be a larger number, in other embodiments. In a particular embodiment, the candidate number quantity is selected as an integer number between 3 and 10. In an embodiment, the number of phase shifted input data signals 328 produced equals the candidate number quantity D, although the number of phase shifted input data signals 328 may be different, in other embodiments. The different phase shifts 326 may be represented within entries of a table of phase shift values, in an embodiment, and the relational index, d, may be used as an index into the phase shift value table, among other things. Accordingly, the phase shift value table may have D entries, in an embodiment, although the phase shift value table may have more or fewer entries in other embodiments.

Transmitter 300 also is designed to obtain a plurality of SPS 332, $S_k^{(d)}$, each of which represents a unique synchronization/pilot sequence. In one implementation, the SPS generator module 301 generates the SPS 332. The SPS 332 are used for PAR reduction at the transmitter 300 and for sync/channel estimation/subcarrier interference cancellation at receiver 500. In an embodiment, the SPS generator module 301 can be a table of SPSs which is accessible to or stored in transmitter 300. The table includes one or more sets of pre-generated SPS, each of which may be referenced by a unique index (referred to below as an SLM index). Each SPS 332 in the transmitter's SPS table is represented in the frequency domain, in an embodiment. In an embodiment, each SPS includes synchronization information and pilot signals, and those pilot signals may have variable pilot signal parameters (e.g., variable pilot spacing and/or pilot power). In an alternate embodiment, the synchronization information and pilots may be separately represented.

SPS/scaling factor combiners 306 include computational apparatus designed to apply second scaling factors 330 to the plurality of SPS 332 in order to produce a plurality of scaled SPS 334, $\sqrt{\rho}S_k^{(d)}$, where d is the relational index. Similar to its functionality with respect to the phase shift value table, the relational index, d, also may be used as an index into the SPS table. When used in this context, the relational index alternatively may be referred to as an SLM index. As with the phase shift value table, the SPS table also may have D entries, although the SPS table may have more or fewer entries in other embodiments. In addition, in an embodiment, the number of scaled SPS 334 produced equals the candidate number quantity D, although the number of SPS 334 may be different, in other embodiments.

In the above-described embodiment, each different phase shift value 326 may be related to a unique SPS 332 via the relational index, d. In alternate embodiments, a particular phase shift value 326 may be related to multiple unique SPS 332, or a particular unique SPS 332 may be related to multiple phase shift values 326 (e.g., by including duplicate values in the phase shift value table or the SPS table, for example).

In an embodiment, the second scaling factor 330 has a value of $\sqrt{\rho}$, where ρ is the same embedding factor as the embedding factor incorporated in the first scaling factor 322. As will be more clearly depicted in conjunction with FIG. 4, later, because the first and second scaling factors 322, 330 have an inverse relationship, the value of the embedding factor, ρ, dictates how much relative signal power is allocated to a data-bearing component, $X_k^{(d)}$, of a transmitted signal as opposed to an SPS component, $S_k^{(d)}$, of the transmitted signal.

Phase shifters 304 provide the plurality of phase shifted input data signals 328 to data/SPS combiners 308, and SPS/scaling factor combiners 306 provide the plurality of scaled SPS 334 to data/SPS combiners 308. Each of data/SPS combiners 308 includes computational apparatus designed to combine one of the plurality of phase shifted input data signals 328 with one of the scaled SPS 334 in order to produce a plurality of combined signals 340, where the plurality of combined signals 340 may be represented in the frequency domain by the equation:

$$Y_k^{(d)} = \sqrt{\rho}\, S_k^{(d)} + \sqrt{1-\rho}\, X_k^{(d)} e^{j\phi_k^{(d)}}. \qquad \text{(Equation 2)}$$

where the frequency-domain transmit data $X_k$ is added to the synchronization data, $S_k$, and d and associated $\phi^{(d)}$ represent one of D sequences and phase rotations designed to reduce the overall PAR. In an embodiment, the number of combined signals 340 produced equals the candidate number quantity D, although the number of combined signals 340 may be different, in other embodiments. Although not illustrated, directly after the phase shifters 308, a pre-equalizer module can be used to compensate for any digital filtering amplitude variation from the transmitter to receiver. For example, a pre-equalizer module can be used to compensate for amplitude variation by inverting any amplitude ripple prior to the filter effect(s). The cascaded response of the pre-equalizer model and the combined transmitter/receiver filter response results in a flat in-band signal amplitude response. The result is an improvement in both in-band and out-of-band signal quality with less distortion.

Data/SPS combiners 308 provide the plurality of combined signals 340 to FD-to-TD transformers 310. FD-to-TD transformers 310 include computational apparatus designed to perform frequency domain-to-time domain transformations on each of the combined signals 340, in order to produce a plurality of candidate signals 342, $y^{(d)}[n]$. In an embodiment, the number of candidate signals 342 produced equals the candidate number quantity D, although the number of candidate signals 342 may be different, in other embodiments. The frequency domain-to-time domain transformation may include an inverse Fourier transform (IFT) or, more particularly, an inverse discrete Fourier transform (IDFT), in various embodiments, although other types of frequency domain-to-time domain transformations may be performed in other embodiments. Accordingly, in an embodiment, transmit sequences of the plurality of candidate signals 342 in the time domain may be represented as $y^{(d)}[n]=IDFT\{Y_k^{(d)}\}$ or alternatively by the following:

$$y^{(d)}[n] = \frac{1}{\sqrt{N}} \sum_{k=0}^{N-1} Y_k^{(d)} e^{j2\pi kn/N} \quad \text{(Equation 3)}$$
$$= x^{(d)}[n]\sqrt{(1-\rho)} + s^{(d)}[n]\sqrt{(\rho)}$$

where $x^{(d)}[n]=IDFT\{X_k e^{j\phi_j^{(d)}}\}$, $s^{(d)}[n]=IDFT\{S_k^{(d)}\}$, and n ∈ {0,1,..., N−1}. In an embodiment, an efficient algorithm for computing the inverse discrete Fourier transform (IDFT) may be implemented, such as an inverse fast Fourier transform (IFFT), for example.

The above description indicates that, in an embodiment, transmitter 300 includes a number of phase shifters 304, a number of SPS/scaling factor combiners 330, a number of data/SPS combiners 308, and a number of FD-to-TD transformers 310 that is equal to the candidate number quantity, D, and that these transmitter elements are designed to generate a same number, D, of phase shifted input data signals 328, scaled SPS 334, combined signals 340, and candidate signals 342, respectively. In other embodiments, transmitter 300 may include more or fewer than the candidate number quantity, D, of phase shifters 304, SPS/scaling factor combiners 330, data/SPS combiners 308, and/or FD-to-TD transformers 310, and/or some or all of these transmitter elements may be designed to generate more or fewer than the candidate number quantity, D, of phase shifted input data signals 328, scaled SPS 334, combined signals 340, and/or candidate signals 342, respectively. Although the number of phase shifters 304, SPS/scaling factor combiners 330, data/SPS combiners 308, and/or FD-to-TD transformers 310 may be the same, in an embodiment, in other embodiments, the numbers of these transmitter components 304, 330, 308, 310 and/or signals 328, 334, 340, 342 may be different. For example, but not by way of limitation, data/SPS combiners 308 may combine a same phase shifted input data signal 328 with multiple scaled SPS 334 or data/SPS combiners 308 may combine a same scaled SPS 334 with multiple phase shifted input data signals 328, in various embodiments. In other embodiments, some signals may be disregarded when, for example, they fail to meet certain criteria and/or threshold levels, which ultimately may result in fewer than the candidate number quantity, D, of candidate signals 342 being provided to signal selector 350. Accordingly, embodiments of the inventive subject matter are not limited to there being a same number, D, of transmitter components 304, 330, 308, 310 and/or signals 328, 334, 340, 342.

FD-to-TD transformers 310 provide the plurality of candidate signals 342 to signal selector 350. In an embodiment, signal selector 350 includes computational apparatus designed to determine peak-to-average ratios (PARs) for some or all of the candidate signals 342, and based on the PARs, to identify a selected signal 351 from the candidate signals 342.

As used herein, the term peak-to-average ratio (PAR) means a measurement of a waveform that equals the peak amplitude of the waveform divided by the root mean squared (RMS) or time averaged value of the waveform. Although PAR reduction is discussed extensively herein, embodiments also apply to peak-to-average power ratio (PAPR) reduction, and use of the term PAR herein is intended to include at least PAR and PAPR. PAR is a metric that facilitates an assessment of the dynamic range of a signal, and a signal with a low PAR may be preferable, because it may allow the power amplifier 362 to operate at higher power efficiencies without substantial signal distortion. In an embodiment, the PAR for each of the candidate signals 342 may be calculated according to the following equation:

$$PAR\{y^{(d)}[n]\} = \frac{\max_n |y^{(d)}[n]|^2}{E[|y^{(d)}[n]|^2]}. \quad \text{(Equation 4)}$$

In an embodiment, signal selector 350 performs a next step of a selected mapping (SLM) process, which is a PAR reduction tool that may reduce the PAR of OFDM symbols by multiple decibels (dBs). In a particular embodiment, signal selector 350 is designed to identify the selected signal 351 as the candidate signal 342 with the lowest PAR. A selected mapping (SLM) index, $\tilde{d}$, of the candidate signal 342 with the lowest PAR may be determined, in an embodiment, according to the following equation:

$$\tilde{d} = \min_d PAR\{y^d[n]\}. \quad \text{(Equation 5)}$$

In accordance with an embodiment, PAR reduction is achieved by using D candidate signals 342, and selecting the candidate signal 342 with the lowest PAR. More specifically, the signal selector 350 selects a particular one $y^{(\tilde{d})}[n]$ of the candidate signals 342, $y^{(d)}[n]$, that has the lowest PAR for transmission in order to minimize the overall PAR. In another embodiment, additional PAR reduction is achieved based on the design of the SPS 330, as will be described in more detail later. More particularly, when $IDFT\{S_k^{(d)}\}=s^{(d)}[n]$ has low PAR, the combined sequence of $y^{(d)}[n]=x^{(d)}[n]\sqrt{(1-\rho)}+s^{(d)}[n]\sqrt{(\rho)}$ may, on average, have a lower PAR than $x^{(d)}[n]$. The extent of PAR reduction is related to the magnitude of the embedding factor, ρ. When the embedding factor is increased, PAR reductions also are increased. In an embodiment, the SPS 330 are designed to have a relatively low PAR (e.g., PAR<0.5 dB). In a particular embodiment, the SPS 330 are designed with arbitrary power spectral densities (PSD) using a convex optimization algorithm, as will be described in more detail later.

In order for the receiver (e.g., receiver 114, FIG. 1) to recover the input data symbol 320, $X_k$ (e.g., to determine an estimate, $\hat{X}_k$, of the input data symbol), the receiver should have knowledge of or estimate the SLM index, $\tilde{d}$. In an embodiment, the receiver has knowledge of possible values for $S_k^{(d)}$ and $\phi_k^{(d)}$ in the form of one or more tables that are accessible to (e.g., stored at) the receiver (e.g., receiver 114), where those tables correspond to the phase shift value table and the SPS table accessible to the transmitter 300. Accordingly, when the receiver has knowledge of SLM index, $\tilde{d}$, it may recover the input data symbol 320, $X_k$. Embodiments of methods and apparatus for a receiver to obtain knowledge of the SLM index, $\tilde{d}$ (e.g., to recover the SLM index, $\tilde{d}$, or to determine an estimated $\hat{\tilde{d}}$ of the SLM index) will be discussed in more detail below, in conjunction with FIG. 5. Basically, embodiments achieve blind phase sequence detection without time and/or frequency synchronization, and/or a priori knowledge of the channel.

Figure 4A:
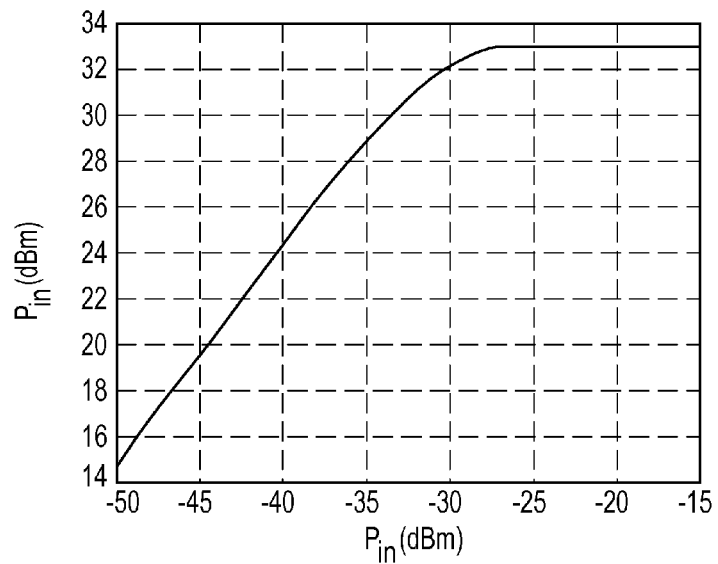
FIG. 4A is a graph of a response curve of the power amplifier that illustrates measured input power ($P_{IN}$) (dBm) of the power amplifier versus measured output power ($P_{OUT}$) (dBm) of the power amplifier.

FIG. 4A is a graph of a response curve of the power amplifier 362 that illustrates measured input power ($P_{IN}$) (dBm) of the power amplifier 362 versus measured output power ($P_{OUT}$) (dBm) of the power amplifier 362. The response curve of the power amplifier 362 can vary over time. As the input power to the amplifier 362 is increased the output power ($P_{OUT}$) from the amplifier 362 increases steadily also. The difference between these two is the Gain of the amplifier 362. However, there comes a point however when the amplifier 362 can no longer supply any more output power ($P_{OUT}$) with an increase in input power ($P_{IN}$) and thus the gain of the amplifier 362 drops with increasing input power ($P_{IN}$) level. When the gain has dropped by 1 dB the amplifier 362 has reached its 1 dB compression point (sometimes called P1 dB) and distortion rises rapidly beyond this point. As illustrated in FIG. 4A, the measured response characteristic of the power amplifier 362 is linear up until a certain point. When the power amplifier 362 operates in the linear region there is a one-to-one correspondence between the input power ($P_{IN}$) (dBm) of the power amplifier 362 and output power ($P_{OUT}$) (dBm) of the power amplifier 362. When the input power ($P_{in}$) (dBm) reaches a certain point, the PA 362 saturates and it enters what is commonly referred to as a "compression region" where the response becomes non-linear and the output power ($P_{out}$) (dBm) will essentially remain constant as input power ($P_{in}$) increases.

In a power amplifier 362, the drive power at which the output power ($P_{OUT}$) saturation occurs is called the input saturation power. As used herein, the term "input backoff or IBO" refers to the ratio of input saturation power to desired drive power. Increasing IBO (or decreasing input drive power) produces less output power ($P_{OUT}$) but improves the linearity of the power amplifier 362, since the degree of nonlinearity is reduced. The output saturation power of the power amplifier 362 is the maximum total power available from the power amplifier 362. Output backoff (OBO) is the ratio of maximum output (saturation) power to actual output power ($P_{OUT}$). Thus, OBO depends on IBO, that is, where the drive power is operated. Increasing IBO lowers the output power ($P_{OUT}$) and increases the OBO. To achieve maximum efficiency, the PA 362 should operate in the linear region, and thus must operate at "very low" input backoff (IBO) power levels. Here "very low" means that the PA would operate in the region of 0-3 dB input backoff (IBO).

After reducing the PAR by selecting an appropriate signal 351 at signal selector 350, the transmit signal 351 still has a non-constant modulus. As such, if the signal 351 is provided directly to the power amplifier 362, peaks of the signal 351 will cause the power amplifier 362 to saturate and operate in its non-linear compression region. As a result, the peaks of the transmit signal 351 will be distorted by the power amplifier 362, and the resulting amplified signal will be distorted by the PA 362. Distortion that is caused when the power amplifier 362 operates in its non-linear or compression region is referred to herein as "non-linear" distortion (NLD).

To reduce this NLD caused by the PA 362, it is desirable to linearize the input power ($P_{in}$) (dBm) versus output power ($P_{out}$) (dBm) response characteristic of the power amplifier.

To help do so, the disclosed embodiments provide transmitter side mitigation techniques that can help prevent the PA 362 from operating in its non-linear compression region thereby reducing non-linear distortion (NLD) that is caused by the power amplifier (PA) 362 of the transmitter 300.

Non-Linear Distortion (NLD) Reduction at Transmitter

Transmitter side mitigation techniques involve employing a two-stage pre-distortion process at the transmitter 300 so that the transmitted signal 366 is distorted in a known way when it reaches the receiver. The receiver can then use this known distortion to estimate and cancel distortion caused by the power amplifier, which is referred to herein as "power amplifier distortion (PAD)."

Software clipper 352 (or "soft" clipper 352) receives the selected signal 351. The software clipper 352 is implemented within the digital domain and is designed to "soft clip" the selected signal 351 to generate a clipped signal 353. The software clipper 352 constrains the peak power of a signal before the signal reaches either the DAC (not illustrated in FIG. 3) and/or the PA 362. The software clipper block 352 can lower the average power of the selected signal 351. In other words, if any part of the waveform is clipped (without raising the original point of average power), the average power of any signal would be lowered because less energy in the high peaks is lost. Clipping can be made similar to the PA response. Ideally, the software clipper 352 as a linear (1-to-1) response up to the compression or "saturation" region of the actual PA 362 so that the response is substantially linear until the compression region is reached at which point the signal 351 is hard limited. For instance, if a hard limit value of the software clipper 352 is A, then, for the transmit signal sequence 351, ($y^{(\tilde{d})}[n]$), n=1, ..., N, the output 353 of the software clipper 352 can be expressed as:

$$\tilde{y}^{(\tilde{d})}[n] = \begin{cases} y^{(\tilde{d})}[n] & \text{if } |y^{(\tilde{d})}[n]| \leq A \\ A\exp(j\phi_{y[n]}) & \text{if } |y^{(\tilde{d})}[n]| > A, \end{cases}$$

where $\phi_{y[n]}$ is the phase of transmit sequence ($y^{(\tilde{d})}[n]$) 351.

The clipping amplitude response of this function is flat once the input signal 351 surpasses the chosen clipping amplitude. When this magnitude exceeds the hard limit value of A, only the magnitude of transmit signal sequence $\tilde{y}^{(\tilde{d})}[n]$ 351 is effected by the soft-clipper 352, and the phase ($\phi_{y[n]}$) of the signal 351 is not changed.

Use of the software clipper 352 in series with the PA 362 alone to reduce PAR and subsequent required IBO is not completely effective. Utilization of the software clipper 352 works effectively only if the PA 362 is highly linear up to the saturation (or clipping) point of the PA 362. However, any realistic PA 362 device will have a finite amount of nonlinear input power to output power gain prior to it's output power limiting point. It is this inherent nonlinearity which is desired to correct, such that that input to output power conversion induces minimal modification on the input signal to the PA 362. Without this undesirable distortion and spectral impurities may result in significant transmitter and receiver performance degradation in terms of transmit spectral purity (i.e., wasting energy in out of band signal components and causing potentially irreducible receiver decoding errors). The inventors observed that if the amplitude of the transmit signal is limited (such that the modulus never exceeds a certain value), then the transmit signal amplitude is never sufficient to cause the PA 362 to enter its saturation region. However, when the amplitude of the transmit signal is limited so that the PA 362 does not enter its saturation region, maximum efficiency of the PA 362 can not be realized. Furthermore, because the PA 362 does not induce ideal clipping (i.e., in the sense that its response curve is not completely linear below the saturation region), some nonlinear effects of the PA 362 will still be present on the output signal.

As will now be described, both the residual nonlinear effects of the PA 362 and the low average power of the signal can be overcome by adding a baseband predistortion module 354/370/372. The baseband predistortion module 354/370/372 has a third input power versus output power response curve 420 that is an inverse of the first input power versus output power response curve 430 of the power amplifier 362. Baseband predistortion module 354/370/372 is coupled to the software clipper module 352 so that it receives the clipped signal 353 and is designed to adaptively predistort the clipped signal to generate a clipped, predistorted signal 355.

The baseband predistortion module 354/370/372 comprises a RF-to baseband downconverter module 370, an adaptive algorithm 372, a predistorter module 354 and a feedback loop 365 that couples the power amplifier 362 to the baseband predistortion module 354/370/372. The feedback loop designed to feed the amplified signal 363 back to an RF-to baseband downconverter module 370. The baseband predistortion module 354/370/372 is designed to adaptively pre-distort the clipped baseband signal 353 based on a fedback version of the amplified RF transmit signal waveform 363 to generate the clipped-predistorted signal 355.

The RF-to baseband downconverter module 370 receives the fedback version of the amplified RF transmit signal waveform 363 and down converts the amplified signal 363 to a power amplifier-distorted baseband signal 371 which is provided to an adaptive algorithm 372. The adaptive algorithm 372 also receives the clipped signal 353 and can digitally pre-distort the baseband signal 371 and then provide signal 373 back to the baseband predistortion module 354. For instance, the adaptive algorithm 372 can generate an error signal based on the power amplifier-distorted baseband signal 371 and the clipped baseband signal 353, and can digitally pre-distort the power amplifier-distorted baseband signal 371 to generate a gain and phase adjustment signal 373. The predistorter module 354 designed to adaptively pre-distort the clipped baseband signal 353 based on the gain and phase adjustment signal 373 to generate the clipped-predistorted signal 355. The gain and phase adjustment signal 373 is used to predistort the clipped baseband signal 353 such that non-linearity caused by the power amplifier 362 (up to the clipping or compression region of the PA 362) is equalized when the clipped-predistorted signal 355 is applied to the power amplifier 362 such that the amplified RF transmit signal waveform 363 generated by the power amplifier is linearized when the power amplifier 362 operates in a compression region. Details of baseband predistortion is known in the art, and for sake of brevity will not be described in detail herein. For more information on baseband predistortion, see the publications entitled "Fundamentals of Power Amplifier Linearization Using Digital Pre-Distortion," by Mohamed K. Nezami, September 2004, and "Prototype Implementation of Two Efficient Low-Complexity Digital Predistortion Algorithms," by Ernst Aschbacher et al., EURASIP Journal on Advances in Signal Processing, Volume 2008, Article ID 473182, which are incorporated herein by reference in their entirety.

Pre-distortion should ideally work to linearize the response curve of the power amplifier 362 up to the compression region of the power amplifier 362. As mentioned above, the response curve of the baseband pre-distortion module 354 should be the inverse of the response curve of the power amplifier 362 such that when the two response curves are cascaded the result is a linear response curve (up to the compression region of the power amplifier 362). Thus, when the power amplifier 362 operates in an operating region prior up to its compression region, the PAR reduction and pre-distortion processes can help reduce power amplifier induced distortion of the transmit signal. Pre-distorting the signal 353 can increase the average power, while allowing the PA 362 to operate in the region just prior to compression so that no other distortion is imposed by the actual PA 362. By including the baseband predistortion module 354, the eventual transmit signal 361 will be amplified with maximum efficiency by the power amplifier 362. However, when the power amplifier 362 operates in its compression region, distortion is still probable after passing the transmit signal through the power amplifier 362.

Figure 4B:
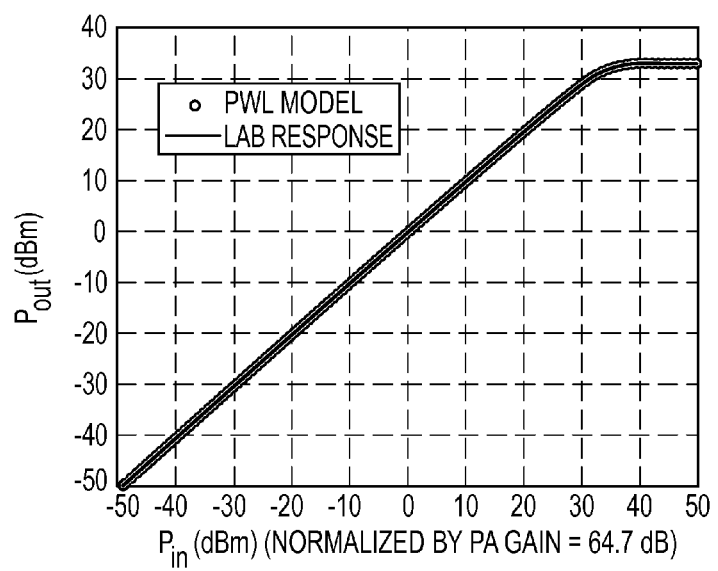
FIG. 4B is a graph that illustrates a piece-wise linear model of a response curve of the PA model in terms of input power ($P_{IN}$) (dBm) versus measured output power ($P_{OUT}$) (dBm) superposed with a the measured PA response curve of FIG. 4A.
Figure 4C:
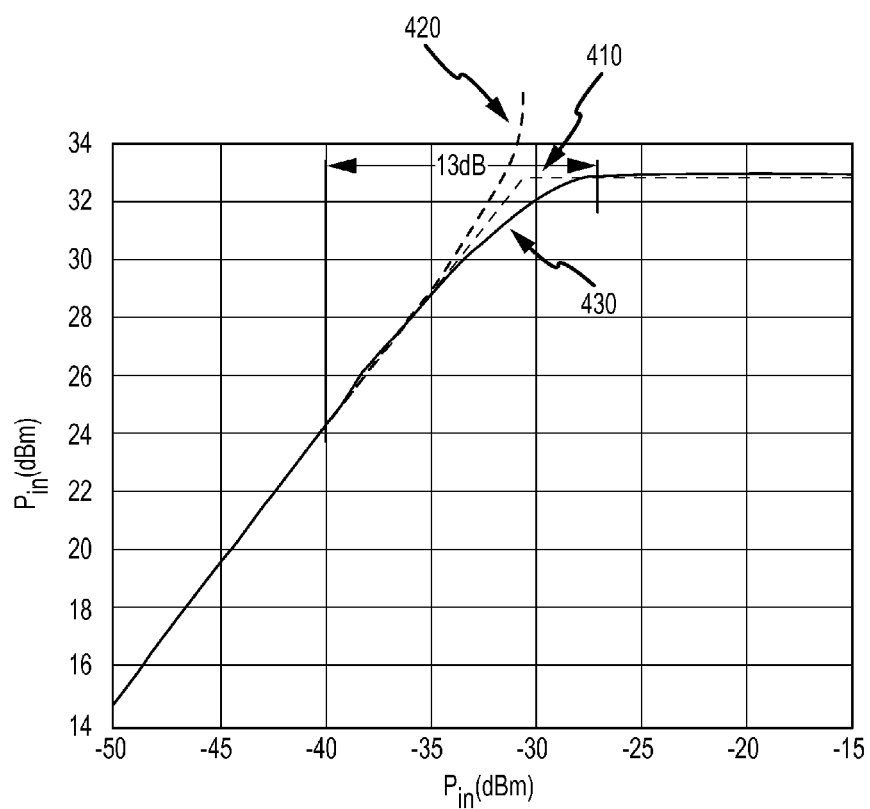
FIG. 4C is a graph of response curves of the software clipper, baseband predistortion module and the power amplifier that illustrates measured input power ($P_{IN}$) (dBm) versus measured output power ($P_{OUT}$) (dBm)

FIG. 4C is a graph of response curves of the software clipper 352, baseband predistortion module 354 and the power amplifier 362 that illustrates measured input power ($P_{IN}$) (dBm) versus measured output power ($P_{OUT}$) (dBm). In particular, curve 410 is the response curve of the software clipper 352, curve 420 is the response curve of the baseband predistortion module 354 and curve 430 is the response curve of the transmit PA 362. The response curve 410 of the software clipper 352 is designed to have a desired response characteristic like that of an ideal linearized version of the PA response curve 430. The software clipper 352 has a response curve 410 that clips the baseband signal in a known way (i.e., in a way that is always the same and that does not change over time) before the clipped signal 353 reaches the PA 362 so that the PA 362 does not clip the signal. The software clipper 352 therefore imposes a distortion on the envelope variations or peaks that extend beyond the compression region of the PA 362. In a sense, the response curve 410 of the software clipper 352 is designed so that any distortion it causes dominates or overrides that caused by the response curve 430 of the power amplifier 362, and will therefore be the controlling factor in terms of any distortion caused to the transmit signal. Because the response curve 410 of the software clipper 352 has a known response, the transmitted signal will be distorted in a known way before it reaches the power amplifier 362. Any non-linearity in the transmit signal is known regardless of variations in the response curve 430 of the power amplifier 362 that can occur over time and regardless of the particular power amplifier that is used. Because the distortion always occurs in a known way, the net degradation on the signal is known and invariant over time and across transmitters. This known behavior of the software clipper 352 can be used at the receiver to (1) better estimate the nonlinear distortion on the received signal, and (2) more accurately remove/cancel non-linear distortion via sub-carrier interference cancellation. In addition, if there is significant variation in the PA response curve 430, the degradation will me minimal because of the combined effect of soft clipper 352 and predistortion module 354.

Digital filtering 356 includes all filtering for up sampling and pulse shaping. Digital filtering 356 receives the clipped, predistorted signal 355 and is designed to digitally filter the clipped, predistorted signal 355 to generate a filtered signal 357. Up-converter 360 receives the filtered signal 357, and is designed to perform a frequency up-conversion and digital-to-analog conversion process on the filtered signal 357 in order to convert the filtered signal 357 from a baseband or intermediate frequencies (IF) to the radio frequency (RF) band. The analog up-converted signal 361 is then amplified by power amplifier 362 to increase signal power and produce an amplified signal 363 such that increased transmission range can be achieved.

The amplified signal 363 is converted to an analog RF signal 366 and transmitted over the channel (e.g., channel 106, FIG. 1) by antenna 364. Unlike some traditional techniques, the analog RF signal 366 may be transmitted without a preamble, and the embedded synchronization/pilot sequence information provides a way for a receiver robustly to synchronize with a channel-affected version of the transmitted signal.

Thus, the transmitter side mitigation techniques involve implementing PAR reduction techniques at signal selector 350 along with a two-stage pre-distortion process that includes soft-clipping 352 and baseband predistortion 354. As will be described below, when the receiver receives the transmitted signal, the receiver can more accurately estimate the transmitted bits because distortion characteristics are known a priori and can be used to estimate the actual PAD accurately and independently from variations across hardware implementations. To reduce remaining PA induced distortion, an iterative distortion estimation and cancellation technique is implemented within the receiver, as will be described below with reference to FIG. 5.

The Transmit Signal

In the frequency domain, transmit signal, $Y_k$, may be represented according to the equation:

$$Y_k = X_k\sqrt{1-\rho} + S_k\sqrt{\rho}, \quad \text{(Equation 7)}$$

where $X_k$ represents and input data symbol 320, $S_k$ represents an SPS 332, $\sqrt{1-\rho}$ represents a first scaling factor 322, and $\sqrt{\rho}$ represents a second scaling factor 330. As mentioned previously, because the first and second scaling factors 322, 330 have an inverse relationship, the value of the embedding factor, $\rho$, dictates how much relative signal power is allocated to the data component, $X_k$, of the transmit signal as opposed to the SPS component, $S_k$, of the transmit signal.

In an embodiment, the embedding factor, $\rho$, has a fixed value, and accordingly the first scaling factor 322 and the second scaling factor 330 also have fixed values. In another embodiment, the transmitter 300 may adjust the value of the embedding factor dynamically. When the embedding factor is increased, the relative power of the SPS component with respect to the data component also will increase. This may be desirable, for example, when the channel is relatively harsh, and increased PAR reductions are desired. However, a tradeoff to increasing the embedding factor (and thus increasing PAR reductions) may be that, as a harsh channel improves (e.g., becomes less harsh), the receiver may have more than enough channel SNR to demodulate, although the received signal SNR may be limited by the distortion induced by the power amplifier 362. In an embodiment, the receiver may feed back information back to the transmitter 300, which indicates the receiver demodulation performance, and thus that the transmitter 300 may increase D and/or $\rho$. Such increases may enable transmitter 300 further to reduce PAR and to minimize the probability of distortion to the transmitted signal that may be induced by the non-linear power amplifier 362. Alternatively, when the embedding factor is decreased, the relative power of the SPS component with respect to the data-bearing component also will decrease. Decreasing the embedding factor may be desirable, for example, when the power amplifier 362 is not inducing significant distortion onto the transmitted signal, and when the demodulation performance of the receiver (e.g., as indicated through feedback from the receiver) is not significantly limited by power amplifier induced distortions and/or by channel multi-path induced distortion, provided that sufficient synchronization performance may still be achieved. However, decreasing the embedding factor may result in smaller PAR reductions. In still another embodiment, the value of the embedding factor may be set to 0, and/or data/scaling factor combiner 302 and SPS/scaling factor combiners 306 may be disabled. In that case, transmit signal will include only a data component, as the power of any SPS component effectively will have been reduced to zero. In such an embodiment, a preamble (not illustrated) may be transmitted along with the data in order to facilitate synchronization with the signal at the receiver.

Figure 5:
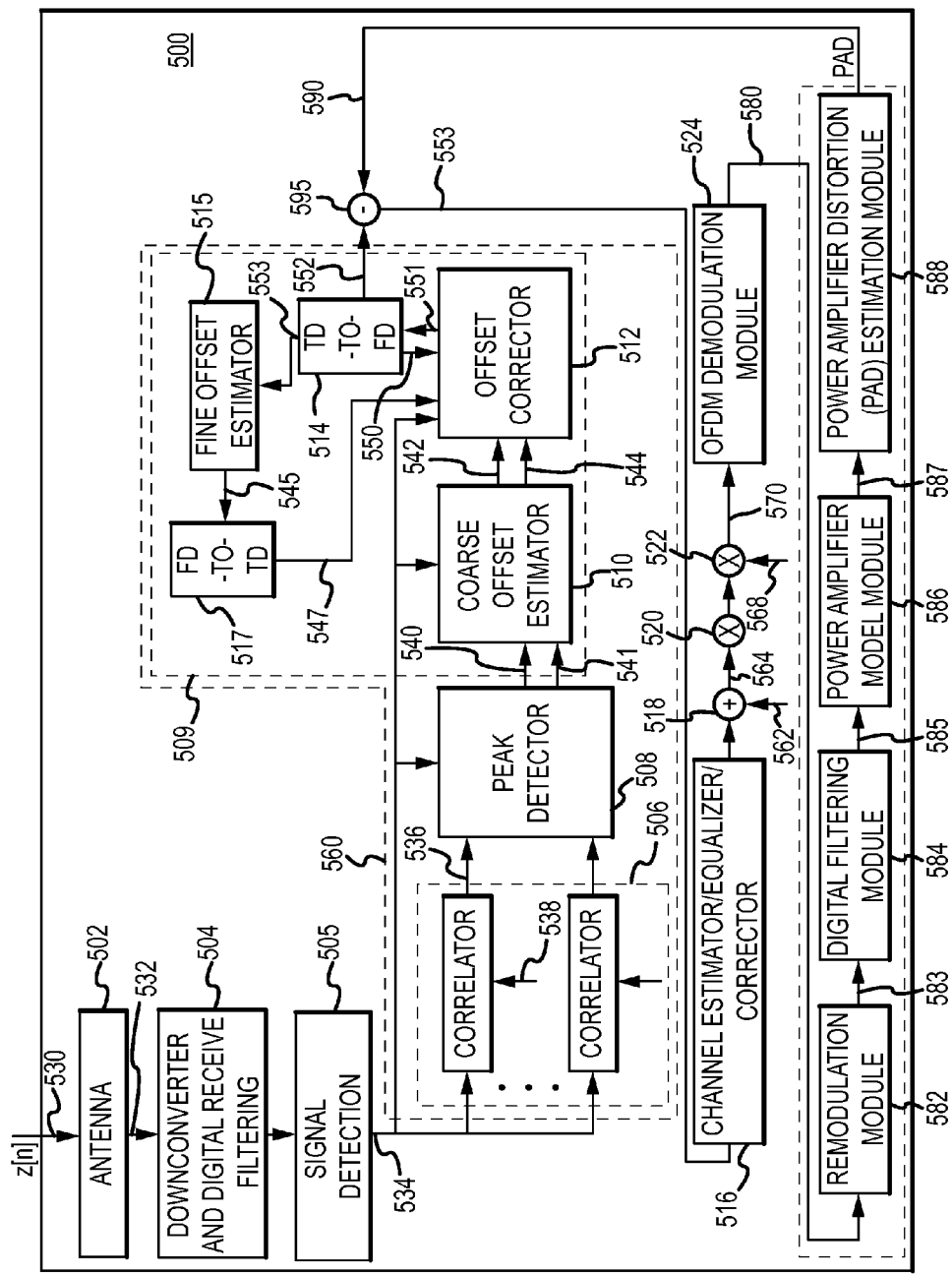
FIG. 5 is a simplified block diagram of a receiver 500, in accordance with an example embodiment.

FIG. 5 is a simplified block diagram of a receiver 500, in accordance with an example embodiment. Receiver 500 includes an antenna 502, a down-converter and digital filtering module 504, signal detection module 505, a signal synchronization module 560, a channel estimator/equalizer/corrector 516, an SPS removal element 518, a scaling element 520, an inverse selective mapping module that is implemented via a phase shift element 522, a demodulator 524, a re-modulator 582, a digital filtering module 584, a power amplifier model module 586, and a power amplifier distortion (PAD) estimator 588 and a subtraction module 595, operatively coupled together as illustrated in FIG. 5. As will be described in detail below, receiver 500 includes a conjugate correlation receiver, which is designed to perform a blind phase sequence detection method, in which the receiver 500 may exclude the traditional processes of performing time or frequency synchronization, and in which the receiver 500 may not have a priori knowledge of the channel characteristics.

Antenna 502 is designed to receive a wireless RF signal 530 from the channel, and to produce an analog RF signal 532. As discussed in detail above, the wireless RF signal 530 represents a channel-affected version of a selected signal that includes a data signal combined with an SPS. The down-converter and digital filtering module 504 is designed to perform an analog-to-digital conversion, a frequency down-conversion process and digital filtering on the analog RF signal 532, in order to produce an IF or baseband received signal 534. Essentially, the baseband received signal 534 represents a channel-affected version of a selected signal (e.g., selected signal 351, FIG. 3) that was transmitted by a transmitter (e.g., transmitter 300, FIG. 3) over a channel. The baseband received signal 534 includes information regarding TO, CFO, and soft clipping distortion. Before demodulating the received signal, the receiver includes modules for estimation of the carrier frequency offset (CFO), timing offset (TO) and channel fading.

The baseband received signal 534 may be represented by the following equation:

$$z^{(d)}[n] = (f_{PA}(y^{(d)}[n-n_0]) * h[n])e^{-j2\pi\epsilon/N} + \eta[n], \quad \text{(Equation 8)}$$

where $f_{PA}(\cdot)$ represents the power amplifier input-to-output characteristic, which may be assumed to be time-invariant (although the input-to-output characteristic may be time-variant, in other embodiments), h[n] represents a multi-path fading component of the channel, N is the total number of sub-carriers, $y^{(d)}[n-n_0]$ represents the transmitted signal, $y^{(d)}[n]$, subjected to a TO component, $n_0$ is the TO, $\epsilon$ is the CFO and $e^{-j2\pi\epsilon/N}$ represents a CFO component, $\eta[n]$ represents an additive noise component, * is the convolution operator, and d is the SLM index. It is to be noted that any carrier phase shift present between the transmitter and receiver is assumed to be included in the phase of the channel at the receiver.

The signal detection module 505 receives and detects the baseband received signal 534. The signal detection module 505 can be implemented using is an energy detector to determine if a signal is present, and automatic gain control (AGC) functionality to adjust the signal. For example, when the signal detection module 505 receives the baseband received signal 534 it can either perform correlation to D possible SPS signals (or alternatively perform cyclic prefix delay lag correlation), measure energy in detection window and determine if the measured energy is greater than signal detection threshold. If the measured energy is greater than the signal detection threshold, the signal detection module 505 continues on to sync detection/estimation. If the measured energy is less than the signal detection threshold, the signal detection module 505 continues signal detection process.

The signal synchronization module 560 includes a plurality of correlators 506, a peak detector 508, and an offset estimator/corrector 509. As will be described in detail below, transmitter 500 is designed to determine estimated channel perturbations (e.g., multi-path fading, TO, CFO, and/or other signal perturbations) reflected within the baseband received signal 534, to apply corrections to the received signal 534 based on the estimated channel perturbations, and to produce a demodulated output signal 580 that comprises output data symbols ($\hat{X}_k([n])$) 580 based on the corrected received signal, where the output data symbols ($\hat{X}_k[n]$) 580 represent a frequency domain estimate of the input data symbols (e.g., input data symbols 320, FIG. 3) that was processed and transmitted by the transmitter.

In an embodiment, estimated channel perturbations are determined by the plurality of correlators 506, the peak detector 508, the offset estimator/corrector 509, and the channel estimator/equalizer/corrector 516. The plurality of correlators 506 includes computational apparatus designed to receive the baseband received signal 534, to obtain a plurality of candidate synchronization sequences 538, and to produce a plurality of conjugate correlation (CC) outputs 536, $r^{(d)}[u]$. More particularly, each correlator 506 is designed to correlate the baseband received signal 534 with a different candidate synchronization sequence 538, $s^{(d)}[n]$.

In an embodiment, the candidate synchronization sequences 538 include time-domain versions of the same synchronization/pilot sequences (e.g., SPS 332, FIG. 3) as were combined by the transmitter (e.g., transmitter 300, FIG. 3) with the phase shifted input data (e.g., phase shifted input data 328, FIG. 3). As mentioned previously, both the transmitter (e.g., transmitter 300) and the receiver 500 each may have knowledge of the candidate SPS by each having access to substantively identical tables of SPS, although the transmitter's SPS table may include SPS represented in the frequency domain, and the receiver's SPS table may include the same SPS represented in the time domain, in an embodiment.

As described above, the index ($\tilde{d}$) is an index to the SLM phase that was induced at the transmitter 300 and the particular SPS sequence chosen to minimize PAR at the transmitter 300. Since the receiver 500 has no knowledge of $\tilde{d}$, it must compute an estimate of it using Equations (9) through (14) to estimate $\tilde{d}$, along with the CFO, and the TO. The plurality of conjugate correlation outputs 536 may be represented by the equation:

$$r^{(d)}[u] = CC\{s^{(d)}[n], z^{(d)}[n-u]\}, \quad \text{(Equation 9)}$$

where the conjugate correlation between two length-N sequences may be defined as:

$$CC\{a[n], b[n]\} = \left(\sum_{n=0}^{(N/2)-1} a^*[n]b[n-u]\right) \cdot \left(\sum_{n=N/2}^{N-1} a^*[n]b[n-u]\right)^*. \quad \text{(Equation 10)}$$

where $(\cdot)^*$ is the conjugate operation.

In an embodiment, the number of conjugate correlation outputs 536 produced equals the candidate number quantity D, although the number of conjugate correlation outputs 536 may be different, in other embodiments.

In an embodiment, the baseband received signal 534 may be divided into a plurality of subcode sequences in order to reduce the number of operations associated with performing the correlation process. In such an embodiment, each conjugate correlation output 536 may be produced, by generating a sub-correlation for each subcode sequence, and summing together the sub-correlations to form a summed result having a single correlation peak.

Correlators 506 provide the plurality of conjugate correlation outputs 536 to peak detector 508. In an embodiment, correlators 506 may not provide (or peak detector 508 may not evaluate) those of the plurality of conjugate correlation outputs 536 that have correlation peaks below a threshold. Peak detector 508 includes computational apparatus designed to determine an estimate of the SLM index 540, $\hat{\tilde{d}}$, based on the conjugate correlation outputs 536. In an embodiment, the SLM index estimate 540 is determined according to the equation:

$$\hat{\tilde{d}} = \underset{d}{\mathrm{argmax}} |r^{(d)}[u]|. \quad \text{(Equation 11)}$$

Accordingly, the SLM index estimate 540 corresponds to the conjugate correlation output 536 that represents a highest correlation peak. Unlike traditional methods, embodiments include blind phase sequence detection criterion (e.g., no side information representing the SLM index is transmitted) in order to determine the SLM index estimate 540, and the SLM index estimate 540 is determined based on the conjugate correlations between the received signal 534 and the candidate synchronization sequences 538. Correct detection of $\tilde{d}$ may depend on the magnitude of the peaks of $|r^{(d)}[u]|$ for $d \neq \tilde{d}$, also referred to herein as "spurious correlation peaks." When the spurious correlation peaks all are less than the peak in $|r^{(\tilde{d})}[u]|$, $\tilde{d}$ may be correctly detected (e.g., $\hat{\tilde{d}} = \tilde{d}$). In an embodiment, and as will be described in more detail later, the candidate SPS 538 are designed so that the spurious correlation peaks are low. In a particular embodiment, the candidate SPS 538 are designed so that:

$$[\max CC\{s^{(d)}[n], s^{(d)}[n-u]\}] < th_{self}, \quad \text{(Equation 12)}$$

where $th_{self}$ is a threshold that provides adequate system performance. Peak detector 508 provides the SLM index estimate 540, $\hat{\tilde{d}}$, to offset estimator/corrector 509 (or more particularly to coarse offset estimator 510), along with the $\hat{\tilde{d}}$ th conjugate correlation output 541 (although this may be obtained from elsewhere, as well).

Offset estimator/corrector 509 includes a coarse offset estimator 510, an offset corrector 512, a time domain-to-frequency domain (TD-to-FD) transformer 514, a fine offset estimator 515, and a frequency domain-to-time domain (FD-to-TD) transformer 517, in an embodiment. Coarse offset estimator 510 includes computational apparatus designed to determine a plurality of channel perturbations, including coarse timing offset (TO) estimates 542 and coarse carrier frequency offset (CFO) estimates 544.

In an embodiment, coarse offset estimator 510 is designed to determine a coarse timing offset estimate 542, $\hat{n}_0$, according to the equation:

$$\hat{n}_0 = \underset{u}{\operatorname{argmax}} \left| r^{(\hat{d})}[u] \right|. \qquad \text{(Equation 13)}$$

Accordingly, the coarse timing offset estimate 542 is determined based on the maximum of the $\hat{\hat{d}}$ th conjugate correlation output. Assuming that $\hat{\hat{d}}=\tilde{d}$, the coarse timing offset estimate should be determined (or "detected") correctly as long as $|r^{(\tilde{d})}[n_0]| > r^{(\tilde{d})}[n]$ for $n \neq n_0$.

In an embodiment, coarse offset estimator 510 also is designed to determine a coarse estimate of the carrier frequency offset (CFO) 544, $\hat{\epsilon}$, according to the equation:

$$\hat{\epsilon} = \operatorname{angle}(r^{(\hat{\hat{d}})}[\hat{n}_0]) \qquad \text{(Equation 14)}$$

Essentially, the coarse CFO estimate is determined as the phase of the conjugate correlation output 536 that was determined by peak detector 508 to have the highest correlation peak.

In an embodiment, the coarse offset and estimator 510 provides the estimated channel perturbations (e.g., coarse timing offset estimates 542 and coarse CFO estimates 544) to offset corrector 512. Offset corrector 512 includes computational apparatus designed to receive the received signal 534 and the estimated channel perturbations, and to effectively compensate for those estimated channel perturbations in the received signal 534 by aligning the received signal 534 on a symbol boundary using the coarse timing offset estimate 542 and the coarse CFO estimate 544, which may include removing the cyclic extension from the received signal 534. In an embodiment, offset corrector 512 produces a coarsely-corrected signal 550.

Once the coarse timing and carrier frequency offsets are removed, the coarsely-corrected signal 550 may be transformed to the frequency domain by time domain-to-frequency domain (TD-to-FD) transformer 514, which includes computational apparatus designed to perform a time domain-to-frequency domain transformation on the corrected signal 550, in order to produce a frequency-domain, coarsely-corrected signal 553 ((that represents an estimated transmit data signal plus SPS signal)). The time domain-to-frequency domain transformation may include a Fourier transform (FT) or, more particularly, a fast Fourier transform (FFT), in various embodiments, although other types of time domain-to-frequency domain transformations may be performed in other embodiments.

In an embodiment, fine offset estimation may then be performed using fine offset estimator 515. In an embodiment, fine offset estimator 515 determines a fine CFO estimate, which is applied to the coarsely-corrected signal 550 by offset corrector 512. In an embodiment, fine offset estimator 515 determines a fine CFO estimate, $\hat{\epsilon}$, using the pilot signals (e.g., pilot signals 420, FIG. 4) within the frequency-domain, coarsely-corrected signal 553. In an embodiment, this includes estimating the phase of each pilot signal (e.g., pilot signals 420), and determining the phase change in any particular pilot signal from symbol to symbol. Thus, the fine CFO estimate may be determined using the common sub-carrier phase difference between symbols, which may then be averaged across all pilot sub-carriers to minimize estimation variance.

The frequency domain pilot part of the received signal for two consecutive sets of pilot symbols may be approximated as $Y_{k1}^P = X_{k1}^P H_{k1}^P e^{-j2\pi \epsilon'_1/N}$ and $Y_{k2}^P = X_{k2}^P H_{k2}^P e^{-j2\pi \epsilon'_2/N}$, respectively. The phases $\phi_{k_1}$ and $\phi_{k_2}$ may be computed as $\angle Y_{k1}^P$ and $\angle Y_{k2}^P$ (where $\angle$ represents the angle), respectively. Then, the fine CFO estimate, may be determined according to the equation:

$$CFO = \frac{1}{2\pi T_s} \sum_{k=0}^{|K_{pi}-1|} (\phi_{k1} - \phi_{k2}). \qquad \text{(Equation 15)}$$

Fine offset estimator 515 may provide the fine CFO estimate to offset corrector 512 via a feedback path (not illustrated). In addition, fine offset estimator 515 provides a feedback version 545 of the frequency-domain, coarsely-corrected signal to offset corrector 512 via frequency domain-to-time domain (FD-to-TD) transformer 517, which transforms the feedback version 545 of the coarsely-corrected signal into the time domain to produce a time-domain, fed back, coarsely-corrected signal 547. In an alternate embodiment, the coarsely-corrected signal 550 is retained in memory, and is not fed back to offset corrector 512. Either way, offset corrector 512 applies the fine CFO estimate to the coarsely-corrected signal (either signal 550 or 547) to re-produce the finely-corrected signal 551. In an alternate embodiment, fine CFO correction may be performed in the frequency domain after fine offset estimator 515, rather than performing the fine CFO correction in the time domain by offset corrector 512.

In a further embodiment, fine offset estimator 515 also may determine a fine timing offset estimate and/or a carrier phase offset estimate. For example, fine offset estimator 515 may determine a fine timing offset estimate based on the phase slope between pilot sub-carriers common to each OFDM symbol, which also can be averaged over all symbols. Fine offset estimator 515 may determine a carrier phase offset estimate from the mean value of the phase slope in each OFDM symbol, in an embodiment.

When a fine timing and/or carrier phase offset are estimated, fine offset estimator 515 provides the fine timing and/or carrier phase offsets to channel estimator/equalizer/corrector 516, in an embodiment, for correction of the fine timing and/or carrier phase offset in the frequency domain. In an alternate embodiment, fine offset estimator 515 may provide the fine timing and/or carrier phase offsets, if estimated, to offset corrector 512 for correction in the time domain.

Either way, the finely-corrected signal 551 is transformed to the frequency domain by TD-to-FD transformer 514, and the resulting corrected signal 552 is provided to channel estimator/equalizer/corrector 516. The corrected signal 552 is a sync-corrected frequency domain SPS received signal $(Z_{SPS}^{(q)\cdot g(\cdot)})$. Channel estimator/equalizer/corrector 516 receives the corrected signal 552, determines a channel estimate, and based on the channel estimate, proceeds to equalize the channel effects in the corrected signal 552 to produce an equalized combined signal 554. Channel estimator/equalizer/corrector 516 is designed to determine a channel estimate $(\hat{H}_k)$ based on the corrected signal 552, where $\hat{H}$ is a channel model transfer function for subcarrier k. In an embodiment, the channel estimate $(\hat{H}_k)$ is determined by generating a first quantity according to the Equation 16. After transforming the received signal back to the frequency domain, the receiver obtains:

$$W_k^{(d)} = \operatorname{IDFT}\{z^{(d)}[n+\tilde{n}_0]\} e^{j2\pi \hat{\epsilon}/N}, \qquad \text{(Equation 16)}$$

which yields $W_k^{(d)} = Y_k^{(d)} H_k + \eta_k + \delta_k + t_k$, where $\delta_k$ is the distortion noise caused by the power amplifier (e.g., power amplifier 362, FIG. 3), $t_k$ is the inter-carrier interference, and $H_k$ and $\eta_k$ are the IDFTs of h[n] and η[n], respectively. The estimated transfer function of the channel ($\hat{H}_k$) can be obtained by $$\hat{H}_k = \frac{W_k^{(\hat{d})}}{S_k^{(\hat{d})}}, \quad \text{(Equation 17A)}$$

where k is a subcarrier contained within the set of pilot sub-carriers. As mentioned above, both AWGN and fading channels are considered. A linear interpolation can be performed to calculate $\hat{H}_k$ for the data sub-carriers as well. The estimate of the frequency-domain transmitted data ($\hat{X}_k$) is then obtained as:

$$\hat{X}_k = \frac{e^{-j\hat{\theta}_k^{(\hat{d})}}}{\sqrt{1-\rho}} \left( \frac{W_k^{(\hat{d})}}{\hat{H}_k} - \sqrt{\rho}\, s_k^{(\hat{d})} \right), \quad \text{(Equation 17B)}$$

where k is contained within the set of data sub-carriers. From $W_k^{(\hat{d})}$, channel estimator/equalizer/corrector 516 may estimate the channel in the pilot subcarriers (e.g., pilot subcarriers 414, FIG. 4) according to the equation:

$$\hat{H}_k = \frac{W_k^{(\hat{d})}}{S_k^{(\hat{d})}\sqrt{\rho}}, \quad k \in K_p. \quad \text{(Equation 17C)}$$

In an embodiment, channel estimator/equalizer/corrector 516 may interpolate the pilot subcarrier channel estimates to the data-bearing subcarriers (e.g., data-bearing subcarriers 412, FIG. 4), $k \in K_d$ so that $\hat{H}_k$ is defined for $k \in K_d \cup K_p$.

In an alternate embodiment, assumptions may be made that all of the synchronization works perfectly (e.g., $\hat{\tilde{d}}=\tilde{d}$, $\hat{n}_0=n_0$, and $\hat{\epsilon}=\epsilon$) and that no distortion noise is introduced by the transmitter power amplifier (e.g., power amplifier 362, FIG. 3). With those assumptions, the first quantity represented in Equation 16, above, may be simplified to:

$$W_k^{(\hat{d})} = Y_k^{(\hat{d})} H_k + \eta_k, \quad \text{(Equation 18)}$$

where $\eta_k \approx CN(0,\sigma_\eta^2)$. Using these assumptions and the first order approximation that $E[|\eta_k|^2|\hat{X}_k|^2 H_k] \approx \sigma^2$ for $k \in K_d$, the symbol estimate MSE may be determined according to the equation:

$$E[|\hat{X}_k - X_k|^2 | H_k] \approx \frac{\sigma^2}{|H_k|^2} \cdot \left( \frac{\frac{(1-\beta)|K_p|}{\beta(1-\rho)|K_d|} +}{\frac{|K_p|}{\beta\rho|K_d|} + \frac{1}{1-\rho}} \right). \quad \text{(Equation 19)}$$

As Equation 19 indicates, the MSE is dependent on the ratio of pilot to data subcarriers $|K_p|/|K_d|$. Also, the minimizing the pilot subcarrier power is achieved by setting β=1 when perfect synchronization is assumed. However, in an embodiment, β is selected such that β<1, in order to achieve desired synchronization performance.

Channel estimator/equalizer/corrector 516 may then generate an equalized combined signal 554 by equalizing the channel effects based on the channel estimate. After the various offset and channel corrections, the equalized combined signal 554 may be represented as:

$$z^{(\hat{d})}[n] = ((f_{PA}(y^{(\hat{d})}[n-n_0])*h[\tau])e^{-j2\pi\hat{\epsilon}/N} + \eta[n])e^{j2\pi\hat{\epsilon}/N}. \quad \text{(Equation 20)}$$

SPS removal element 518 removes SPS that is superimposed on the equalized combined signal 554 before data demodulation. SPS removal element 518 includes computational apparatus designed to receive the equalized combined signal 554, and to remove the scaled SPS 562 corresponding to the SLM index estimate 540 from the equalized combined signal 554 (e.g., to combine $-\sqrt{\rho s_k^{(\hat{d})}}$ with the equalized combined signal 554) in order to produce an estimated, phase shifted data signal 564. In an embodiment, the scaled SPS 562 may be obtained by retrieving the SPS $s_k^{(\hat{d})}$ corresponding to the SLM index estimate 540 from a table of SPS, which is accessible to or stored in receiver 500, and by applying the scaling factor $\sqrt{\rho}$ to the retrieved SPS. The SPS table includes one or more pre-generated sets of SPS, where each SPS in a set may be referenced by an SLM index. Each SPS in the receiver's SPS table is represented in the frequency domain, in an embodiment. In an embodiment, each SPS includes synchronization information and pilots, and those pilots may have variable pilot signal parameters (e.g., variable pilot spacing and/or pilot power). In an alternate embodiment, the synchronization information and pilots may be separately represented.

Scaling element 520 is designed to apply a scaling factor to the estimated, phase shifted data signal 564, in order to produce a scaled, phase shifted data signal 566, which has a peak amplitude approximately equal to that of the original input data, X[n]. Inverse selective mapping is performed by a phase shift element 522 that includes computational apparatus designed to phase shift the scaled, phase shifted data signal 566 by a phase shift value 568 corresponding to the SLM index estimate 540 (e.g., to shift the scaled, phase shifted data signal 566 by $e^{-j\phi^{(\hat{d})}}$). The remaining signal 570 is a frequency domain representation of the received signal.

The demodulator 524 demodulates the remaining signal 570 to produce the demodulated output signal 580 that comprises the output data symbols ($\hat{X}_k[n]$) 580 that represent frequency domain estimates of the input data symbols. When the SLM index estimate 540 represents a correctly-detected SLM index (e.g., an SLM index corresponding to the selected signal 351, FIG. 3, identified at the transmitter 300), then blind phase sequence detection has been robustly performed by receiver 500, and the output data symbols 580 reflect estimates of the input data symbols (e.g., input data symbols 320, FIG. 3). When the receiver 500 receives the data symbols of the transmitted signal they are still imperfect and distorted. Simply put, upon receiving the transmitted signal at the receiver, it is inevitable that some distortion products will remain. As such, it is desirable to provide receiver side mitigation techniques that can be used to estimate and cancel any remaining transmitter PA induced NLD present in the received signal.

Transmitter Power Amplifier Induced Non-Linear Distortion (NLD) Cancellation

As will now be described, receiver side mitigation techniques are provided for estimating and substantially cancelling any remaining transmitter PA induced NLD present in the received signal to significantly reduce PA induced distortion in the received signal. This PA distortion estimation and cancellation technique begins with demodulated data that serves as initial estimates of the transmit data. Once the received signal is demodulated and estimates of the transmit data are produced, these estimates are re-modulated, digitally filtered with a model of the transmit filtering, and amplified by a model of the transmit PA.

In accordance with one implementation, a non-linear power amplifier distortion estimation and cancellation (PA-DEC) module is provided that includes a re-modulator 582, a digital filtering module 584, a power amplifier model 586, and a power amplifier distortion (PAD) estimator 588 and a subtraction module 595.

The re-modulator 582 receives demodulated output signal 580 (that comprises the output data symbols 580 ($\hat{X}_k[n]$) each of which is an estimate of the undistorted transmit data symbol ($X_k[n]$) 118), and re-modulates it to produce a re-modulated signal 583 that comprises re-modulated data symbols that are much closer estimates of the undistorted transmit data symbols ($X_k[n]$) 118. In essence, the re-modulator 582 is basically a copy of the transmitter's 300 modulator blocks (without the requirement for D sequences for PAR reduction, since the receiver 500 has already determined this). The digital filtering module 584 receives the re-modulated signal 583 and filters it to produce a filtered re-modulated signal 585 comprising filtered, re-modulated data symbols.

The power amplifier model 586 is a model of the transmit power amplifier 362 of FIG. 3. FIG. 4B is a graph that illustrates a piece-wise linear model of a response curve of the PA model 586 in terms of input power ($P_{IN}$) (dBm) versus measured output power ($P_{OUT}$) (dBm) superposed with a the measured PA response curve of FIG. 4A. The piece-wise linear model of the response curve of the model 586 tracks the measured PA response curve of the actual transmit PA 362. The filtered, re-modulated signal 585 is amplified by the power amplifier model 586 to produce an amplified signal 587 comprising amplified data symbols that represent estimates of the RF transmitted data, but in baseband form.

A PA distortion (PAD) estimator module 588 is then used to combat remaining PA distortion. The PAD estimator 588 processes the amplified signal 587 to produce an estimate of the power amplifier distortion (PAD)

$$(D^{(X^{(q)},g)})$$

590 in the frequency domain. The PAD estimator module 588 uses accurate models of the system, including the known distortion to iteratively compute an estimated value of PAD. In the PAD estimator module 588, estimated symbols are passed through a channel model, and passed through a receive-side filtering module to produce an estimate of the distortion caused by the PA, or "estimated power amplifier distortion (PAD)." The processing performed by the PAD estimator module 588 to estimate the PAD 590 will be described below with reference to FIGS. 6A and 6B.

The subtraction module 595 subtracts the PAD 590 from the corrected signal 552 (that was generated by 514) to generate a frequency-domain, coarsely-corrected signal ($Z'_k$) 553 that is an estimate of transmit data ($\hat{X}_k$) signal, which is equal to the corrected signal 552 minus estimated PAD 290 and reflects an improved estimate of the corrected signal 552. In other words, the frequency-domain, coarsely-corrected signal ($Z'_k$) 553 represents an estimated transmit data signal plus SPS signal.

On the first iteration, nothing is subtracted because there is no PAD 590 estimate yet.

On second and successive iterations, the updated PAD 590 is estimated and subtracted from the sync-corrected frequency domain SPS received signal ($Z_{SPS}^{(q),g(\cdot)}$) 552 (or simply "corrected signal 552"). Each iteration completes by subtracting this updated estimated PAD 590 from the corrected signal 552 to produced a more accurate estimate of the transmit data. A number of iterations are performed until the received signal converges. The processing described above to compute the PAD 590 and frequency-domain, coarsely-corrected signal ($Z'_k$) 553 (that represents an estimated transmit data signal plus SPS signal) is performed iteratively until convergence (i.e., no more improvement is found).

At this point, most of the remaining transmitter PA induced NLD present in the received signal is cancelled. In particular, estimates of the transmitted bits are provided to a PA distortion (PAD) estimator module 588, which iteratively computes an estimated value of the actual PA 362 induced distortion 590.

After subtraction of the SPS, the processing continues for a number of iterations ($q_{max}$). The estimate of the transmit data ($\hat{X}^{(q)}$) improves with each successive iteration (i.e., more PA induced distortion is eliminated). After a number of iterations ($q_{max}$), the estimated value of the PAD 590 converges and approaches the actual PA 362 induced distortion, and can then be used remove or cancel the actual PA induced distortion.

The converged estimate is a significant improvement over the original estimate, and can be used to cancel the actual PA 362 induced distortion. Using these techniques the receiver 500 can adequately estimate the actual PA 362 induced distortion when the PA 362 is operating at low IBO levels (e.g., when the PA 362 is operating at 0-3 dB IBO). Although not illustrated in FIG. 5, after the signal converges, the symbols get demodulated to information bits that represent the transmit information sent from the transmitter.

Figure 6A:
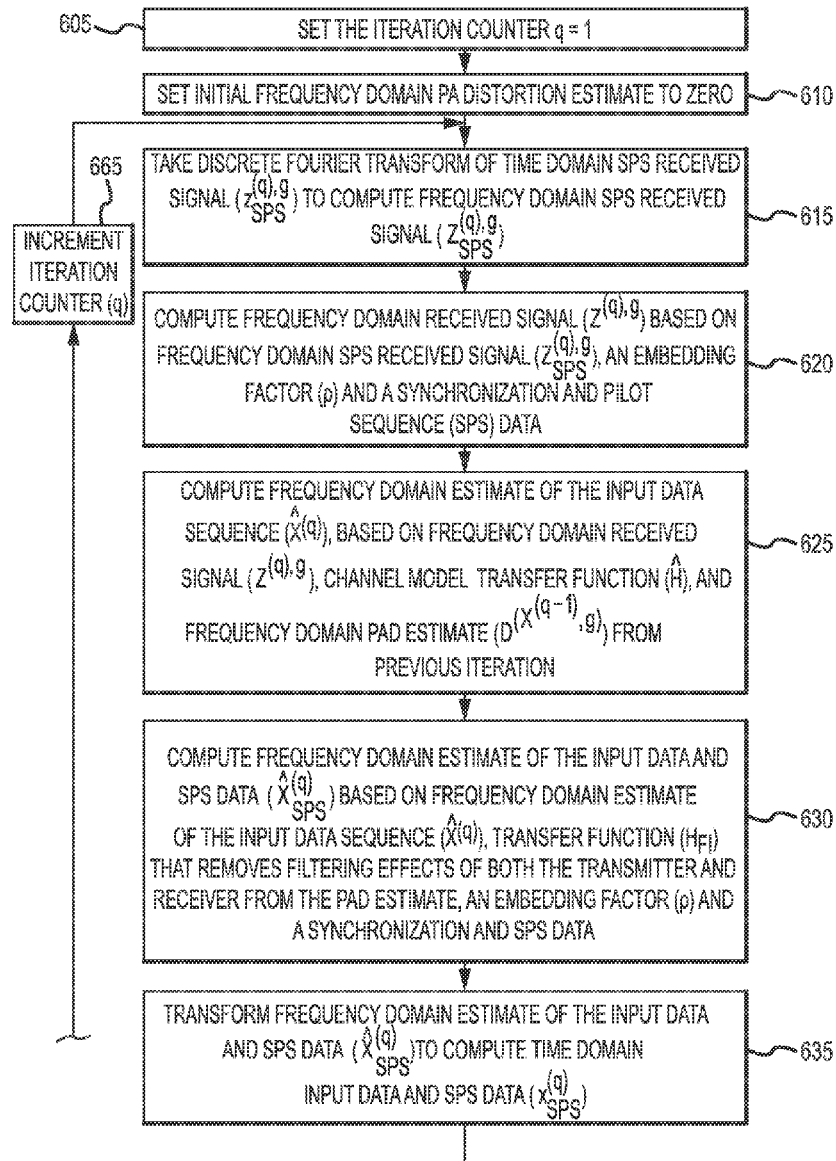
FIGS. 6A and 6B are a flowchart illustrates a method of estimating power amplifier distortion (PAD) in accordance with some of the disclosed embodiments.
Figure 6B:
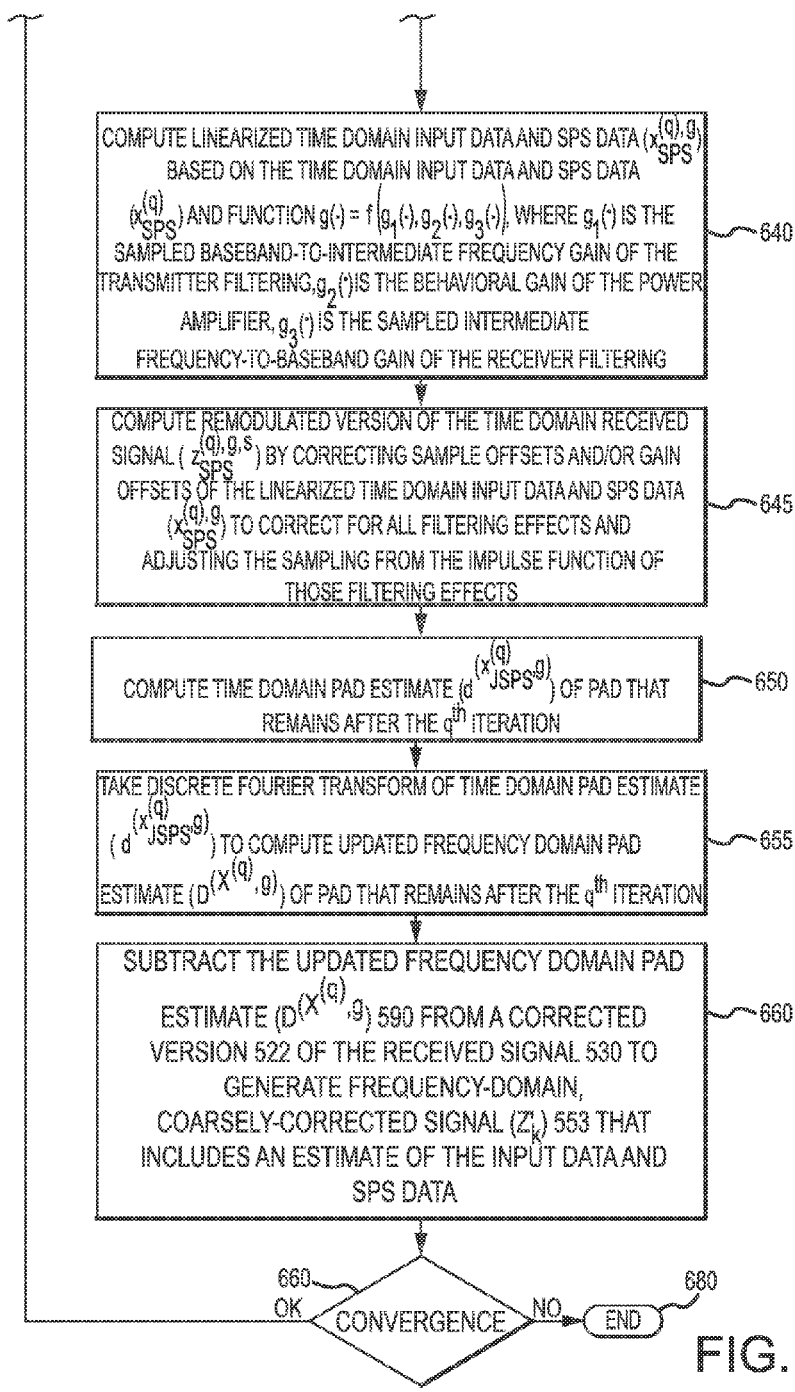

FIGS. 6A and 6B are a flowchart illustrates a method 600 of estimating power amplifier distortion (PAD) in accordance with some of the disclosed embodiments. Prior to describing FIGS. 6A and 6B, it is to be noted that in the description that follows, variables in the equations that are in capitalized letters represent frequency domain signals, whereas variables that are in lower case letters represent corresponding time domain signals. In addition, a function g(·) appears in many of the expressions, and the where the function g(·) can be represented as shown in equation 21 as follows:

$$g(\cdot)=f(g_1(\cdot),g_2(\cdot),g_3(\cdot)) \quad \text{(Equation 21)},$$

and where $g_1(\cdot)$ is the sampled baseband-to-intermediate frequency gain of the transmitter filtering, $g_2(\cdot)$ is the behavioral gain of the power amplifier, $g_3(\cdot)$ is the sampled intermediate frequency-to-baseband gain of the receiver filtering.

The method 600 begins at step 605, where an iteration counter (q) is set at one on the first iteration of method. In the following description, an estimate of PAD on a qth iteration (in the frequency domain) is represented in equation 22 as:

$$D^{(X_{SPS}^{(q)},g(\cdot))} \quad \text{(Equation 22)}$$

It is noted that in the description of FIGS. 6A and 6B that follows, the term "g" refers to the function g(·) that is described above. At step 610, an initial estimate of PAD (in the frequency domain) is set to zero (0). This step can be represented as shown in equation 23 as follows:

$$D^{(X_{SPS}^{(0)},g(\cdot))}=0 \quad \text{(Equation 23)}$$

Method 600 then proceeds to step 615, where a sync-corrected frequency domain SPS received signal ($Z_{SPS}^{(q),g(\cdot)}$) 552 (with synchronization offsets removed) is computed by taking a Discrete Fourier Transform (DFT) of the time domain SPS received signal ($z_{SPS}^{(q),g(\cdot)}$) 551. This step can be represented, in one implementation, by equation 24 as follows:

$$Z_{SPS}^{(q),g(\cdot)} = DFT(z_{SPS}^{(q),g(\cdot)}) \qquad \text{(Equation 24)}$$

It is noted that while step 615 describes use of a DFT to perform the time domain-to-frequency domain transformation, other types of time domain-to-frequency domain transformations techniques (e.g., a Fourier transform) can be used to transform from the time domain to the frequency domain in other embodiments.

Method 600 then proceeds to step 620, where a remaining frequency domain received signal ($Z^{(q),g(\cdot)}$) 570 is computed based on the sync-corrected frequency domain SPS received signal ($Z_{SPS}^{(q),g(\cdot)}$) 552 by removing the SPS data and scaling it. This step can be represented, in one implementation, by equation 25 as follows:

$$Z^{(q),g(\cdot)} = (Z_{SPS}^{(q),g(\cdot)} - \sqrt{\rho}S\hat{H})/\sqrt{1-\rho} \qquad \text{(Equation 25)}$$

where $\hat{H}$ is a channel estimate, ($\sqrt{\rho}S$) is a scaled SPS where $\sqrt{\rho}$ is a scaling factor 330 with an embedding factor ($\rho$), S is SPS data, and $\sqrt{1-\rho}$ is a scaling factor 322, as described above. The embedding factor, $\rho$, dictates how much relative signal power is allocated to the data component, $X_k$, of the transmit signal as opposed to the SPS component, $S_k$, of the transmit signal.

Method 600 then proceeds to step 625, where a demodulated output signal ($\hat{X}^{(q)}$) 580 (that comprises frequency domain estimates of the input data) is computed based on frequency domain received signal ($Z^{(q),g(\cdot)}$), channel model transfer function ($\hat{H}$), and frequency domain PAD estimate $$\left( D^{(\hat{x}^{(q-1)},g(\cdot))} \right)$$

from previous iteration. (Note: Here, $\hat{H}$ is the channel model transfer function, where $\hat{H}_k$ is a channel estimate at subcarrier k) This step can be represented, in one implementation, by equation 26 as follows:

$$\hat{X}^{(q)} = \left\{ \frac{Z^{(q),g(\cdot)}}{\hat{H}} - D^{(\hat{x}^{(q-1)},g(\cdot))} \right\} \qquad \text{(Equation 26)}$$

The term $$D^{(\hat{x}^{(q-1)},g(\cdot))}$$

represents a PAD estimate from the previous iteration (q−1), and is presumed to be zero on the first iteration of method 600.

Method 600 then proceeds to step 630, where the frequency domain estimate of the input data ($\hat{X}^{(q)}$) is remodulated in accordance with various modulation steps that took place at the transmitter (as described above) to generate a frequency domain estimate of the input data and SPS data ($\hat{X}_{SPS}^{(q)}$). The frequency domain estimate of the input data is remodulated in accordance with various modulation steps that took place at the transmitter by performing the same modulated steps performed at the transmitter except for SLM PAR reduction since the PAD estimate is already known. In essence, this is like having a copy of transmitter at the receiver to try to reproduce the various modulation steps performed at the transmitter. This step can be represented, in one implementation, by equation 27 as follows:

$$X_{SPS}^{(q)} = \left[ \sqrt{1-\rho}\, e^{j\phi^d SLM} X^{(q)} + \sqrt{\rho}\, S \right] H_{FI}, \qquad \text{(Equation 27)}$$

To mimic modulation at the transmitter, the frequency domain estimate of the input data ($\hat{X}^{(q)}$) is multiplied by the scaling factor ($\sqrt{1-\rho}$) 322, and rotated by the function $e^{j\phi^d}$ SLM to add SLM information to the frequency domain estimate of the input data symbol ($\hat{X}^{(q)}$), where d and associated $\phi^{(d)}$ represent one of D sequences and phase rotations designed to reduce the overall PAR. The SPS data (S) is also added to the frequency domain estimate of the input data symbol ($\hat{X}^{(q)}$). The scaled SPS data is represented by the symbol $\sqrt{\rho}S$, where $\sqrt{\rho}$ is a scaling factor 330 with an embedding factor ($\rho$), and S is SPS data. These factors are described above.

The inverse of the transmitter and receiver filtering effects are also applied to the frequency domain estimate of the input data ($\hat{X}^{(q)}$) so that the frequency domain input data and SPS data ($X_{SPS}^{(q)}$) is modified to take into account those filtering effects. The transfer function ($H_{FI}$) that removes filtering effects of both the transmitter and receiver from the PAD estimate. To explain further, if the transfer function ($H_F$) is a matrix that represents cascaded filtering effects of the transmitter and receiver filtering in complex form, then the transfer function ($H_{FI}$) is a matrix used to equalize and remove the effects of transfer function ($H_F$) from the frequency domain estimate of the input data ($\hat{X}^{(q)}$). Stated differently, transfer function ($H_{FI}$) represents the equalizer gains of the transmitter and receiver filtering (i.e., the product of matrices $H_{FI}H_F$ is equal to an identity matrix (I)).

Method 600 then proceeds to step 635, where a time domain representation of the input data and SPS data ($x_{SPS}^{(q)}$) is computed is by taking an Inverse Discrete Fourier Transform (IDFT) of frequency domain representation of the input data and SPS data ($X^{(q)}$). This step can be represented, in one implementation, by equation 28 as follows:

$$x_{SPS}^{(q)} = IDFT(X_{SPS}^{(q)}). \qquad \text{(Equation 28)}$$

It is noted that while step 635 describes use of an IDFT to perform the frequency domain-to-time domain transformation, other types of frequency domain-to-time domain transformation techniques (e.g., an inverse Fourier transform) can be used to transform from the frequency domain to the time domain in other embodiments. The time domain representation of the input data and SPS data ($x_{SPS}^{(q)}$) represents a best estimate of the input data that was provided to the soft clipper 352. The gain effects of the soft clipper 352, digital predistortion module 354, transmitter digital filtering 356, and upconverter 360 are then taken into account by the sampled baseband-to-intermediate frequency gain $g_1(\cdot)$ and the effects of the power amplifier 362 are then taken into account by the behavioral gain of the power amplifier $g_2(\cdot)$. Likewise, the effects of the downconverter and digital receive filtering 504 are taken into account by the sampled intermediate frequency-to-baseband gain $g_3(\cdot)$.

Method 600 then proceeds to step 640, where a linearized time domain representation of the input data and SPS data ($x_{SPS}^{(q),g(\cdot)}$) is computed based on the time domain representation of the input data and SPS data ($x_{SPS}^{(q)}$) and the function $g(\cdot)=f(g_1(\cdot),g_2(\cdot),g_3(\cdot))$. This step can be represented, in one implementation, by equation 29 as follows:

$$x_{SPS}^{(q),g(\cdot)}=g(x_{SPS}^{(q)}) \qquad \text{(Equation 29)}$$

where the function $g(\cdot)$ can be represented as described above. Because the effects of the filtering functions are included in the linearized time domain representation of the input data and SPS data ($x_{SPS}^{(q),g(\cdot)}$) (and in signals at various other steps), this adds an impulse response to the linearized time domain representation of the input data and SPS data ($x_{SPS}^{(q),g(\cdot)}$). This impulse response changes delay and complex gain of the linearized time domain representation of the input data and SPS data ($x_{SPS}^{(q),g(\cdot)}$). As will now be described, when the linearized time domain representation of the input data and SPS data ($x_{SPS}^{(q),g(\cdot)}$) is remodulated at step 645, the changes in delay and complex gain of the linearized time domain representation of the input data and SPS data ($x_{SPS}^{(q),g(\cdot)}$) have to be accounted for so that the time domain PAD estimate $$\left(d^{(x_{SPS}^{(q)},g(\cdot))}\right)$$

(computed at step 650 below) is more accurate. The changes in delay and complex gain can be considered by either (1) including an estimate of changes in delay and complex gain, or (2) resynchronizing the remodulated received signal ($z_{SPS}^{(q),g(\cdot),s}$) before estimating the PA distortion at step 650. The remodulated received signal ($z_{SPS}^{(q),g(\cdot),s}$) is a remodulated version input data and SPS-data in the received signal in the time domain. In the embodiment that will now be described, the latter approach is taken. However, if the PAD estimate is off significantly, synchronization of the remodulated received signal ($z_{SPS}^{(q),g(\cdot),s}$) may be off and may affect how the delay and complex gain can be corrected, in which case resynchronization is required on the remodulated received signal ($z_{SPS}^{(q),g(\cdot),s}$) to make sure the signal properly in time and frequency.

Method 600 then proceeds to step 645, where a remodulated version of the time domain representation of the input data and SPS data received signal ($z_{SPS}^{(q),g(\cdot),s}$) is computed based on the linearized time domain representation of the input data and SPS data ($x_{SPS}^{(q),g(\cdot)}$). During remodulation at the receiver (prior to distortion estimation and cancellation), the multipath, TO, CFO, SFO and noise components 202-208 are corrected. Thus, the sample offsets and/or gain offsets (induced due to convolution of the impulse function response of each of the filtering effects ($g_1(\cdot), g_2(\cdot), g_3(\cdot)$)) are corrected. The sampling frequency offset 207 is corrected as a form of timing offset with a fine timing shift that can drift like CFO. This step can be represented, in one implementation, by equation 30 as follows:

$$z_{SPS}^{(q),g(\cdot),s}=f_s(z_{SPS}^{(q),g(\cdot)}) \qquad \text{(Equation 30)}.$$

The function $f_s(\cdot)$ is used to correct the sampling offset induced by convolution with the cascaded impulse responses of $g_1(\cdot) g_2(\cdot), g_3(\cdot)$. The linearized time domain representation of the input data and SPS data ($x_{SPS}^{(q),g(\cdot)}$) is passed through function $f_s$, to correct the sample offsets and/or gain offsets (induced due to convolution of the impulse function response of each of the filtering effects ($g_1(\cdot), g_2(\cdot), g_3(\cdot)$)). The small s represents that the remodulated version of the time domain representation of the input data and SPS data received signal ($z_{SPS}^{(q),g(\cdot),s}$) is a sample and/or gain corrected signal. At this point, the filtered re-modulated signal 585, which includes remodulated versions of the time domain representation of the input data and SPS data received signal ($z_{SPS}^{(q),g(\cdot),s}$), is substantially linear such that there is no gain variation over signal bandwidth.

Method 600 then proceeds to step 650, where a time domain PAD estimate $$\left(d^{(x_{SPS}^{(q)},g(\cdot))}\right)$$

is computed at baseband or intermediate frequency (IF). In one implementation, the PAD estimate is computed by subtracting the time domain representation of the input data and SPS data received signal ($z_{SPS}^{(q),g(\cdot)}$) from the remodulated version of the time domain representation of the input data and SPS data received signal ($z_{SPS}^{(q),g(\cdot),s}$) to account for synchronization. The time domain PAD estimate $$\left(d^{(x_{SPS}^{(q)},g(\cdot))}\right)$$

represents the PAD that remains after the $q^{th}$ iteration. This step can be represented, in one implementation, by equation 31 as follows:

$$d^{(x_{SPS}^{(q)},g(\cdot))} = z_{SPS}^{(q),g(\cdot),s} - z_{SPS}^{(q),g(\cdot)}. \qquad \text{(Equation 31)}$$

It is noted that FIG. 5 does not illustrate the time domain PAD estimate $$\left(d^{(x_{SPS}^{(q)},g(\cdot))}\right),$$

and that if it is desired to compute the PAD estimated 590 in the time domain, then the subtraction module 595 would be placed before the TD-to-FD block 514.

At step 655, where an updated frequency domain PAD estimate $$\left(D^{(x^{(q)},g(\cdot))}\right)$$

590 is computed by taking the Discrete Fourier Transform (DFT) of time domain PAD estimate $$\left(d^{(x_{SPS}^{(q)},g(\cdot))}\right).$$

The updated frequency domain PAD estimate $$\left(D^{(x^{(q)},g(\cdot))}\right)$$

590 represents the PAD that remains after the $q^{th}$ iteration. This step can be represented, in one implementation, by equation 32 as follows:

$$D^{(X^{(q)}, g(\cdot))} = DFT\big(d^{(x_{SPS}^{(q)}, g(\cdot))}\big).$$ (Equation 32)

At step 660, the updated frequency domain PAD estimate $$\big(D^{(X^{(q)}, g)}\big)$$

590 is subtracted from a corrected version 552 of the received signal 530 to generate frequency-domain, coarsely-corrected signal $(Z'_k)$ 553 that includes an estimate of the input data from the transmit data signal plus SPS signal. In other words, the frequency-domain, coarsely-corrected signal $(Z'_k)$ 553 represents an estimated transmit data signal plus SPS signal.

Method 600 then proceeds to step 670, where a convergence check is performed to determine whether the PAD estimate has converged. If the PAD estimate has not converged, the method 600 then returns to step 615, where the processing in steps 615-660 repeats. The method 600 continues to iterate and produce a more refined frequency domain PAD estimate until it is determined that the PAD estimate converges at step 670. If it is determined (at step 670) that the PAD estimate has converged, then the method 600 ends at step 680. Step 670 can be implemented in a number of different ways.

For instance, in one implementation of step 670 convergence is determined if the current iteration number (q) is equal to a maximum iteration number ($q_{max}$). In most implementations, a number of iterations ($q_{max}$) can be determined after which the PAD estimate will not converge further by an appreciable amount over the previous PAD estimate. In such implementations, if the current iteration number (q) is less than the maximum iteration number ($q_{max}$), then the method 600 proceeds to step 665, where an iteration counter is incremented by one. The method 600 then returns to step 615, where the processing in steps 615-660 repeats. The method 600 continues to iterate and produce a more refined frequency domain PAD estimate until the current iteration number (q) is determined to be equal to the maximum iteration number ($q_{max}$) at step 660. If the current iteration number (q) is equal to the maximum iteration number ($q_{max}$), then the method 600 ends at step 680.

In another implementation, the convergence check to determine whether the PAD estimate has converged at step 600 can be performed by comparing the difference between the current pad estimate and the previous PAD estimate to a threshold, and determining if the difference is smaller than the threshold. If so, it can be presumed that any further reduction in the PAD estimate would be an insignificant or negligible improvement over the previous PAD estimate, in which case the method 600 proceeds to step 680. If the difference is greater than or equal to the threshold it can be presumed further reduction in the PAD estimate can be achieved, in which case the method 600 proceeds to step 615 to recomputed a new PAD estimate.

Simulated Test Results

Simulations were performed in which 4-quadrature amplitude modulation (QAM) was used to map bits of a demodulated OFDM SPS waveform to constellation symbols applied to the OFDM data sub-carriers. In these simulations the OFDM SPS waveform implemented optimized placement and power (OPAP) pilots. It should be appreciated that the simulations use 4-QAM, OFDM SPS and OPAP pilots as examples only, and that the various embodiments are not limited to use of 4-QAM, OFDM SPS or OPAP pilots.

Figure 7A:
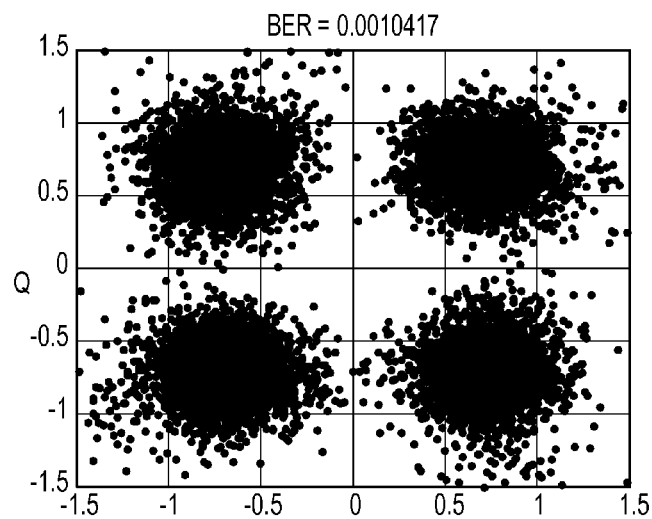
FIG. 7A is a constellation diagram of a demodulated OFDM SPS waveform with optimized placement and power (OPAP) pilots without applying PAD estimation and cancellation techniques during demodulation.

FIG. 7A is a constellation diagram of a demodulated OFDM SPS waveform with optimized placement and power (OPAP) pilots without applying PAD estimation and cancellation techniques during demodulation. The OFDM SPS waveform was amplified by a transmit PA operating at 0 dB IBO. The Peak Signal-to-Noise Ratio (PSNR) is 30 dB. The constellation diagram includes an in-phase (I) axis and a quadrature (Q) axis. In the constellation diagram each dot represents the amplitude and phase of a 4-quadrature amplitude modulation (QAM) symbol of the OFDM SPS waveform in the complex plane. Stated differently, each 4-QAM symbol is represented as a complex number as a constellation point (shown as a dot) on the complex I/Q plane. Ideally, each symbol would be located at one of four QAM points in each quadrant (i.e., those point that are located at (0.75, 0.75), (−0.75, 0.75), (−0.75, −0.75), and (0.75, −0.75)). However, here the constellation points are spread out in clouds or clusters around the four QAM points, which indicates that symbols of the demodulated OFDM SPS waveform have been significantly distorted.

Figure 7B:
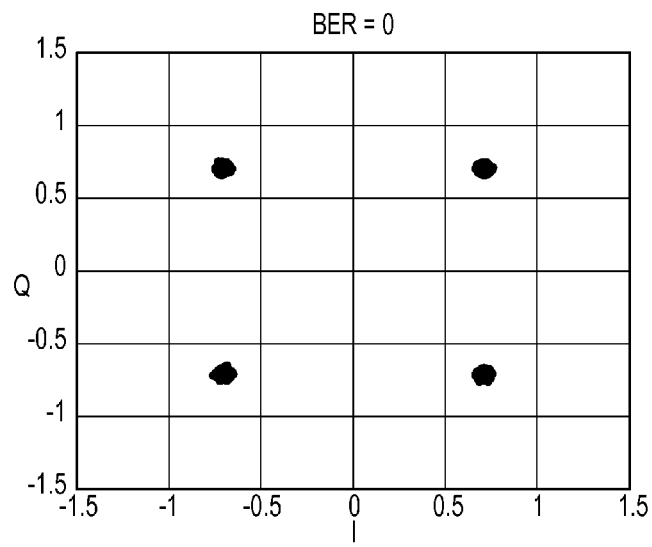
FIG. 7B is a constellation diagram of a demodulated OFDM SPS waveform with optimized placement and power (OPAP) pilots after applying PAD estimation and cancellation techniques during demodulation in accordance with the disclosed embodiments.

FIG. 7B is a constellation diagram of a demodulated OFDM SPS waveform with optimized placement and power (OPAP) pilots after applying PAD estimation and cancellation techniques during demodulation in accordance with the disclosed embodiments. The constellation diagram in FIG. 7B was generated at thirty (30) dB SNR with zero (0) dB input back off (IBO). In comparison to constellations in FIG. 7A, each symbol is located much closer to one of four QAM points. In other words, the degree to which the constellation points are grouped around the four QAM points is dramatically improved. This indicates that the demodulated OFDM SPS waveform is much less distorted after applying PAD estimation and cancellation techniques in accordance with the disclosed embodiments. Thus, even though the transmitter's PA 362 necessarily causes some NLD, the disclosed embodiments can be used to reduce error vector magnitude (EVM) significantly and ultimately reduce the bit error rate (BER).

Figure 12:
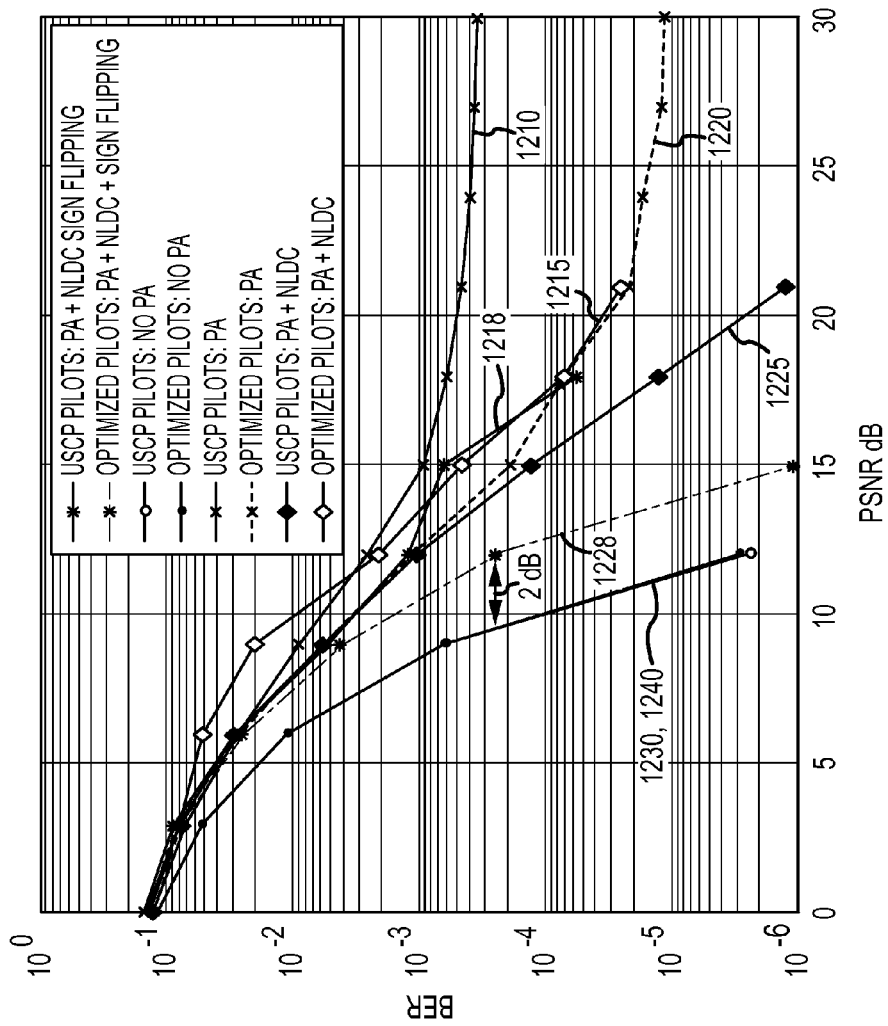
FIG. 12 is a chart with a series of curves plotting peak signal-to-noise ratio (PSNR) in dB versus bit error rate (BER) performance that may be achieved in a various OFDM systems including some in accordance with some of the disclosed embodiments.

As will be described below with reference to FIG. 12, a system operating in accordance with the disclosed embodiments, exhibits a BER curve that is within 2 dB of a BER curve for a system without a transmitter PA. In other words, the BER can be reduced to that which is very close to a BER curve obtained when no PA is used (i.e., when no PA distortion is induced by the transmitter). The disclosed embodiments allow for communication over an RF channel while operating a transmit PA at 0 dB IBO. These improvements provide nearly a 9-10 dB improvement over existing methods. The disclosed embodiments perform well when the transmitter PA is operated at 0 dB input backoff (IBO) or when the PA exhibits compression in the output power. Thus, BER-SNR performance is significantly improved despite PA non-linearity. This significant improvement in BER-SNR performance under PA non-linearity is accomplished, in part, via close reconstruction of the data path and subsequent iterative, transmitter PA induced distortion estimation and cancellation at the receiver. The disclosed embodiments can enable transmit power amplifiers to run more efficiently (i.e., operate at very high power efficiencies), can enable radios to transmit at a much longer link range, and can enable the receiver to demodulate more robustly in comparison to other radios.

Although these iterative distortion estimation and cancellation techniques can significantly reduce PA induced distortion, the PA induced distortion can not be reduced beyond some residual value due to bit errors that propagate as the number of iterations increases. During experimentation and simulations of the system described with reference to FIGS. 3-6, the inventors observed that the converged PAD estimate still contained errors as illustrated in FIG. 7C.

Figure 7C:
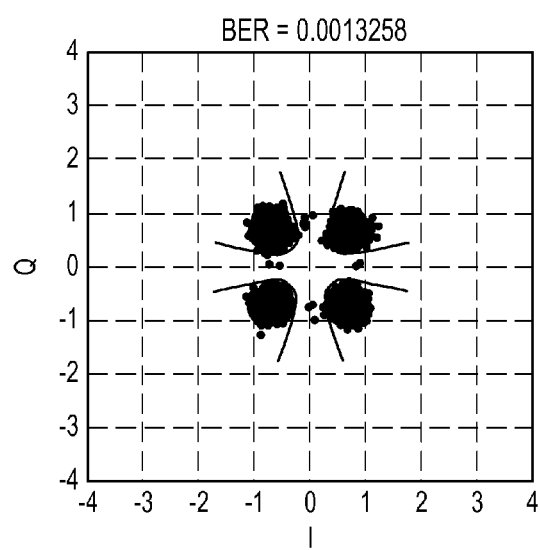
FIG. 7C is a constellation diagram of a demodulated OPAP OFDM signal after applying PAD estimation and cancellation techniques during demodulation in accordance with the disclosed embodiments.

FIG. 7C is a constellation diagram of a demodulated OPAP OFDM signal after applying PAD estimation and cancellation techniques during demodulation in accordance with the disclosed embodiments. FIG. 7C illustrates that at lower SNRs there is a structure to the demodulation errors caused by PA distortion. While most of the symbols have constellation points that are located close to one of four QAM points (i.e., "correct constellation points" that gather close to the originally transmitted 4-QAM positions), some of the constellation points are not closely grouped around one of the four QAM points (i.e., "incorrect constellation points" that are further away from the correct 4-QAM positions and in error). The incorrect constellation points lie closer to origin and outside the quadrant boundaries that are defined by the dotted parabolic lines. To reduce distortion further after applying PAD estimation and cancellation techniques, it would be desirable to provide a technique for relocating these incorrect constellation points so that the incorrect constellation points are more closely grouped with the correct constellation points or moved closer to one of the four QAM points. The inventors observed that iterative cancellation of the estimated distortion at the receiver imposes a distribution or structure among on the correct and incorrect constellation points. The distribution of incorrect constellation points have a particular statistical structure or distribution that places the incorrect constellation points apart from the expected constellation of correct points.

FIGS. 8A through 8D are histograms that show the distribution of correct constellation points and incorrect constellation points after applying PAD estimation and cancellation techniques during demodulation in accordance with the disclosed embodiments.

FIG. 8A is a histogram that shows the distribution of correct constellation points along the real axis or dimension of FIG. 7C after applying PAD estimation and cancellation techniques during demodulation in accordance with the disclosed embodiments. FIG. 8B is a histogram that shows the distribution of incorrect constellation points along the real axis or dimension of FIG. 7C after applying PAD estimation and cancellation techniques during demodulation in accordance with the disclosed embodiments. FIG. 8C is a histogram that shows the distribution of correct constellation points along the imaginary axis or dimension of FIG. 7C after applying PAD estimation and cancellation techniques during demodulation in accordance with the disclosed embodiments. FIG. 8D is a histogram that shows the distribution of incorrect constellation points along the imaginary axis or dimension of FIG. 7C after applying PAD estimation and cancellation techniques during demodulation in accordance with the disclosed embodiments.

The histograms in FIGS. 8A and 8B are constructed by looking at FIG. 7C and counting number of correct and incorrect points that lie at each position along the real axis. In other words, the histogram in FIG. 8A is constructed for a cross section of correct constellation points along the real dimension of FIG. 7C, and the histogram in FIG. 8B is constructed for a cross section of incorrect constellation points along the real dimension of FIG. 7C. Similarly, the histograms in FIGS. 8C and 8D are constructed by looking at FIG. 7C and counting number of correct and incorrect points that lie at each position along the imaginary axis. In other words, the histogram in FIG. 8C is constructed for a cross section of correct constellation points along the imaginary dimension of FIG. 7C, and the histogram in FIG. 8D is constructed for a cross section of incorrect constellation points along the imaginary dimension of FIG. 7C. Thus, the histograms in FIGS. 8A and 8C show the distribution of correct constellation points after applying PAD estimation and cancellation techniques during demodulation in accordance with the disclosed embodiments. Likewise, the histograms in FIGS. 8B and 8D are histograms that show the distribution of incorrect constellation points after applying PAD estimation and cancellation techniques during demodulation in accordance with the disclosed embodiments.

Figure 8E:
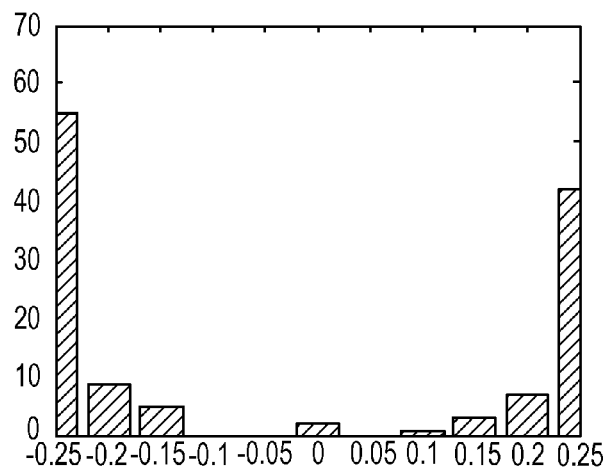
FIGS. 8E through 8H are exploded views of a portion of the histograms shown in FIGS. 8A through 8D, respectively, that show a closer view of the distribution of correct constellation points along quadrant boundaries and incorrect constellation points near zero.
Figure 8F:
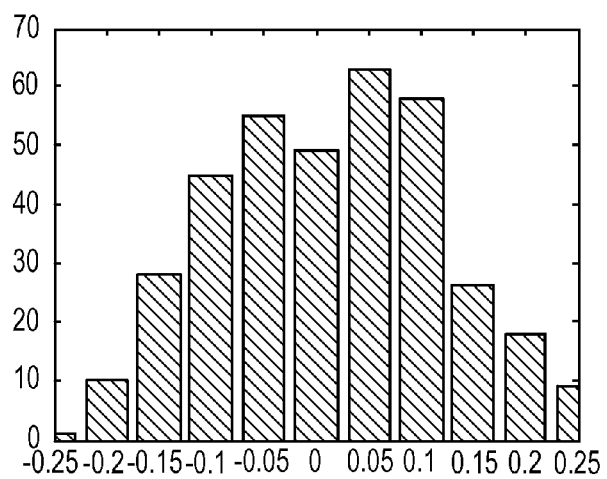
Figure 8G:
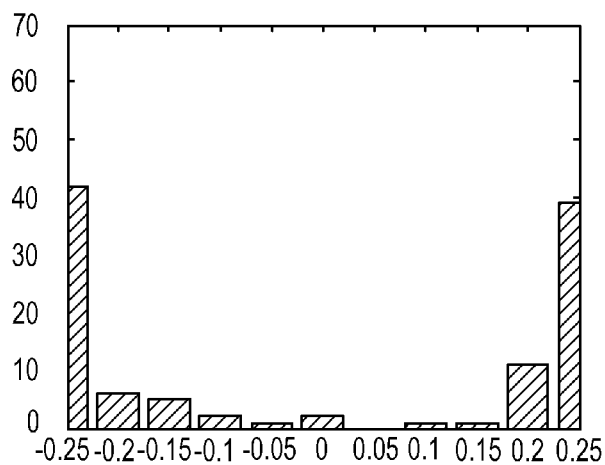
Figure 8H:
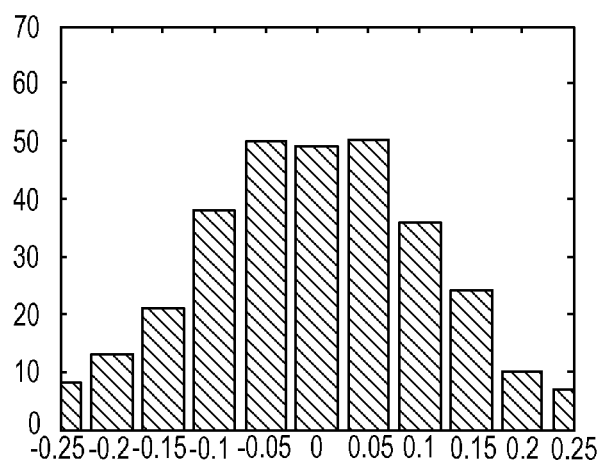

FIGS. 8E through 8H are exploded views of a portion of the histograms shown in FIGS. 8A through 8D, respectively, that show a closer view of the distribution of correct constellation points along quadrant boundaries and incorrect constellation points near zero. As illustrated in FIGS. 8E and 8G, the density of correct constellation points is higher near the 4-QAM positions. As illustrated in FIGS. 8F and 8H, in either the real or the imaginary views, the density of incorrect constellation points is greater than the density of correct constellation points near zero (or along the quadrant boundaries). The members of the transmit data sequence $\hat{X}^{(q)}$ that are in error (i.e., located outside the original quadrant), generally lie along a boundary with an adjacent quadrant. This distribution of incorrect constellation points apart from the correct constellation points allows the incorrect constellation points to be processed independently. In other words, because the correct constellation points gather around the original 4-QAM point and the incorrect constellation points (that are in error) lie along the quadrant boundaries, the incorrect constellation points can usually be treated separately. As such, incorrect constellation points can be reduced and in some cases completely eliminated.

Sign Flipping for M-Ary QAM Constellations

To further reduce the number of data bits in error and thus minimize the PA induced distortion, other disclosed embodiments relate to a "sign-flipping" technique. The "sign flipping" technique can be used to exploit this structure of incorrect constellation points and to remove many of the remaining errors thereby reducing the bit error rate (BER). As such, the resulting error vector magnitude (EVM) can be reduced or minimized. This sign flipping process occurs prior to any channel error correction (i.e. no extra overhead is required for forward error correction using this method).

Figure 9:
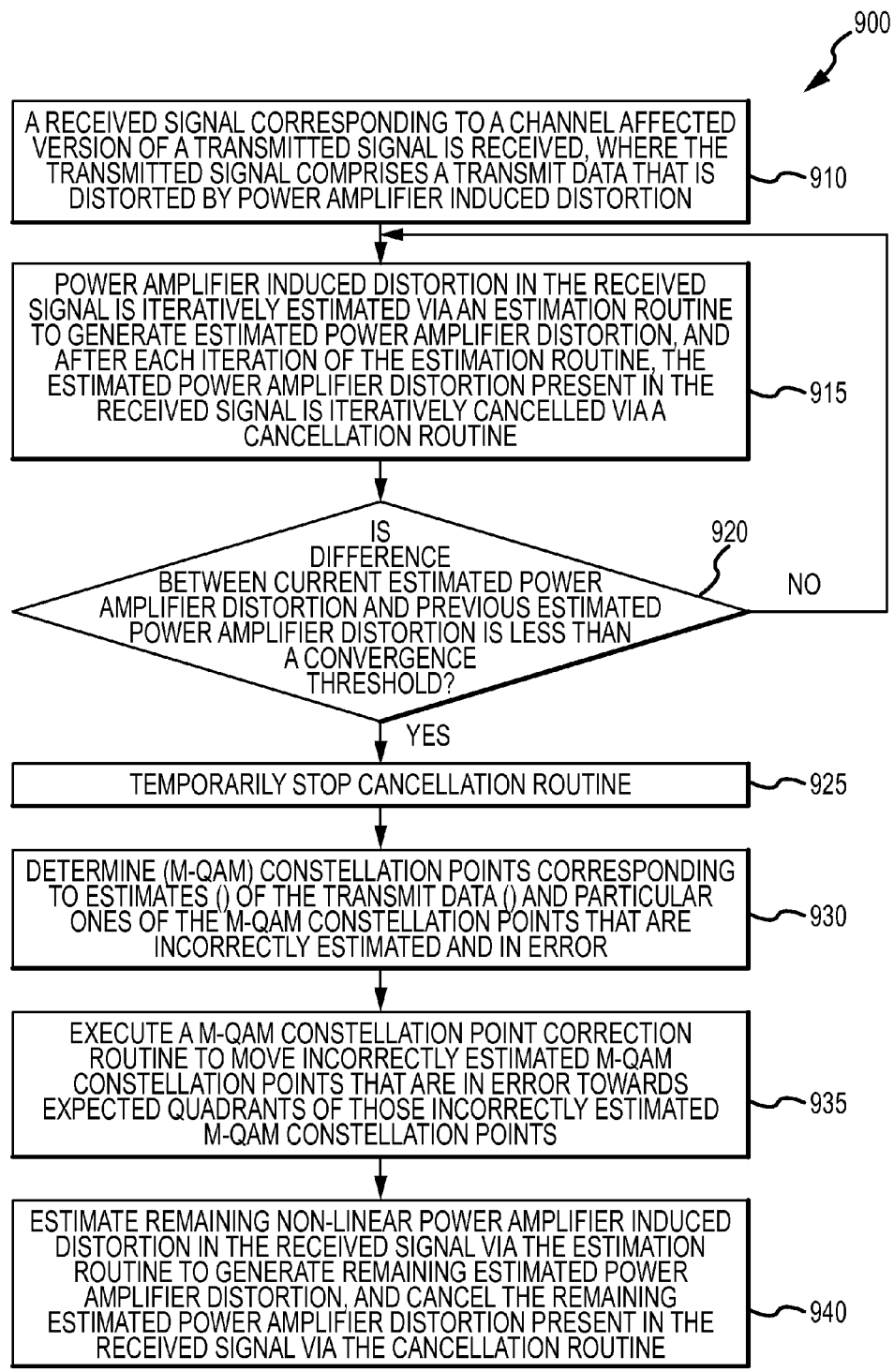
FIG. 9 is a flowchart that illustrates a method for reducing power amplifier induced distortion in accordance with some of the disclosed embodiments.

FIG. 9 is a flowchart that illustrates a method 900 for reducing power amplifier induced distortion in accordance with some of the disclosed embodiments. The method 900 begins at step 910 when a received signal corresponding to a channel affected version of a transmitted signal is received. The transmitted signal comprises a transmit data ($X^{(q)}$) that is distorted by power amplifier induced distortion.

At step 915, power amplifier induced distortion in the received signal is iteratively estimated via an estimation routine to generate estimated power amplifier distortion, and after each iteration of the estimation routine, the estimated power amplifier distortion present in the received signal is iteratively cancelled via a cancellation routine executed. Step 915 is performed as described above with reference to FIGS. 5 and 6.

At step 920, a convergence check is performed to determine whether the PAD estimate has converged (i.e., any further reduction in PAD estimate represents an insignificant or negligible improvement over the previous estimate). In one implementation, after each iteration of the cancellation routine, a current estimated power amplifier distortion is compared to a previous estimated power amplifier distortion to determine whether difference between the current estimated power amplifier distortion and the previous estimated power amplifier distortion is less than a convergence threshold. In an alternative implementation, the cancellation routine can be stopped when the processing described above to compute the PAD 590 and the frequency-domain, coarsely-corrected signal ($Z'_k$) 553 reaches a number of iterations ($q_{max}$).

When the difference between the current estimated power amplifier distortion and the previous estimated power amplifier distortion is less than the convergence threshold, the method proceeds to step 925, where the cancellation routine is stopped temporarily.

The method 900 proceeds to step 930, where M-ary QAM (M-QAM) constellation points corresponding to estimates ($\hat{X}^{(q)}$) of the transmit data ($X^{(q)}$) are determined, and where particular ones of the M-QAM constellation points that are incorrectly estimated and in error are determined After the estimate of the transmit data sequence ($\hat{X}^{(q)}$) converges, the majority of the constellation points gather around the correct/expected location of original M-QAM points; however, some constellation points will be incorrect. The M-QAM constellation points that are incorrectly estimated and in error correspond to incorrect symbols of the transmit data estimate ($\hat{X}^{(q)}$) that are still in error after the cancellation routine ends. In other words, the incorrect constellation points correspond to incorrect symbols that are still in error. The M-QAM constellation points that are incorrectly estimated and in error are located outside an expected quadrant of a correct M-QAM location, and generally lie along a boundary with an adjacent quadrant that is adjacent to the expected quadrant. For example, an incorrectly estimated constellation point that was transmitted in Quadrant I is generally found in either Quadrant II or IV along the boundary between Quadrants I and II or Quadrants I and IV. There is also potential, although with a much lower probability, of finding a point from Quadrant I in Quadrant III.

At step 935, for each of the M-QAM constellation points, a M-QAM constellation point correction routine is executed that is designed to move the incorrectly estimated M-QAM constellation points that are in error towards expected quadrants of those incorrectly estimated M-QAM constellation points. For instance, with respect to 4-QAM constellation points, a perturbation by can be applied to each of the incorrect 4-QAM constellation points to place them in their adjacent quadrants by changing the sign of the real or imaginary part of the incorrect 4-QAM constellation point thereby. The sign of the incorrect 4-QAM constellation point is changed in the direction of suspected incorrect position, either horizontally (real) or vertically (imaginary). In some cases, both are changed. The sign flipping method is used to move any incorrect constellation points. The sign flipping method corrects the incorrect constellation points by applying a small perturbation to the incorrect constellation points to move them in the direction of an adjacent quadrant and hence move them closer to a correct/expected one of the four QAM constellation points. For the 4-QAM case, the perturbation by can be applied to each of the incorrect constellation points to place them in their adjacent quadrants by changing the sign of the real or imaginary part of the incorrect constellation point thereby. The sign of the incorrect constellation point is changed in the direction of suspected incorrect position, either horizontally (real) or vertically (imaginary). In some cases, both are changed. As will be appreciated by those skilled in the art, the initial 4-QAM quadrants can be broken down into sub-quadrants for higher order modulations (e.g., if each of the quadrants were broken down into quadrants again, then that would relate to 16-qam, and so on).

Following execution of the M-QAM constellation point correction routine, at step 940, remaining non-linear power amplifier induced distortion in the received signal is estimated via the estimation routine to generate remaining estimated power amplifier distortion, and the remaining estimated power amplifier distortion present in the received signal is cancelled via the cancellation routine as described with reference to FIGS. 6A and 6B. In other words, after perturbing the incorrect constellation points along their quadrant boundaries, another distortion cancellation iteration can be executed as described with reference to FIGS. 5, 6A and 6B, and any incorrect M-QAM constellation points become corrected M-QAM constellation points that gather around the correct or desired M-ary QAM location. The reduction in PA distortion is monitored at each step, and when there is no or minimal reduction the method stops.

Figure 10:
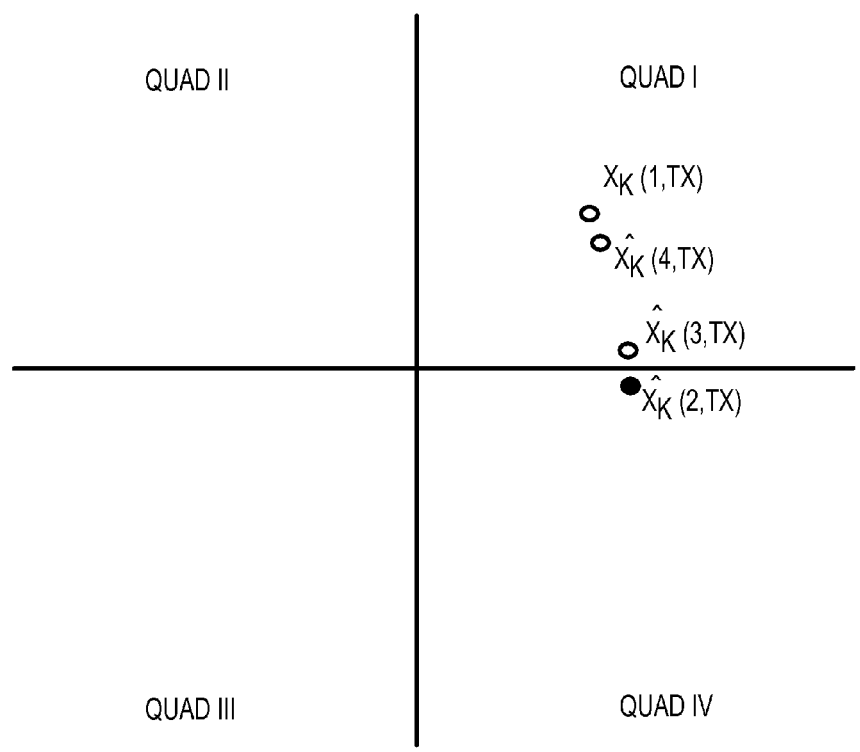
FIG. 10 illustrates the migration of a $k^{th}$ incorrect constellation point as sign flipping is implemented.

FIG. 10 illustrates the migration of a $k^{th}$ incorrect constellation point as sign flipping is implemented. In FIG. 10, $X_k(1,TX)$ represents the actual/original location of the constellation point when it was transmitted. $\hat{X}_k(2,RX)$ represents the incorrectly estimated constellation point upon demodulation. $\hat{X}_k(3,RX)$ represents the updated location of the incorrect constellation point after flipping the sign of the imaginary part of the incorrect constellation point. The correct direction of flipping is chosen by finding the choice that minimizes PA distortion by taking the difference between the remodulated signal (specifically the amplified data symbol 587 that represents an estimate of the RF transmitted data) and the received signal. If the remodulated signal (i.e. the amplified data symbol 587 that represents an estimate of the RF transmitted data) is very close to that of the received signal, then the PAD is minimized $\hat{X}_k(4,RX)$ represents the updated location of the perturbed constellation point after passing the receive data sequence through a final distortion cancellation iteration as described with reference to FIGS. 6A and 6B.

The received signal received by the receiver is a channel affected version of the transmitted signal. Prior to transmission, the transmit data ($X^{(q)}$) that makes up the transmitted signal is distorted by the transmit power amplifier. As described above with reference to FIGS. 5, 6A and 6B, much of the power amplifier induced distortion in the received signal is iteratively estimated via an estimation routine to generate estimated power amplifier distortion, and after each iteration of the estimation routine, the estimated power amplifier distortion present in the received signal is iteratively cancelled via a cancellation routine. However, not all of the PAD can be cancelled. To address this issue, the sign-flipping module 1100 is used to reduce any remaining power amplifier distortion in the received signal even further.

Figure 11:
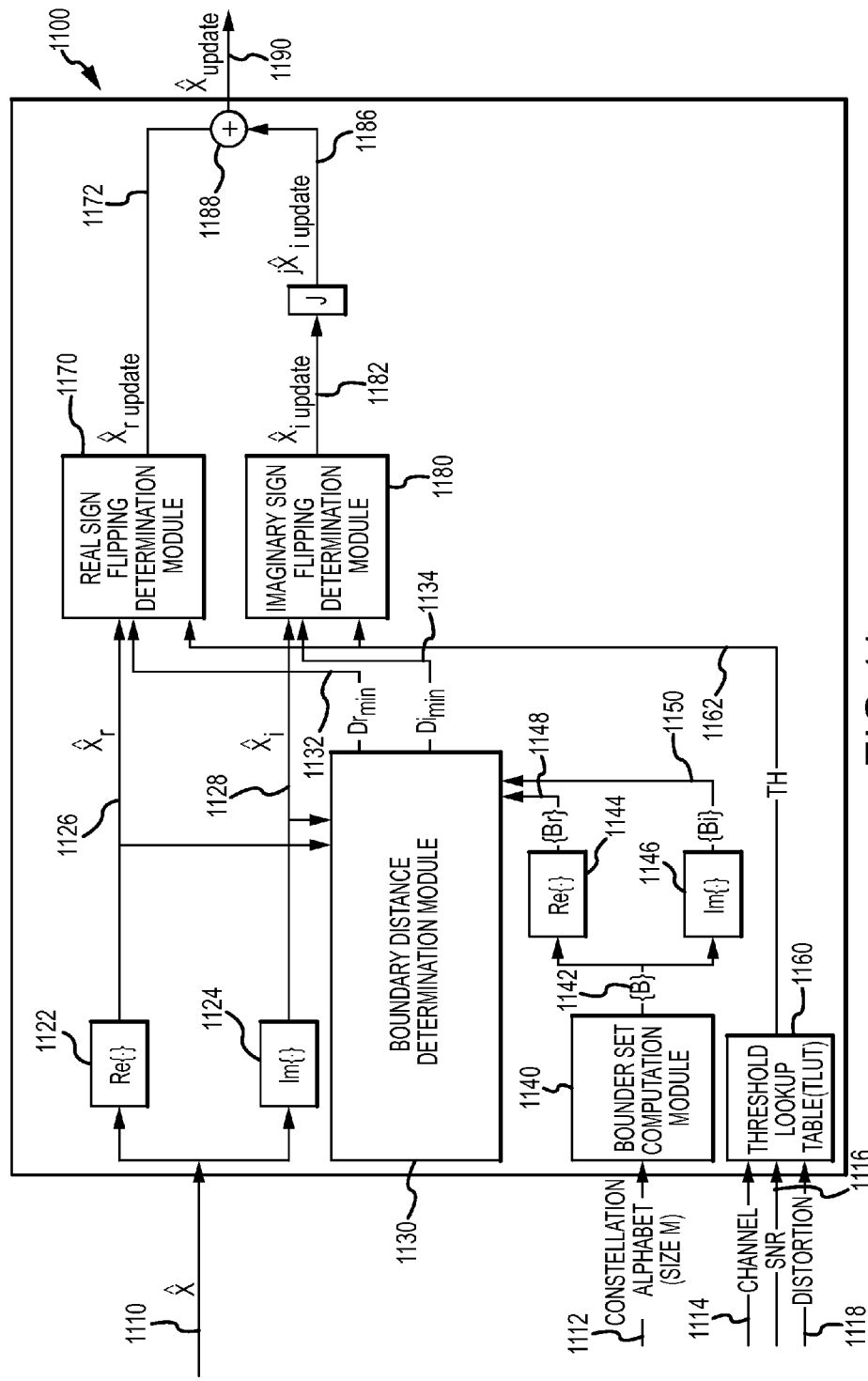
FIG. 11 is a block diagram that illustrates a sign flipping module for a general M-QAM constellation in accordance with some of the disclosed embodiments.

One embodiment of the sign flipping method will be described with reference to FIG. 11. FIG. 11 is a block diagram that illustrates a sign flipping module 1100 for M-QAM constellation points in accordance with some of the disclosed embodiments.

The sign flipping module 1100 includes a boundary distance determination module 1130, a border set computation module 1140, a threshold lookup table (TLUT) 1160, a real sign flipping determination module 1170, an imaginary sign flipping determination module 1180, an imaginary multiplier module (j) and a frequency domain combiner module 1188.

The sign flipping module 1100 receives frequency domain input 1110 ($\hat{X}$) that represents estimates ($\hat{X}^{(q)}$) of the transmit data sequence ($X^{(q)}$) as M-QAM constellation points. The frequency domain input 1110 ($\hat{X}$) comprises correctly estimated M-QAM constellation points and incorrectly estimated M-QAM constellation points that are still in error after PAD estimation and cancellation is performed as described with reference to FIGS. 5 and 6. The frequency domain input 1110, ($\hat{X}$), is separated into real and imaginary components at separation blocks 1122 and 1124, respectively, to generate a real component ($\hat{X}_r$) 1126 of each M-QAM constellation point and an imaginary component ($\hat{X}_i$) 1128 of each M-QAM constellation point. Because the PAD induces noise on the received signal that causes symbol or bit errors during demodulation, the frequency domain input 1110 includes both correctly estimated M-QAM constellation points and incorrectly estimated M-QAM constellation points that are in error.

The sign flipping module 1100 also receives a constellation alphabet set 1112 of size M, channel characteristics 1114, a signal-to-noise ratio (SNR) measurement 1116, and distortion characteristics 1118.

The border set computation module 1140 uses the constellation alphabet set 1112 to compute a border set {B} 1142. Computation of the border set {B} 1142 can be expressed as indicated in the following equation: B={B(n)|n={1, 2, ... log 2(M)−1}. When the signal is a M-ary QAM signal, the modulation order M provides an automatic mapping into the border set for a given constellation, for example, via lookup table or using mathematical computation. The border set {B} 1142 is separated into real and imaginary components at blocks 1144 and 1146, respectively, to generate a real component {Br} 1148 of the border set and an imaginary component {Bi} 1150 of the border set. The real component {Br} 1148 of the border set can be referred to as real boundary points of the M-QAM regions, and the imaginary component {Bi} 1150 of the border set can be referred to as imaginary boundary points of the M-QAM regions. The real boundary points of the QAM regions {Br} 1148 and the imaginary boundary points of the QAM regions {Bi} 1150 are sequences containing border crossings in the real and imaginary directions, respectively. The real boundary points of the QAM regions {Br} 1148 and the imaginary boundary points of the QAM regions {Bi} 1150 are provided to the boundary distance determination module 1130.

The boundary distance determination module 1130 receives the real component ($\hat{X}_r$) 1126 of each M-QAM constellation point, and uses the real boundary points of the M-QAM regions {Br} 1148 to compute a minimum distance (Dr$_{min}$) 1132 between the real component ($\hat{X}_r$) 1126 of each frequency domain M-QAM constellation point ($\hat{X}$) 1110 and the nearest boundary in the real direction (nr$_{min}$). This can be represented as illustrated in equation 34 as follows:

$$Dr_{min} = \hat{X}_r - Br(nr_{min}),$$

where $nr_{min}$=arg min $n\{|\hat{X}_r - Br(n)|n=1, 2, \ldots, \log_2(M)-1\}$ (Equation 34)

The boundary distance determination module 1130 also receives the imaginary component ($\hat{X}_i$) 1128 of each M-QAM constellation point, and uses the imaginary boundary points of the M-QAM regions {Bi} 1150 to compute a minimum distance (Di$_{min}$) 1134 between the imaginary component ($\hat{X}_i$) 1128 of each M-QAM constellation point ($\hat{X}$) 1110 and the nearest boundary in the imaginary direction (ni$_{min}$). This can be represented as illustrated in equation 35 as follows:

$$Di_{min} = \hat{X}_i - Bi(ni_{min}),$$

where $ni_{min}$=arg min $n\{|\hat{X}_i - Bi(n)|n=1, 2, \ldots, \log_2(M)-1\}$ (Equation 35)

The threshold lookup table (TLUT) 1160 uses the channel characteristics 1114, the SNR measurement 1116, and the estimated distortion characteristics 1118 to determine an appropriate threshold (TH) 1162 for the environment. The threshold (TH) 1162 represents the distance away from the quadrant center (or centroid); constellation points over this threshold are to be sent through the sign flipping routine. The threshold (TH) 1162 is used to determine which symbols (located in the x-y plane) of the received constellation need to be input into the sign flipping module. The threshold (TH) 1162 is based on a joint function of the channel characteristics 1114, the SNR measurement 1116, and the estimated distortion characteristics 1118 that is determined heuristically using, for example, lab measurements and experimental data. The operating point determining the threshold (TH) 1162 is found from the threshold lookup table (TLUT) 1160 representing this joint function of parameters.

The real sign flipping determination module 1170 receives the real component ($\hat{X}_r$) 1126 of each M-QAM constellation point ($\hat{X}$) 1110, the minimum distance (Dr$_{min}$) 1132 between the real component ($\hat{X}_r$) 1126 of each M-QAM constellation point ($\hat{X}$) 1110 and the nearest boundary in the real direction, and the threshold (TH) 1162. For each M-QAM constellation point ($\hat{X}$) 1110, the real sign flipping determination module 1170 determines whether the absolute value of the minimum distance (Dr$_{min}$) 1132 is less than the threshold (TH) 1162, and generates an updated real component ($\hat{X}_r^{update}$) 1172 of each M-QAM constellation point ($\hat{X}$) 1110. The processing performed by the real sign flipping determination module 1170 can be represented logical via an if/then/else statement as follows: if (|Dr$_{min}$|<TH), then $\hat{X}_r^{update} = \hat{X}_r - Dr_{min}$, else $\hat{X}_r^{update} = \hat{X}_r$.

In other words, when the absolute value of the minimum distance (Dr$_{min}$) 1132 is less than the threshold (TH) 1162, the updated real component ($\hat{X}_r^{update}$) 1172 will be set equal to the difference between the real component ($\hat{X}_r$) 1126 and the minimum distance (Dr$_{min}$) 1132 between the real component ($\hat{X}_r$) 1126 and the nearest boundary in the real direction. In other words, the real component ($\hat{X}_r$) 1126 is moved so that it belongs to an adjacent M-QAM region in the real direction. By contrast, when the absolute value of the minimum distance (Dr$_{min}$) 1132 is greater than or equal to the threshold (TH) 1162, the updated real component ($\hat{X}_r^{update}$) 1172 will be set equal to the current value of the real component ($\hat{X}_r$) 1126.

The imaginary sign flipping determination module 1180 receives the imaginary component ($\hat{X}_i$) 1128 of each M-QAM constellation point ($\hat{X}$) 1110, the minimum distance (Di$_{min}$) 1134 between the imaginary component ($\hat{X}_i$) 1128 and the nearest boundary in the imaginary direction, and the threshold (TH) 1162. For each M-QAM constellation point ($\hat{X}$) 1110, the imaginary sign flipping determination module 1180 determines whether the absolute value of the minimum distance (Di$_{min}$) 1134 is less than the threshold (TH) 1162, and generates an updated imaginary component ($\hat{X}_i^{update}$) 1182 of each M-QAM constellation point ($\hat{X}$) 1110. The processing performed by the imaginary sign flipping determination module 1180 can be represented logical via an if/then/else statement as follows: if (|Di$_{min}$|<TH), then $\hat{X}_i^{update} = -Di_{min}$, else $\hat{X}_i^{update} = \hat{X}_i$.

In other words, when the absolute value of the minimum distance (Di$_{min}$) 1134 is less than the threshold (TH) 1162, the updated imaginary component ($\hat{X}_i^{update}$) 1182 will be set equal to the difference between the imaginary component ($\hat{X}_i$) 1128 and the minimum distance (Di$_{min}$) 1134 between the imaginary component ($\hat{X}_i$) 1128 and the nearest boundary in the imaginary direction. In other words, the imaginary component ($\hat{X}_i$) 1128 is moved so that it belongs to an adjacent M-QAM region in the imaginary direction. By contrast, when the absolute value of the minimum distance (Di$_{min}$) 1134 is greater than or equal to the threshold (TH) 1162, the updated imaginary component ($\hat{X}_i^{update}$) 1182 will be set equal to the current value of the imaginary component ($\hat{X}_i$) 1128.

For each M-QAM constellation point ($\hat{X}$) 1110, the updated imaginary component ($\hat{X}_i^{update}$) 1182 will be multiplied by an imaginary multiplier module (j), and the result is combined with the updated real component ($\hat{X}_r^{update}$) 1172 by the frequency domain combiner module 1188 to generate an updated frequency domain M-QAM constellation point ($\hat{X}_{update}$) 1190.

Simulated results will now be described with reference to FIG. 12. FIG. 12 is a chart with a series of curves plotting peak signal-to-noise ratio (PSNR) in dB versus bit error rate (BER) performance that may be achieved in a various OFDM systems including some in accordance with some of the disclosed embodiments. For these simulations, the PSNR was 30 dB and the transmit PA was operated 0 dB IBO.

Curve 1210 shows PSNR in dB versus BER performance that may be achieved in an OFDM system using traditionally-designed USCP pilots, whereas curve 1220 shows PSNR in dB versus BER performance that may be achieved in an OFDM system using OPAP pilots. These simulations show the relative performances of the USCP and the OPAP OFDM schemes. As can be seen by comparing curves 1210, 1220, the OFDM system using OPAP pilots outperforms the OFDM system using traditionally-designed USCP pilots.

Curve 1215 shows PSNR in dB versus BER performance that may be achieved in an OFDM system using traditionally-designed USCP pilots and PA distortion reduction at the transmitter, and PA distortion estimation and cancellation techniques at the receiver in accordance with some of the disclosed embodiments. By contrast, curve 1225 shows PSNR in dB versus BER performance that may be achieved in an OFDM system using OPAP pilots and PA distortion reduction at the transmitter, and PA distortion estimation and cancellation techniques at the receiver in accordance with some of the disclosed embodiments. The OFDM system using OPAP pilots continues to outperform the OFDM system using traditionally-designed USCP pilots. Moreover, as can be seen by comparing curves 1220, 1225, the OFDM system implementing PA distortion reduction, estimation and cancellation techniques outperforms the OFDM system that does not.

Curve 1218 shows PSNR in dB versus BER performance that may be achieved in an OFDM system using traditionally-designed USCP pilots and PA distortion reduction at the transmitter, and PA distortion estimation and cancellation techniques, and sign flipping at the receiver in accordance with some of the disclosed embodiments. Curve 1228 shows PSNR in dB versus BER performance that may be achieved in an OFDM system using OPAP pilots and PA distortion reduction at the transmitter, and PA distortion estimation and cancellation techniques, and sign flipping at the receiver in accordance with some of the disclosed embodiments. As can be seen by comparing curves 1228, 1225, the OFDM system implementing sign flipping techniques outperforms the OFDM system that does not. These simulations show that sign flipping can further reduce bit errors in the estimate of the transmit sequence. In addition, when curve 1228 is compared to curve 1210, the combined effects of using OPAP pilots with PA distortion reduction at the transmitter, and PA distortion estimation and cancellation techniques, and sign flipping at the receiver become very evident.

Curve 1230 shows PSNR in dB versus BER performance that may be achieved in an OFDM systems using traditionally-designed USCP pilots, but without the inclusion of a transmit power amplifier. Similarly, curve 1240 shows PSNR in dB versus BER performance that may be achieved in an OFDM systems using OPAP pilots without the inclusion of a transmit power amplifier. As can be seen by comparing curves 1228, 1240, the OFDM system implementing sign flipping techniques performs close to the OFDM system that does not include transmit power amplifier (i.e., curve 1228 comes within 2 dB of the no-PA curve 1240 where no PA induced distortion is present). When sign flipping is applied to most or all of the incorrect constellation points, the BER can be greatly improved. Sign flipping allows the PA 362 to operate under low IBO values (0-3 dB) and thus at very high power efficiencies.

The disclosed embodiments may have one or more significant advantages over traditional techniques.

For example, embodiments may have improved channel estimation and/or BER performance over traditional techniques. Some performance improvements are subsequent to receiver operation such that little degradation in signal-to-noise ratio (SNR) is experienced from receiver distortion cancellation resulting in optimal communication link bit error rate (BER) performance.

In addition, embodiments may jointly provide for robust synchronization, low peak-to-average ratios (PARs), and accurate, high performance channel estimation at the receiver due to the elimination of receiver distortion, among other things. Signals generated according to various embodiments may have synchronization properties (e.g., compensation for timing offsets and frequency offsets) that are comparable to and potentially better than for signals generated using traditional techniques. Low PARs may be achieved because embodiments may enable a transmitter's power amplifier to be operated more efficiently. In addition to the above advantages, embodiments may result in increased link ranges, because signals may be transmitted using lower power, and correspondingly may be less susceptible to detection. Conversely, embodiments may result in higher link margins, as it may be possible to transmit higher-power signals using a given power amplifier, when compared to traditional techniques that utilize non-constant envelope transmissions.

In addition, for battery-powered apparatus, improved battery life may be achieved, because the power amplifier may be operated at a higher efficiency than using traditional techniques. More specifically, the transmitter battery life is significantly increased when the transmitter power amplifier in enabled to operate a low back off levels because this allows the power amplifier to work in a highly energy efficient manner.

Because there is less PAD in accordance with the disclosed embodiments, another benefit of the disclosed embodiments is that no extra overhead is required for forward error correction (FEC). To explain further, conventionally, in order to correct transmitter PAD, forward error correction (FEC) measures are taken to achieve a certain BER versus SNR performance. Although additional FEC improves performance, it requires transmission of extra overhead (FEC bits/symbols). When there is more PAD, more FEC bits (symbols) must be transmitted to the receiver.

The foregoing detailed description is merely exemplary in nature and is not intended to limit the inventive subject matter or the application and uses of the inventive subject matter to the described embodiments. Furthermore, there is no intention to be bound by any theory presented in the preceding background or detailed description.

Those of skill in the art will recognize, based on the description herein, that various other apparatus and processes may be included in embodiments of the systems and methods described herein for conditioning, filtering, amplifying, and/or otherwise processing the various signals. In addition, the sequence of the text in any of the claims does not imply that process steps must be performed in a temporal or logical order according to such sequence unless it is specifically defined by the language of the claim. The process steps may be interchanged in any order, and/or may be performed in parallel, without departing from the scope of the inventive subject matter. In addition, it is to be understood that information within the various different messages, which are described above as being exchanged between the system elements, may be combined together into single messages, and/or the information within a particular message may be separated into multiple messages. Further, messages may be sent by system elements in sequences that are different from the sequences described above. Furthermore, words such as "connected" or "coupled to" used in describing a relationship between different elements do not imply that a direct physical connection must be made between these elements. For example, two elements may be connected to each other physically, electronically, logically, or in any other manner, through one or more additional elements, without departing from the scope of the inventive subject matter.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled technicians may implement the described functionality in varying ways for each particular application, but such implementation decisions should not be interpreted as causing a departure from the scope of the inventive subject matter.

The various illustrative logical blocks and modules described in connection with the embodiments disclosed herein may be implemented or performed with various types of computational apparatus, including but not limited to, a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in one or more software modules executed by a processor, or in a combination of the two. A software module may reside in random access memory, flash memory, read only memory (ROM), erasable programmable ROM (EPROM), electrical EPROM, registers, hard disk, a removable disk, a compact disc ROM (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal In the alternative, the processor and the storage medium may reside as discrete components in a user terminal.

While various exemplary embodiments have been presented in the foregoing detailed description, it should be appreciated that a vast number of variations exist. It should also be appreciated that the exemplary embodiments are only examples, and are not intended to limit the scope, applicability or configuration of the inventive subject matter in any way. Rather, the foregoing detailed description will provide those skilled in the art with a convenient road map for implementing various embodiments of the inventive subject matter, it being understood that various changes may be made in the function and arrangement of elements described in an exemplary embodiment without departing from the scope of the inventive subject matter as set forth in the appended claims and their legal equivalents.

What is claimed is:

1. A method for reducing power amplifier induced distortion, comprising:
   receiving a received signal corresponding to a channel affected version of a transmitted signal, wherein the transmitted signal comprises transmit data that was distorted by a transmit power amplifier prior to transmission over the channel;
   iteratively estimating distortion induced by the transmit power amplifier prior to transmission in the received signal via an estimation routine to generate estimated power amplifier distortion;
   iteratively cancelling the estimated power amplifier distortion present in the received signal via a cancellation routine executed after each iteration of the estimation routine;
   comparing, after each iteration of the cancellation routine, a current estimated power amplifier distortion to a previous estimated power amplifier distortion to determine whether difference between the current estimated power amplifier distortion and the previous estimated power amplifier distortion is less than a convergence threshold;
   temporarily stopping the cancellation routine when the difference between the current estimated power amplifier distortion and the previous estimated power amplifier distortion is less than the convergence threshold;
   determining M-QAM constellation points corresponding to estimates of the transmit data, and determining particular ones of the M-QAM constellation points that are incorrectly estimated and in error; and
   executing, for each of the M-QAM constellation points, a M-QAM constellation point correction routine designed to move the incorrectly estimated M-QAM constellation points that are in error towards expected quadrants of those incorrectly estimated M-QAM constellation points.

2. A method according to claim 1, wherein the step of executing, for each of the M-QAM constellation points, a M-QAM constellation point correction routine, comprises the steps of:
   receiving a frequency domain input that represents estimates of the transmit data as M-QAM constellation points, wherein the frequency domain input comprises correctly estimated M-QAM constellation points and incorrectly estimated M-QAM constellation points that are in error, and separating the frequency domain input into real and imaginary components to generate a real component of each M-QAM constellation point and an imaginary component of each M-QAM constellation point;

generating a border set based on an input specifying a constellation alphabet set of size M, and separating the border set into a real component that represents real boundary points of M-QAM regions and an imaginary component that represents imaginary boundary points of the M-QAM regions;

generating a threshold from a threshold lookup table (TLUT) based on channel characteristics, a signal-to-noise ratio (SNR) measurement, and distortion characteristics;

computing a minimum distance between the real component of each M-QAM constellation point and a nearest boundary in a real direction based on the real boundary points of the M-QAM regions, and a minimum distance between the imaginary component of each M-QAM constellation point and a nearest boundary in an imaginary direction based on the imaginary boundary points of the M-QAM regions; and determining whether the real components of each M-QAM constellation point are in error, and determining whether the imaginary components of each M-QAM constellation point are in error; and generating at least one of an updated real component and an updated imaginary component.

3. A method according to claim 2, wherein the step of determining whether the real components of each M-QAM constellation point are in error and determining whether the imaginary components of each M-QAM constellation point are in error, comprises:

determining whether the real components of each M-QAM constellation point are in error by determining whether an absolute value of the minimum distance between the real component of each M-QAM constellation point and the nearest boundary in the real direction is less than the threshold; and determining whether the imaginary components of each M-QAM constellation point are in error by determining whether an absolute value of the minimum distance between the imaginary component of each M-QAM constellation point and the nearest boundary in the imaginary direction is less than the threshold.

4. A method according to claim 3, wherein the step of generating at least one of an updated real component and an updated imaginary component, comprises:

generating, when the absolute value of the minimum distance is less than the threshold, an updated real component for that incorrectly estimated M-QAM constellation point that is in error; and generating, when the absolute value of the minimum distance is less than the threshold, an updated imaginary component for that incorrectly estimated M-QAM constellation point that is in error.

5. A method according to claim 4, further comprising the steps of:

multiplying each of the updated imaginary components by an imaginary multiplier; and generating, for each incorrectly estimated M-QAM constellation point that is in error, an updated M-QAM constellation point based on at least one of the an updated real component and the updated imaginary component.

6. A method according to claim 2, wherein the updated real component for that incorrectly estimated M-QAM constellation point that is in error is:

equal to the difference between the real component and the minimum distance between the real component and the nearest boundary in the real direction such that the real component of that incorrectly estimated M-QAM constellation point that is in error is moved to an adjacent M-QAM region in the real direction.

7. A method according to claim 2, wherein the updated imaginary component for that incorrectly estimated M-QAM constellation point that is in error is:

equal to the difference between the imaginary component and the minimum distance between the imaginary component and the nearest boundary in the imaginary direction such that the imaginary component of that incorrectly estimated M-QAM constellation point that is in error is moved to an adjacent M-QAM region in the imaginary direction.

8. A method according to claim 1, wherein the M-QAM constellation points that are incorrectly estimated and in error correspond to incorrect symbols of the transmit data estimate that are still in error after the cancellation routine ends.

9. A method according to claim 8, wherein the M-QAM constellation points that are incorrectly estimated and in error are located outside an expected quadrant of a correct M-QAM location.

10. A method according to claim 9, wherein the M-QAM constellation points that are incorrectly estimated and in error lie along a boundary with an adjacent quadrant that is adjacent to the expected quadrant.

11. A method according to claim 1, further comprising:

estimating, after executing the M-QAM constellation point correction routine, remaining non-linear power amplifier induced distortion in the received signal via the estimation routine to generate remaining estimated power amplifier distortion; and cancelling the remaining estimated power amplifier distortion present in the received signal via the cancellation routine.

12. A method according to claim 2, wherein the real boundary points of the M-QAM regions and the imaginary boundary points of the M-QAM regions are sequences containing border crossings in the real and imaginary directions, respectively.

13. A system for reducing distortion in a received signal corresponding to a channel affected version of a transmitted signal that comprises transmit data that was distorted by a transmit power amplifier prior to transmission of the transmitted signal over the channel, the system comprising:

an estimation module designed to iteratively estimate power amplifier induced distortion, that was induced by the transmit power amplifier prior to transmission of the transmitted signal, in the received signal via an estimation routine to generate estimated power amplifier distortion;

a cancellation module designed to iteratively cancel the estimated power amplifier distortion present in the received signal via a cancellation routine executed after each iteration of the estimation routine;

a comparison module designed to compare, after each iteration of the cancellation routine, a current estimated power amplifier distortion to a previous estimated power amplifier distortion to determine whether difference between the current estimated power amplifier distortion and the previous estimated power amplifier distortion is less than a convergence threshold, wherein the cancellation routine is temporarily stopped when the difference between the current estimated power amplifier distortion and the previous estimated power amplifier distortion is less than the convergence threshold;

an error determination module designed to determine M-QAM constellation points corresponding to estimates of the transmit data, and to determine particular ones of the M-QAM constellation points that are incorrectly estimated and in error; and a correction module designed to execute, for each of the M-QAM constellation points, a M-QAM constellation point correction routine designed to move the incorrectly estimated M-QAM constellation points that are in error towards expected quadrants of those incorrectly estimated M-QAM constellation points.

14. A system according to claim 13, wherein the M-QAM constellation point correction routine is designed to:
receive a frequency domain input that represents estimates of the transmit data as M-QAM constellation points, wherein the frequency domain input comprises correctly estimated M-QAM constellation points and incorrectly estimated M-QAM constellation points that are in error;
separate the frequency domain input into real and imaginary components to generate a real component of each M-QAM constellation point and an imaginary component of each M-QAM constellation point;
generate a border set based on an input specifying a constellation alphabet set of size M;
separate the border set into a real component that represents real boundary points of M-QAM regions and an imaginary component that represents imaginary boundary points of the M-QAM regions, wherein the real boundary points of the M-QAM regions and the imaginary boundary points of the M-QAM regions are sequences containing border crossings in the real and imaginary directions, respectively;
generate a threshold from a threshold lookup table (TLUT) based on channel characteristics, a signal-to-noise ratio (SNR) measurement, and distortion characteristics;
compute a minimum distance between the real component of each M-QAM constellation point and a nearest boundary in a real direction based on the real boundary points of the M-QAM regions, and a minimum distance between the imaginary component of each M-QAM constellation point and a nearest boundary in an imaginary direction based on the imaginary boundary points of the M-QAM regions; and
determine whether the real components of each M-QAM constellation point are in error, and determine whether the imaginary components of each M-QAM constellation point are in error; and
generate, for ones of the real components of each M-QAM constellation point or the imaginary components of each M-QAM constellation point are in error, at least one of an updated real component and an updated imaginary component.

15. A system according to claim 14, wherein the M-QAM constellation point correction routine is designed to:
determine whether the real components of each M-QAM constellation point are in error by determining whether an absolute value of the minimum distance between the real component of each M-QAM constellation point and the nearest boundary in the real direction is less than the threshold; and
determine whether the imaginary components of each M-QAM constellation point are in error by determining whether an absolute value of the minimum distance between the imaginary component of each M-QAM constellation point and the nearest boundary in the imaginary direction is less than the threshold.

16. A system according to claim 15, wherein the M-QAM constellation point correction routine is designed to:
generate, when the absolute value of the minimum distance is less than the threshold, an updated real component for that incorrectly estimated M-QAM constellation point that is in error; and
generate, when the absolute value of the minimum distance is less than the threshold, an updated imaginary component for that incorrectly estimated M-QAM constellation point that is in error.

17. A system according to claim 16, wherein the M-QAM constellation point correction routine is designed to:
multiply each of the updated imaginary components by an imaginary multiplier; and
generate, for each incorrectly estimated M-QAM constellation point that is in error, an updated M-QAM constellation point based on at least one of the updated real component and the updated imaginary component.

18. A system according to claim 14, wherein the updated real component for that incorrectly estimated M-QAM constellation point that is in error is equal to the difference between the real component and the minimum distance between the real component and the nearest boundary in the real direction such that the real component of that incorrectly estimated M-QAM constellation point that is in error is moved to an adjacent M-QAM region in the real direction.

19. A system according to claim 14, wherein the updated imaginary component for that incorrectly estimated M-QAM constellation point that is in error is: equal to the difference between the imaginary component and the minimum distance between the imaginary component and the nearest boundary in the imaginary direction such that the imaginary component of that incorrectly estimated M-QAM constellation point that is in error is moved to an adjacent M-QAM region in the imaginary direction.

20. A system according to claim 13, wherein the M-QAM constellation points that are incorrectly estimated and in error correspond to incorrect symbols of the transmit data estimate that are still in error after the cancellation routine ends, wherein the M-QAM constellation points that are incorrectly estimated and in error are located outside an expected quadrant of a correct M-QAM location, and wherein the M-QAM constellation points that are incorrectly estimated and in error lie along a boundary with an adjacent quadrant that is adjacent to the expected quadrant.

21. A system according to claim 13, wherein, after executing the M-QAM constellation point correction routine, the estimation module is designed to estimate the remaining nonlinear power amplifier induced distortion in the received signal via the estimation routine to generate remaining estimated power amplifier distortion, and wherein the cancellation module is designed to cancel the remaining estimated power amplifier distortion present in the received signal via the cancellation routine.

22. A system for reducing power amplifier distortion in a received signal that is a channel affected version of a transmitted signal that comprises transmit data distorted by a transmit power amplifier prior to transmission, the system comprising:
a frequency domain input that represents estimates of the transmit data as M-QAM constellation points, wherein the frequency domain input comprises correctly estimated M-QAM constellation points and incorrectly estimated M-QAM constellation points that are in error;

a first separation module designed to separate the frequency domain input into real and imaginary components to generate a real component of each M-QAM constellation point and an imaginary component of each M-QAM constellation point;

a border set computation module designed to receive an input specifying a constellation alphabet set of size M, and designed to compute a border set;

a second separation module designed to separate the border set into a real component of the border set that represents real boundary points of the M-QAM regions and an imaginary component of the border set that represents imaginary boundary points of the M-QAM regions;

a threshold lookup table (TLUT) designed to receive inputs comprising channel characteristics, a signal-to-noise ratio (SNR) measurement, and distortion characteristics, and designed to generate a threshold (TH) based on the channel characteristics, the SNR measurement, and the distortion characteristics;

a boundary distance determination module designed to receive the real components of each M-QAM constellation point, the imaginary components of each M-QAM constellation point, the real boundary points of the M-QAM regions, and the imaginary boundary points of the M-QAM regions, and designed to compute a minimum distance between the real component of each M-QAM constellation point and a nearest boundary in a real direction based on the real boundary points of the M-QAM regions, and to compute a minimum distance between the imaginary component of each M-QAM constellation point and a nearest boundary in an imaginary direction based on the imaginary boundary points of the M-QAM regions;

a real sign flipping determination module designed to: determine whether the real components of each M-QAM constellation point are in error by determining whether an absolute value of the minimum distance between the real component of each M-QAM constellation point and the nearest boundary in the real direction is less than the threshold; and generate, when the absolute value of the minimum distance is less than the threshold, an updated real component for that incorrectly estimated M-QAM constellation point that is in error, wherein the updated real component for that incorrectly estimated M-QAM constellation point that is in error is equal to the difference between the real component and the minimum distance between the real component and the nearest boundary in the real direction such that the real component of that incorrectly estimated M-QAM constellation point that is in error is moved to an adjacent M-QAM region in the real direction;

an imaginary sign flipping determination module designed to: determine whether the imaginary components of each M-QAM constellation point are in error by determining whether an absolute value of the minimum distance between the imaginary component of each M-QAM constellation point and the nearest boundary in the imaginary direction is less than the threshold; and generate, when the absolute value of the minimum distance is less than the threshold, an updated imaginary component for that incorrectly estimated M-QAM constellation point that is in error, wherein the updated imaginary component for that incorrectly estimated M-QAM constellation point that is in error is equal to the difference between the imaginary component and the minimum distance between the imaginary component and the nearest boundary in the imaginary direction such that the imaginary component of that incorrectly estimated M-QAM constellation point that is in error is moved to an adjacent M-QAM region in the imaginary direction;

an imaginary multiplier module designed to multiply each of the updated imaginary components by an imaginary multiplier; and a frequency domain combiner module designed to generate, for each incorrectly estimated M-QAM constellation point that is in error, an updated M-QAM constellation point based on at least one of the an updated real component and the updated imaginary component.

* * * * *